(12) United States Patent  
Anderson

(10) Patent No.: US 12,024,283 B2  
(45) Date of Patent: Jul. 2, 2024

(54) UNMANNED AIRCRAFT SYSTEM WITH SWAPPABLE COMPONENTS AND SHIELDED CIRCUIT BOARD

(71) Applicant: ZIPLINE INTERNATIONAL INC., South San Francisco, CA (US)

(72) Inventor: Ethan C. Anderson, Redwood City, CA (US)

(73) Assignee: Zipline International Inc., South San Francisco, CA (US)

( * ) Notice: Subject to any disclaimer, the term of this patent is extended or adjusted under 35 U.S.C. 154(b) by 786 days.

(21) Appl. No.: 17/113,324

(22) Filed: Dec. 7, 2020

(65) Prior Publication Data

US 2021/0171197 A1    Jun. 10, 2021

Related U.S. Application Data

(60) Provisional application No. 62/945,017, filed on Dec. 6, 2019.

(51) Int. Cl.
| | |
|---|---|
| *B64C 39/00* | (2023.01) |
| *B64C 39/02* | (2023.01) |
| *H05K 9/00* | (2006.01) |

(52) U.S. Cl.
CPC ......... *B64C 39/024* (2013.01); *H05K 9/0007* (2013.01); *H05K 9/0015* (2013.01); *H05K 9/0037* (2013.01)

(58) Field of Classification Search
CPC .. H05K 9/0007; H05K 9/0015; H05K 9/0037; B64C 2211/00; B64C 39/024
USPC ........................................................ 361/818
See application file for complete search history.

(56) References Cited

U.S. PATENT DOCUMENTS

| | | | |
|---|---|---|---|
| 6,271,465 B1 * | 8/2001 | Lacey .................. | H05K 9/0022 174/358 |
| 9,488,979 B1 | 11/2016 | Chambers et al. | |
| 9,489,852 B1 | 11/2016 | Chambers et al. | |
| 9,997,080 B1 | 6/2018 | Chambers et al. | |
| 10,029,788 B2 | 7/2018 | Abeles et al. | |
| 2002/0137391 A1 * | 9/2002 | Berberich ............ | H05K 9/0018 439/620.22 |
| 2003/0192715 A1 * | 10/2003 | Lambert .............. | H05K 9/0041 174/355 |
| 2004/0001299 A1 * | 1/2004 | van Haaster ......... | H05K 9/0088 257/E23.114 |
| 2005/0045358 A1 * | 3/2005 | Arnold .................. | H05K 9/003 174/51 |

(Continued)

FOREIGN PATENT DOCUMENTS

| | | | | |
|---|---|---|---|---|
| KR | | 100762854 B1 * | 10/2007 | |
| WO | WO-2020113387 A1 * | 6/2020 | ........... | B64C 39/024 |

*Primary Examiner* — Zhengfu J Feng  
(74) *Attorney, Agent, or Firm* — Dorsey & Whitney LLP

(57) ABSTRACT

A circuit board assembly for association with an aircraft includes a circuit board and an electromagnetic interference component connected to the circuit board. The circuit board assembly may further include an enclosure having an electromagnetic signal permissive layer and an electromagnetic signal blocking layer. The electromagnetic signal permissive layer may include a housing that define a volume. The housing may enclose the electromagnetic interference component on the circuit board. The electromagnetic signal blocking layer defines a conductive barrier about the electromagnetic interference component.

18 Claims, 49 Drawing Sheets

(56) References Cited

U.S. PATENT DOCUMENTS

| | | | |
|---|---|---|---|
| 2012/0281386 A1* | 11/2012 | Kim | H05K 9/0028 |
| | | | 361/818 |
| 2015/0060130 A1* | 3/2015 | Finneran | H05K 9/0041 |
| | | | 174/383 |
| 2015/0232181 A1* | 8/2015 | Oakley | B64C 25/52 |
| | | | 244/17.23 |
| 2015/0282394 A1* | 10/2015 | Yumi | H05K 1/0243 |
| | | | 174/377 |
| 2018/0079530 A1 | 3/2018 | Wyrobek | |

* cited by examiner

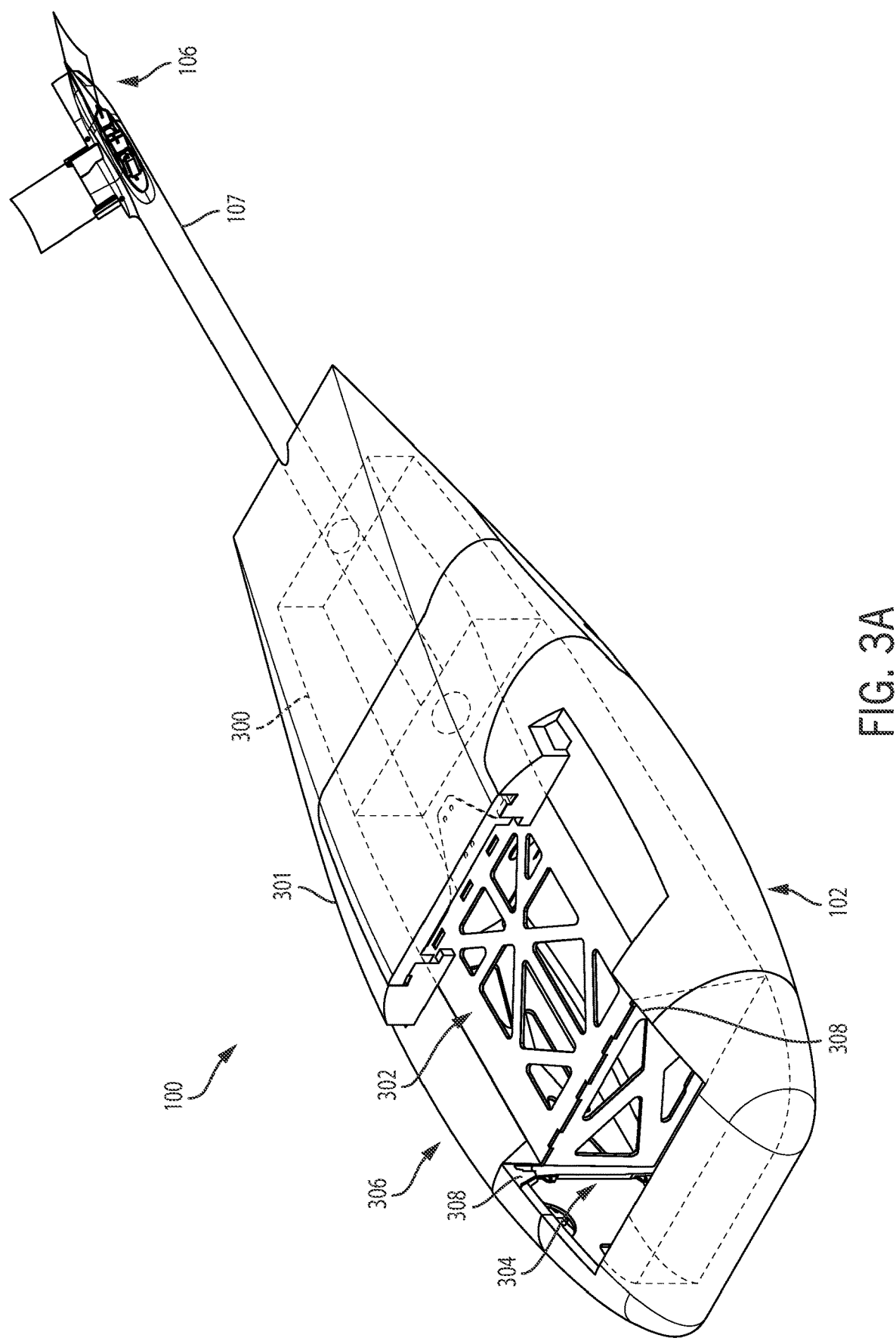

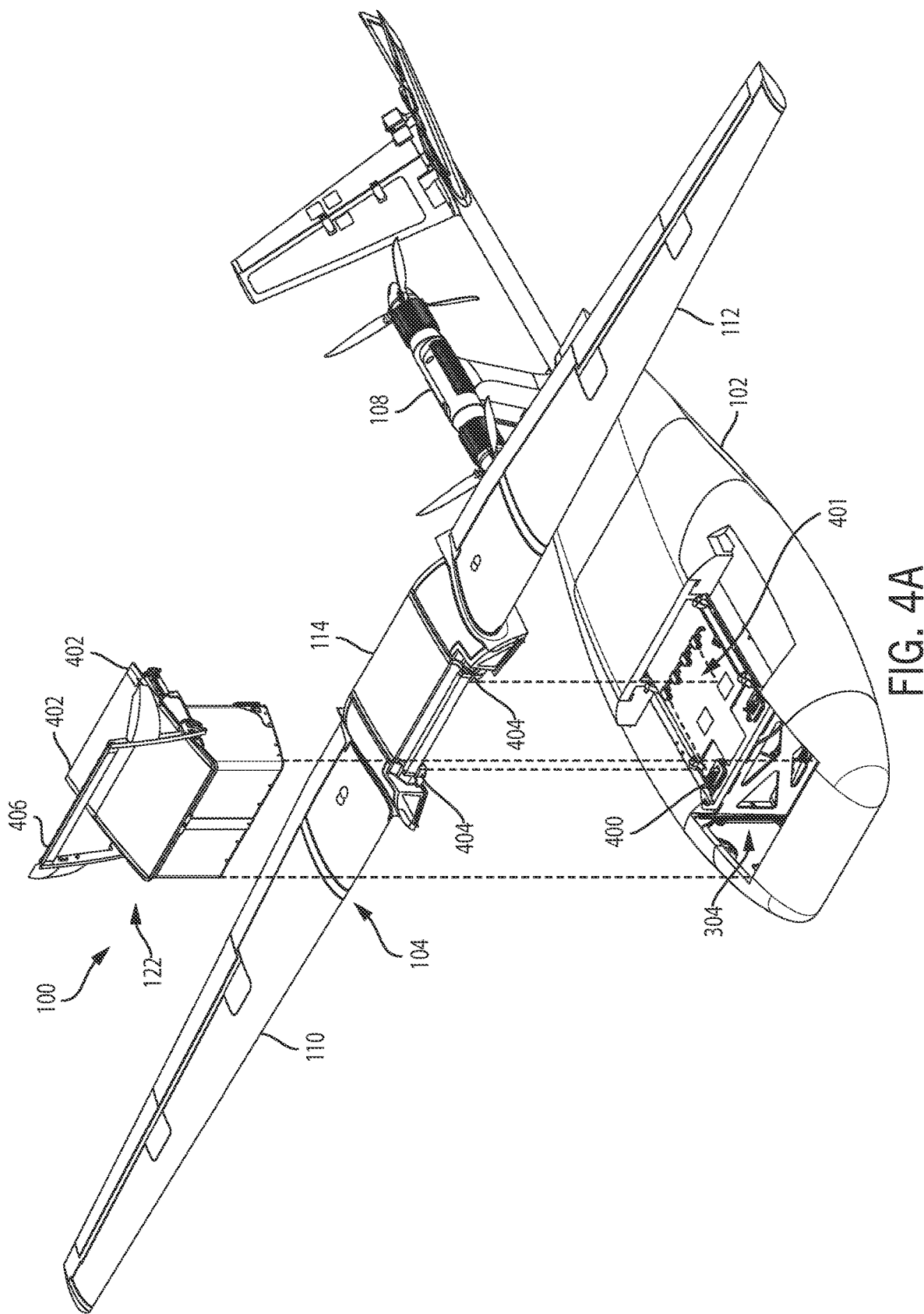

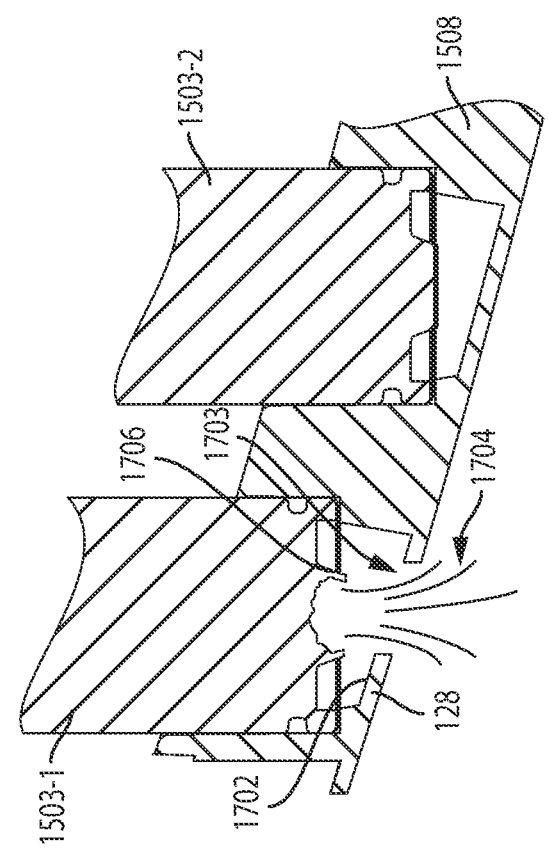
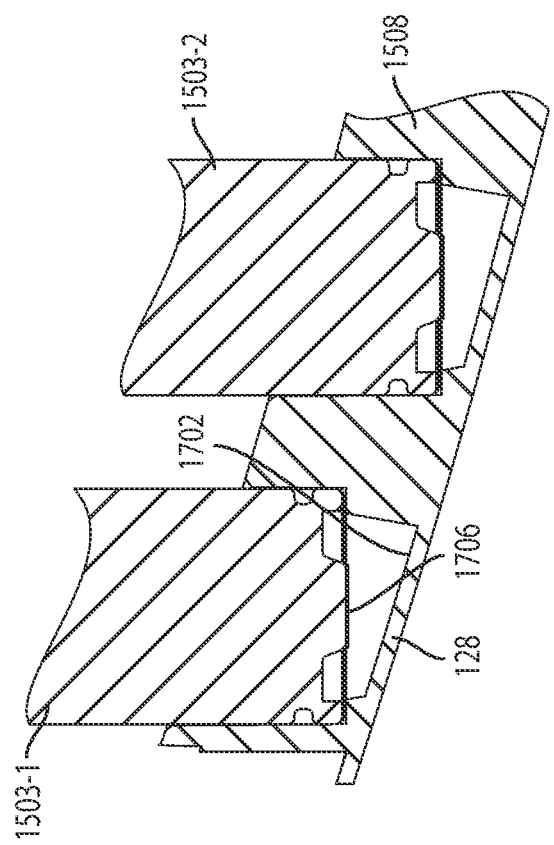
FIG. 17A
FIG. 17B

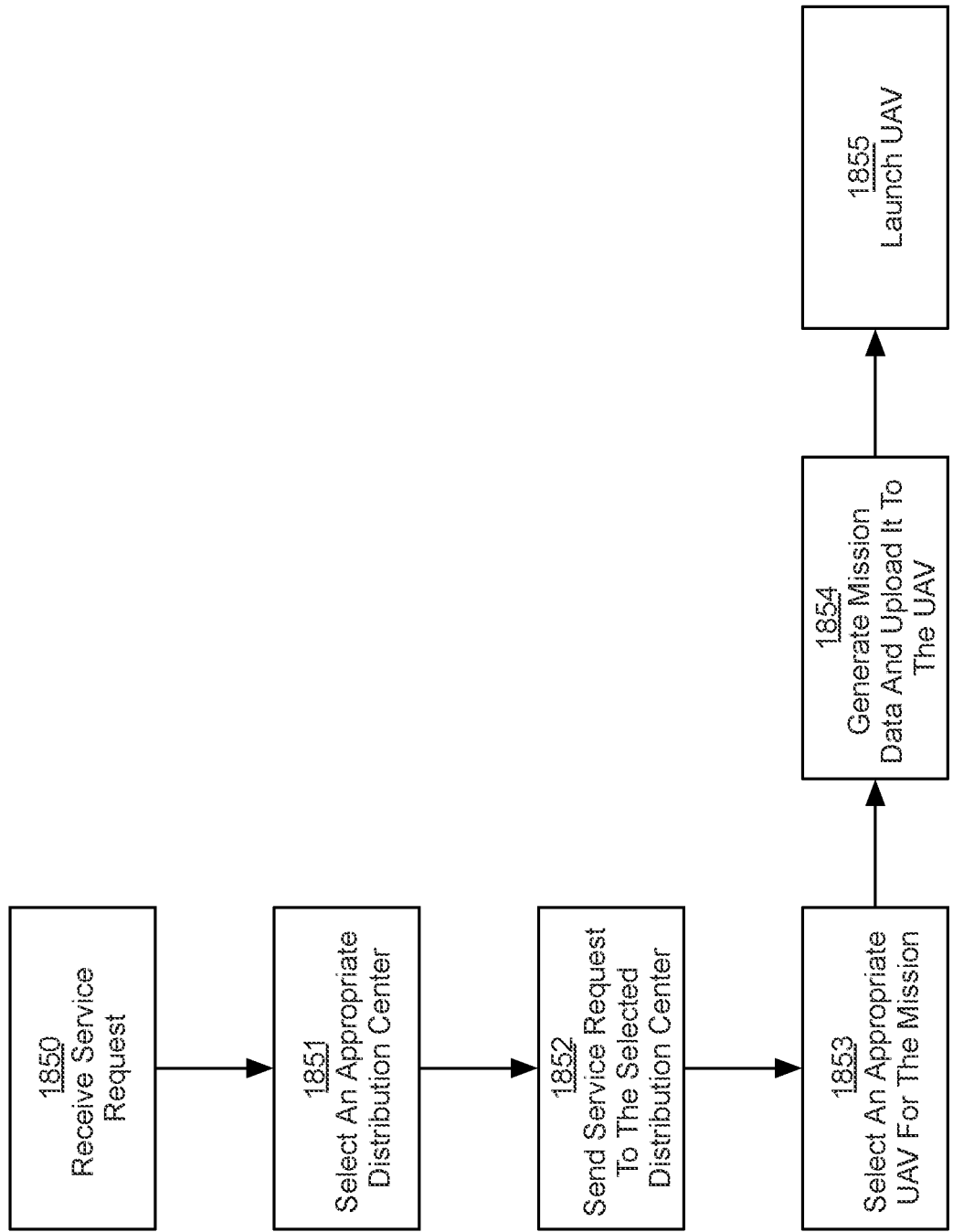

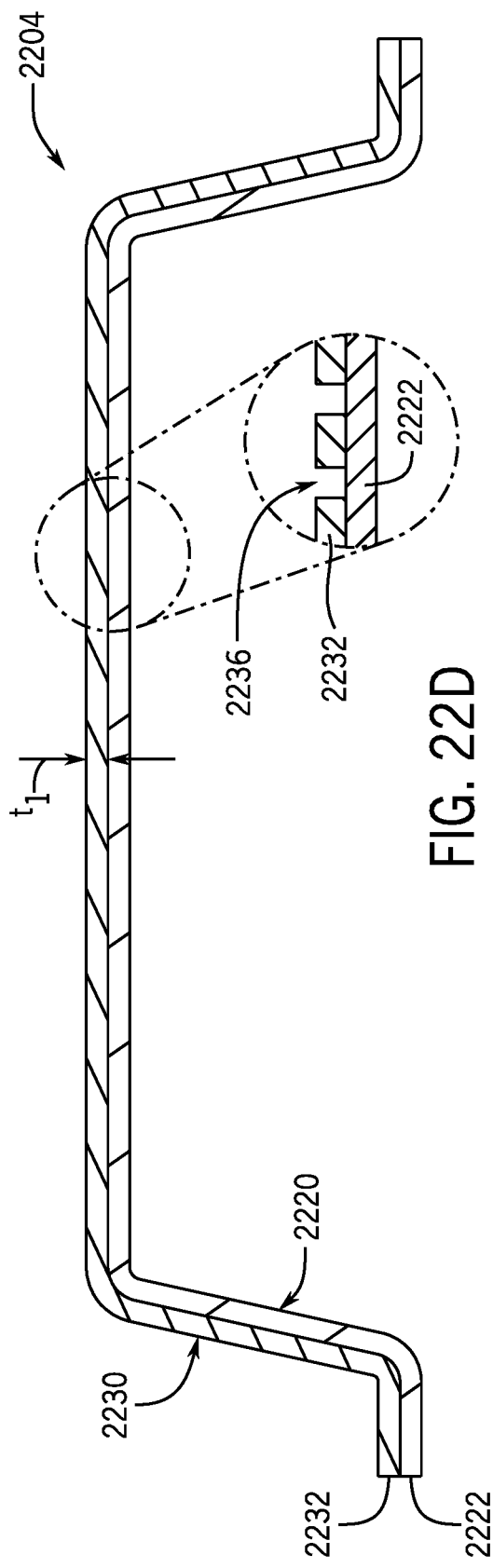
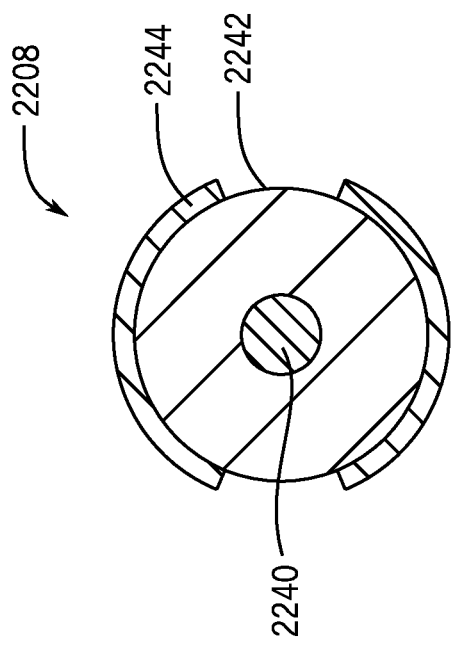
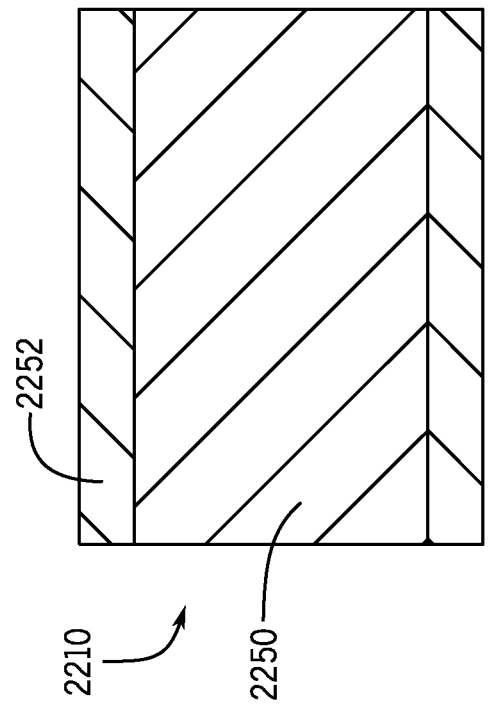
FIG. 22D
FIG. 22F
FIG. 22E

UNMANNED AIRCRAFT SYSTEM WITH SWAPPABLE COMPONENTS AND SHIELDED CIRCUIT BOARD

CROSS-REFERENCE TO RELATED APPLICATION

This patent application is a non-provisional patent application of, and claims priority to, U.S. Provisional Application No. 62/945,017 filed Dec. 6, 2019, titled "UNMANNED AIRCRAFT SYSTEM WITH SWAPPABLE COMPONENTS AND SHIELDED CIRCUIT BOARD," the disclosure of which is hereby incorporated herein by reference in its entirety.

FIELD

The described embodiments relate generally to unmanned aerial vehicles, and more particular to unmanned aerial vehicles with swappable components.

BACKGROUND

Unmanned aerial vehicles (UAVs) are increasing in popularity for various applications. For example, UAVs are prevalent among hobbyists and enthusiasts for recreation, and are increasingly considered as viable package delivery vehicles. UAVs take many forms, such as rotorcraft (e.g., helicopters, quadrotors) as well as fixed-wing aircraft. UAVs may also be configured for different degrees of autonomy and may have varying complexity. For example, simple UAVs have only basic avionics may be controllable only by a human-operated remote control. More complex UAVs may be configured with sophisticated avionics and advanced computers, and may be configured for fully autonomous and/or semi-autonomous flight.

SUMMARY

An unmanned aerial vehicle may include a fuselage, an anchor structure coupled to the fuselage and comprising a wing retention structure and a power module retention structure, a wing releasably coupled to the wing retention structure, thereby coupling the wing to the fuselage, and a power module releasably coupled to the power module retention structure, thereby coupling the power module to the fuselage.

The anchor structure may include a monolithic metal frame that defines at least a portion of both the wing retention structure and the power module retention structure, the fuselage may define a cavity configured to receive the power module therein, and the monolithic metal frame may be mounted to the fuselage adjacent the cavity. The wing retention structure may include a retention pin, and the wing may include a mounting bracket defining a retention slot configured to slidably engage the retention pin. The retention pin may be a first retention pin, the power module retention structure may include a second retention pin, and the power module may be configured to slidably engage the second retention pin. The power module may be received within the cavity the power module prevents the mounting bracket of the wing from disengaging from the first retention pin.

The unmanned aerial vehicle may further include a circuit board attached to the anchor structure and a processor attached to the circuit board and configured to control flight operations of the unmanned aerial vehicle. The coupling between the wing and the wing retention structure may be the exclusive lift-transferring connection between the wing and the fuselage. The fuselage may include a load bearing frame and a closed-cell polymer foam body attached to the load bearing frame, and the anchor structure may be attached to the load bearing frame.

An unmanned aerial vehicle may include a fuselage and an integrated coupling and control unit coupled to the fuselage and comprising a frame member a circuit board coupled to the frame member, a processor attached to the circuit board, a first wing electrical connector, and a first power module electrical connector. The unmanned aerial vehicle may further include a wing comprising a second wing electrical connector configured to be removably coupled to the first wing electrical connector, and a power module comprising a second power module electrical connector configured to be removably coupled to the first power module electrical connector.

The wing may include a movable flight control surface and an actuator coupled to the flight control surface and configured to move the movable flight control surface, and the processor may be configured to send a signal to the actuator, via the first and second wing electrical connectors, to cause movement of the movable flight control surface. The frame member may include a wing retention structure and the wing may include a bracket configured to mechanically engage the wing retention structure.

The second wing electrical connector may be coupled to the wing in a fixed positional relationship to the bracket, thereby causing the first wing electrical connector to be electrically engaged with the second wing electrical connector when the bracket is at least partially mechanically engaged with the wing retention structure. The bracket may be a first bracket, the frame member may include a power module retention structure, and the power module may include a second bracket configured to mechanically engage the power module retention structure.

The second power module electrical connector may be coupled to the power module in a fixed positional relationship to the second bracket, thereby causing the first power module electrical connector to be electrically engaged with the second power module electrical connector when the second bracket is at least partially mechanically engaged with the power module retention structure. The power module may include a locking mechanism configured to retain the power module to the fuselage, thereby maintaining the mechanical engagement between the first bracket and the wing retention structure and between the second bracket and the power module retention structure. The locking mechanism may include a sliding cam mechanism.

The power module may include a handle movable between an open position and a locked position and a sliding cam coupled to the handle. The sliding cam may engage a locking pin as the handle is moved from the open position to the locked position. The wing may define a channel on a top side of the wing, the handle may be received in the channel when the handle is in the locked position, and an exposed portion of the handle and a portion of the wing adjacent the channel may define a substantially continuous exterior surface of the fuselage.

An unmanned aerial vehicle may include a fuselage including a substantially rigid frame and a polymer material attached to at least a portion of the substantially rigid frame to define an exterior surface of the fuselage. The unmanned aerial vehicle may also include an anchor structure attached to the fuselage via the substantially rigid frame, a wing releasably coupled to the fuselage via a mechanical engagement with the anchor structure, and a power module releasably coupled to the fuselage via a mechanical engagement with the anchor structure. The mechanical engagement between the wing and the anchor structure may be substantially the only connection for transferring lift forces from the wing to the fuselage. The anchor structure may include a wing retention structure, and the wing may include a mounting bracket configured to engage the wing retention structure by translating the wing along an installation path. When the wing and the power module are releasably coupled to the fuselage, the power module may prevent translation of the wing in a removal path that is opposite the installation path.

The fuselage may define a nose portion of the unmanned aerial vehicle and a cavity between the nose portion and the wing, and the power module may be received in the cavity. The unmanned aerial vehicle may include a deployable parachute coupled to the anchor structure via a cord.

A deployable parachute system for an unmanned aerial vehicle may include a body defining a cavity, a plunger within the cavity and dividing the cavity into a first chamber on one side of the plunger and a second chamber on a second side of the plunger opposite the first side a parachute positioned in the first chamber, and a propellant positioned in the second chamber. The propellant may be configured to expand within the first chamber to push the plunger along an ejection direction, thereby expelling the parachute from the cavity, and the plunger may be configured to remain within the cavity after the parachute has been expelled from the cavity. The propellant may include an explosive charge. The propellant may include compressed gas.

The body may define an opening at a first end of the body, the parachute may be expelled from the cavity through the opening, and the deployable parachute system may include a retention lip proximate the opening and configured to contact the plunger after deployment of the parachute to retain the plunger within the cavity.

The deployable parachute system may include a cap coupled to the body and substantially covering the opening, a first cord coupling the parachute to the cap, and a second cord configured to couple the cap to a parachute connection point of an unmanned aerial vehicle. The deployable parachute system may include a sleeve substantially surrounding the parachute, wherein the plunger is configured to expel the parachute by pushing the sleeve.

A battery pack for an unmanned aerial vehicle may include a body, a battery cell holder attached to the body and comprising a wall defining a first surface defining an exterior surface of the battery pack and a second surface defining an interior surface of a cavity, an electrical connector positioned at least partially within the cavity, and a battery cell positioned at least partially in the cavity and electrically connected to the electrical connector, wherein in the event of a battery cell failure the battery cell is configured to vent gasses towards the wall.

The first surface may define an exterior surface of an unmanned aerial vehicle. In the event of a battery cell failure, the battery cell may be configured to form an opening in the wall, through the interior surface of the cavity, thereby venting the gasses to an environment exterior to the battery pack. The wall may be formed from a polymer material configured locally fail in the event of a battery failure to allow the battery cell to form the opening in the wall. The battery cell holder may be configured to draw heat from the battery cell and transfer the heat, through the wall, to an environment exterior to the battery pack.

The battery pack may further include an additional battery cell holder attached to the housing and comprising an additional wall that defines a third surface defining an additional exterior surface of the battery pack and a fourth surface defining an additional interior surface of an additional cavity. The battery pack may further include an additional battery cell positioned at least partially in the additional cavity. The exterior surface may be configured to define a portion of a top surface of an unmanned aerial vehicle, and the additional exterior surface may be configured to define a portion of a bottom surface of an unmanned aerial vehicle.

An unmanned aerial vehicle may include a fuselage, an anchor structure coupled to the fuselage and comprising a battery pack retention structure, and a battery pack releasably coupled to the battery pack retention structure, thereby coupling the battery pack to the fuselage. The battery pack may include a battery cell holder comprising a wall defining a first surface defining at least part of an exterior surface of the unmanned aerial vehicle, and a second surface defining an interior surface of a cavity. The battery pack may also include a battery cell positioned at least partially in the cavity. The battery cell holder may be configured to draw heat from the battery cell and transfer the heat, through the wall, to air flowing along the exterior surface of the unmanned aerial vehicle during flight. In the event of a battery cell failure, the battery cell may be configured to form an opening in the wall, through the interior surface of the cavity, thereby venting gasses from the battery cell to the air flowing along the exterior surface of the unmanned aerial vehicle during flight.

The exterior surface of the unmanned aerial vehicle may be a top exterior surface of the unmanned aerial vehicle, and the battery pack may include an additional battery cell holder comprising an additional wall defining at least part of a bottom exterior surface of the unmanned aerial vehicle, the additional battery cell holder configured to draw heat from an additional battery cell and transfer the heat from the additional battery cell, through the additional wall, to air flowing along the bottom exterior surface of the unmanned aerial vehicle during flight.

An unmanned aerial vehicle may include a fuselage and an integrated coupling and control unit coupled to the fuselage and comprising a metal frame member having a cavity defined by a bottom wall and a side wall extending from the bottom wall, a circuit board coupled to the frame member, a processor attached to the circuit board and positioned at least partially within the cavity, a shielding material coupled to the circuit board, and a conductive deformable material compressed between the circuit board and the metal frame member. The conductive deformable material may be configured to form a water resistant seal between the circuit board and the metal frame member and conductively couple the metal frame member to the shielding material. The unmanned aerial vehicle may further include a wing mechanically retained to the frame member and electrically coupled to the processor.

The processor may be attached to a first surface of the circuit board and the shielding material may be attached to a second surface of the circuit board that is opposite the first surface. The processor may be substantially enclosed within a volume defined by the cavity, the conductive deformable material, and the circuit board. The conductive deformable material may be a polymer material with conductive particles embedded therein. The conductive deformable material may be positioned along a top side of the side wall.

The metal frame member may define an additional cavity, and the integrated coupling and control unit may include an additional processor attached to the circuit board and positioned at least partially within the additional cavity, wherein the additional cavity is distinct from the cavity and the additional processor is a redundant backup to the processor.

A system for operating an unmanned aerial vehicle may include a computer system configured to receive a service request specifying a destination site, configure an unmanned aerial vehicle to fly to the destination site, while the unmanned aerial vehicle is flying to the destination site receive route refinement information and generate updated navigation data based at least in part on the route refinement information, and send the updated navigation data to the unmanned aerial vehicle. The system may also include an unmanned aerial vehicle include a fuselage, an anchor structure coupled to the fuselage and comprising a wing retention structure, a circuit board, a wing electrical connector coupled to the circuit board, and a processor coupled to the circuit board and configured to control flight operations of the unmanned aerial vehicle. The unmanned aerial vehicle may further include a wing mechanically coupled to the wing retention structure and electrically coupled to the wing electrical connector and comprising an actuator for moving a movable flight control surface. The unmanned aerial vehicle may be configured to receive, at the processor, the updated navigation data and send a control signal, via the wing electrical connector, to the actuator to move the movable flight control surface and cause the unmanned aerial vehicle to navigate along a path defined by the updated navigation data.

In another example, a circuit board assembly for association with an aircraft, such as an unmanned aerial vehicle, is disclosed. The circuit board assembly includes a circuit board. The circuit board assembly further includes an electromagnetic interference component connected to the circuit board. The circuit board assembly further includes an enclosure having an electromagnetic signal permissive layer and an electromagnetic signal blocking layer. The electromagnetic signal permissive layer includes a housing that defines a volume or open space or void between the circuit board and the housing. The housing encloses the electromagnetic interference component on the circuit board. The electromagnetic signal blocking layer provides a conductive barrier about the electromagnetic interference component.

In another example, the electromagnetic signal permissive layer may include a thermoformed plastic substrate. The electromagnetic signal blocking layer may include a metallic layer that provides the conductive barrier. In some cases, the metallic layer may have a thickness of less than about 50 microns. Additionally, the metallic layer may have a metallic coating or metallic plating applied over the electromagnetic signal permissive layer. The metallic layer may include discontinuities, the discontinuities being shorter than a wavelength of a targeted electromagnetic signal blocked by the enclosure. The electromagnetic signal blocking layer may be structurally supported by the electromagnetic signal permissive layer.

In another example, the circuit board assembly may include a flange extending around a periphery of the enclosure. The flange may be configured to seat the enclosure on the circuit board. For example, the circuit board assembly may include an electromagnetic interference gasket having a conductive metallic exterior. The electromagnetic interference gasket may be configured to form a conductive bridge between the flange and the circuit board. The electromagnetic interference gasket may include a compressible foam core and a conductive pressure-sensitive adhesive along the conductive metallic exterior.

In another example, the circuit board assembly may include an environmental gasket having an exterior adhesive and proximal to the electromagnetic interference gasket at the periphery of the enclosure. The environmental gasket may have an environmental gasket height. Further, the electromagnetic interference gasket may have an electromagnetic interference gasket height that is greater than the environmental gasket height. In this regard, the flange may be adhered to the environmental gasket, thereby compressing the electromagnetic interference gasket and forming the conductive bridge. In some cases, the circuit board may include a metal trace that is configured to match a footprint of the flange. The metal trace may be electrically coupled to the electromagnetic signal blocking layer via the electromagnetic interference gasket to establish a common electrical potential between the electromagnetic interference component and the enclosure.

In another example, the circuit board assembly may further include a vent defined in the enclosure. The vent may be configured to permit air exchange between the volume and the external environment. The vent may further be configured to hinder liquid and debris from entering the volume or open space or void defined between the housing and the circuit board from the external environment.

In another example, a method is disclosed. The method includes providing an enclosure that defines an open space or void. The enclosure includes an electromagnetic signal permissive layer and an electromagnetic signal blocking layer. The method further includes enclosing an electromagnetic interference component on a circuit board with the enclosure. The method further includes coupling the enclosure to the circuit board to define a circuit board assembly. The method further includes attaching the circuit board assembly with a fuselage of an aircraft. The circuit board assembly may define an environmental barrier and a conductive barrier between the electromagnetic interference component and the fuselage.

In another example, the method may further include establishing a conductive bridge between the enclosure and the circuit board using an electromagnetic interference gasket. The electromagnetic gasket may include a conductive metallic exterior connected to the circuit board and a flange of the enclosure that extends about a periphery of the enclosure. Further, the electromagnetic interference gasket may include a foam core and a conductive pressure-sensitive adhesive along the exterior. In this regard, the coupling may further include compressing the electromagnetic interference gasket and adhering the electromagnetic interference gasket to the enclosure to the circuit board.

In another example, the bonding or coupling further comprises adhering an environmental gasket to the flange and the circuit board alongside the electromagnetic interference gasket at the periphery of the enclosure. The method may further include maintaining the compression of the electromagnetic interference gasket based in part on the environmental gasket having an environmental gasket height that is less than a height of the electromagnetic interference gasket.

In another example, the attaching or coupling may further include removably attaching the circuit board assembly to a mount structure of the aircraft using one or more standoff features.

In another example, an aircraft is disclosed. The aircraft includes a circuit board assembly, such as any of the circuit board assemblies described herein. The aircraft further includes a fuselage. The aircraft further includes one or more standoff features configured to removably attach the circuit board assembly to the fuselage or a mount structure housed within the fuselage.

In another embodiment, the aircraft further comprises the mount structure. Further, the one or more standoff features may define a ridge configured to define an offset between the circuit board and the mount structure to accommodate the enclosure therebetween. The aircraft may be an unmanned aerial vehicle.

In addition to the exemplary aspects and embodiments described above, further aspects and embodiments will become apparent by reference to the drawings and by study of the following description.

BRIEF DESCRIPTION OF THE DRAWINGS

The disclosure will be readily understood by the following detailed description in conjunction with the accompanying drawings, wherein like reference numerals designate like structural elements, and in which:

FIGS. 3A-3B depict partial views of the UAV of FIGS. 1A-1B, showing details of the internal structure of the UAV;

FIGS. 4A-4D depict exploded views of the UAV of FIGS. 1A-1B, showing the UAV with its wing structure and power module removed from the fuselage;

FIGS. 17A-17B depict partial cross-sectional views of the power module of FIG. 15;

FIG. 18B is a diagram illustrating a UAV launch process;

FIG. 22D is a schematic cross-sectional view of an enclosure of the shielded circuit board assembly of FIG. 22A;

FIG. 22E is a schematic cross-sectional view of an environmental gasket of the shielded circuit board assembly of FIG. 22A;

FIG. 22F is a schematic cross-sectional view of an electromagnetic interference gasket of the shielded circuit board assembly of FIG. 22A;

DETAILED DESCRIPTION

Figure 1A:
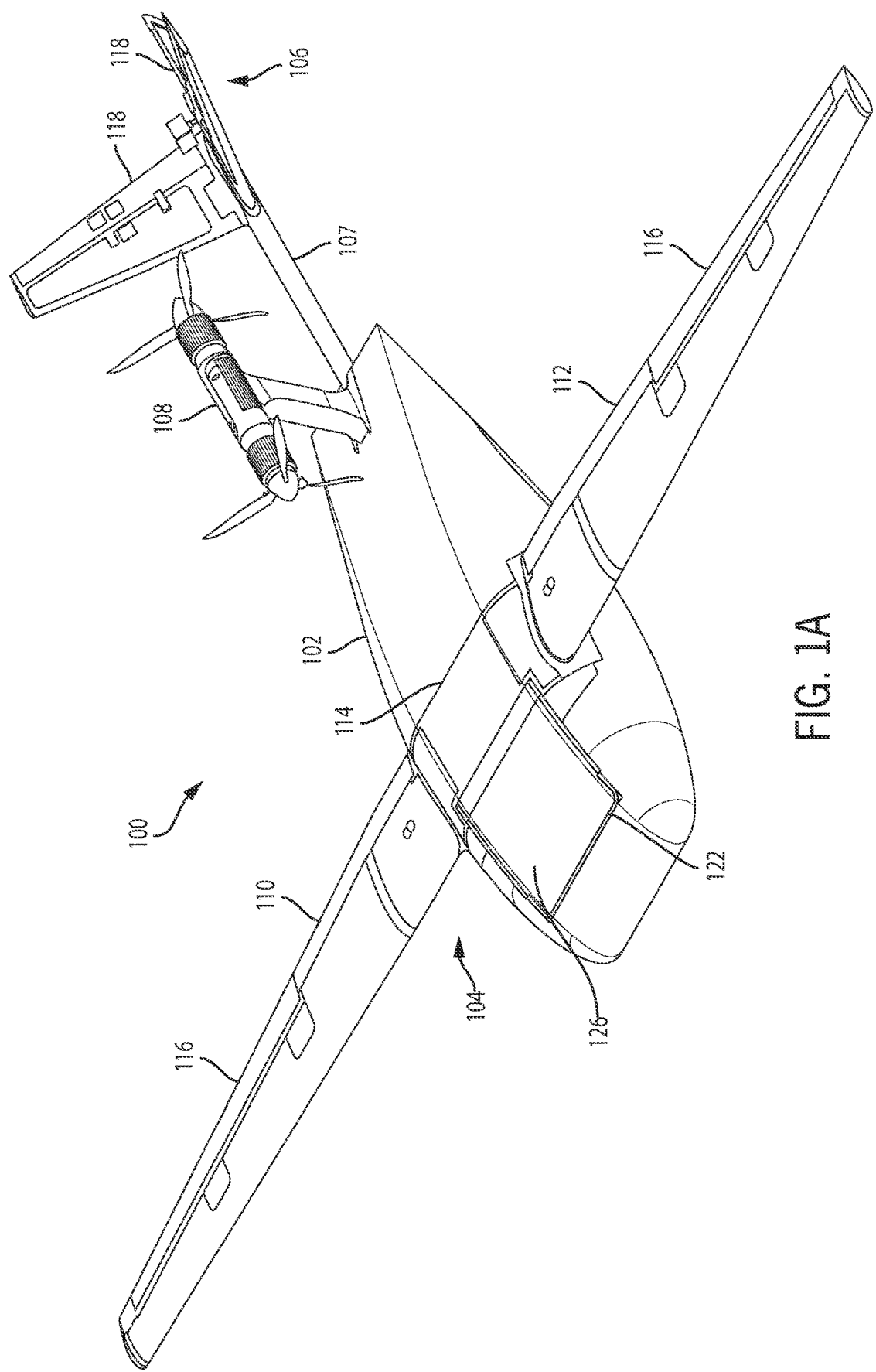
FIGS. 1A-1B depict an example unmanned aerial vehicle (UAV)

Reference will now be made in detail to representative embodiments illustrated in the accompanying drawings. It should be understood that the following description is not intended to limit the embodiments to one preferred embodiment. To the contrary, it is intended to cover alternatives, modifications, and equivalents as can be included within the spirit and scope of the described embodiments as defined by the appended claims.

The embodiments described herein are generally directed to unmanned aerial vehicles (UAVs) with swappable components, and which use an integrated coupling and control unit to facilitate fast and efficient coupling and decoupling of components, while producing secure mechanical as well as electrical connections. Broadly, UAVs with swappable components may include wings and battery packs that can be securely attached to a fuselage to enable flight, but can also be removed from the fuselage quickly and easily, and without damaging the wings, battery packs, or fuselage.

Using removable couplings for such components may provide numerous advantages. For example, if a wing is damaged or needs maintenance, it can be quickly and easily removed from the fuselage and repaired or replaced with another wing. As another example, swappable battery packs may allow faster turnaround between missions of a particular UAV, as spent batteries can be quickly replaced with pre-charged batteries, obviating the need to take an entire UAV out of commission to charge a more permanently affixed battery.

In order to maximize flight duration and payload capacity, UAVs may be designed to be as light as possible. Lightweight materials, however, may weaker than heavier materials. For example, building a fuselage largely from a polymer foam material may be lighter than one made from aluminum or other metals, but it also may be weaker or more susceptible to damage than metal. Moreover, such lightweight materials may be less capable of supporting structural connections with other components of the UAV, such as wings, battery packs (which may be up to 20%, 30%, 40% or more of the total weight of the UAV), and the like.

The UAVs described herein address these and other drawbacks of conventional UAV design. In particular, described is a UAV system in which a fuselage is built around an anchor structure that provides the principal load-bearing connection between the fuselage, the wings, and the battery pack. For example, an anchor structure, which may be a metal structure with retention structures (e.g., pins), is structurally attached to a lightweight fuselage. A battery pack is attached to the UAV via a releasable coupling with one of the attachment structures, and a wing is attached to the UAV via a releasable coupling with another of the attachment structures. Because the principal load-bearing connection between the wings and the fuselage and the battery and the fuselage is via the anchor structure, additional structural connections can be omitted. This may reduce the overall weight of the UAV, while also simplifying the mechanical interconnects between the components and facilitating simple, fast, and accurate coupling and decoupling of the components.

In addition to providing load-bearing mechanical coupling between the wing, battery pack, and fuselage, the anchor structure may provide a mount for the avionics of the UAV, including circuit boards, processors, antennas, communication circuitry, and the like. This may be a convenient location for the avionics for various reasons. For example, the wing and battery pack may couple directly to the anchor structure. When these components are removed, they may allow direct access to the avionics for inspection, repair, replacement, or the like. Further, while the anchor structure may be structurally coupled to the fuselage, it may be relatively simple to remove from the fuselage. Accordingly, an entire anchor structure can be removed as a single module to facilitate simple and efficient replacement and repair. The integration of the avionics with the anchor structure may also be designed so that the anchor structure forms part of an environmental seal and an electromagnetic shield for the avionics. Such features and benefits are described in greater detail herein.

Because the anchor structure carries the avionics of the UAV and also has a direct mechanical connection to the wing and the battery pack, electrical connectors may also be coupled to the anchor structure to facilitate electrical connections between the wing and the avionics, and the battery pack and the avionics. The electrical connectors may be coupled to the anchor structure such that mechanically securing the wing to the anchor structure results in a positive electrical connection between complementary electrical connectors on the wing and the anchor structure. More particularly, the mechanisms for physically attaching and retaining the wing to the anchor structure may have a high precision, self-aligning configuration that, when mated together, automatically aligns the corresponding electrical connectors with one another. A similar connection scheme may be used for electrically connecting the battery pack to the anchor structure. This allows both mechanical and electrical connections to be formed between the wing and fuselage (and battery pack and fuselage) with a single coupling process, further reducing the time and complexity of what would otherwise be a complicated and time-consuming process. Other types of connectors between the anchor structure and the battery pack or wing may also be included, such as to connect coolant tubes or other fluid conduits together. For example, a battery pack or a wing may have a heat exchanger, and fluid conduits may be used to draw heat from electrical or other components on the anchor structure to the heat exchanger.

The mechanisms for coupling the wing and battery pack to the anchor structure may be designed and manufactured with high precision and accuracy, thus facilitating highly accurate and repeatable alignment between all components, connectors, and the like. Further, such high-precision design and construction improves the interchangeability of the various components, allowing different battery packs, wings, and fuselages to be combined to produce a single UAV. Additionally, the high-precision design and construction reduces sloppy fitments between components that may contribute to vibrations, oscillations, rattles, or other phenomena that may be detrimental to the operation of a UAV (e.g., by causing unstable flight, unexpected detachment of components, or the like).

The anchor structure may act as a load-bearing structure for other components of the UAV as well. For example, UAVs as described herein may be fitted with parachutes for controlling the descent of the UAV in the event of a malfunction, a loss of power, or to otherwise produce a substantially controlled landing of the UAV. It may not be feasible to attach parachutes to the lightweight materials of a UAV fuselage, however, as they may not be suitable for or capable of supporting the weight of the entire UAV during a parachuting descent. Accordingly, a parachute may be attached to the anchor structure, which, as a load-bearing connection point to the fuselage, is capable of supporting the entire UAV via the parachute.

The combination of the anchor structure, the avionics, and the electrical connectors (as well as other possible components) may be referred to herein as an integrated coupling and control unit. As set forth above and described in greater detail herein, the integrated coupling and control unit provides numerous structural and electrical connections between components of a UAV. Additional features, benefits, and details of the integrated coupling and control unit are also described herein, along with additional details of UAVs that may be used alone or in conjunction with an integrated coupling and control unit.

Figure 1B:
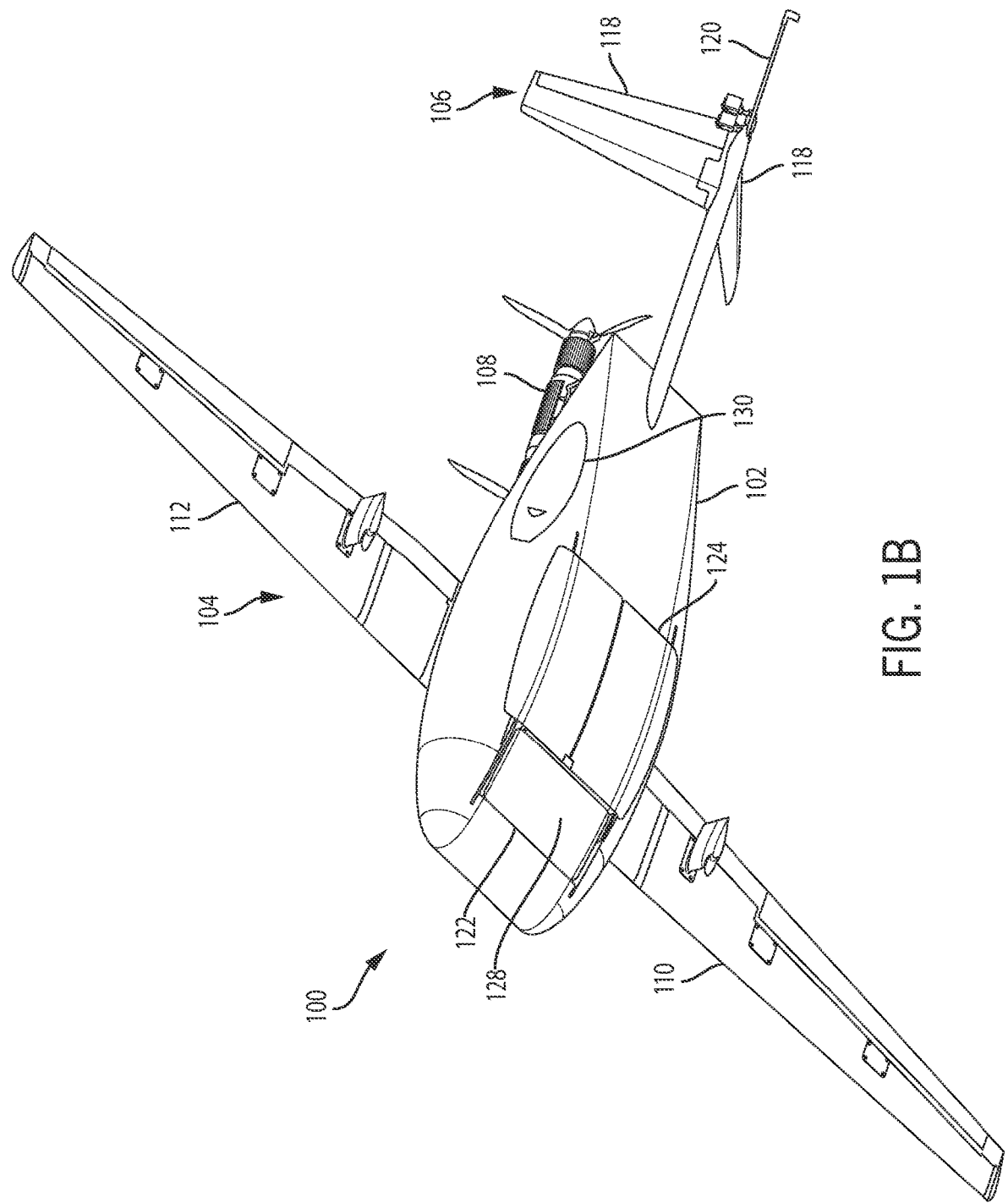

FIGS. 1A-1B depict an example UAV 100. The UAV 100 may include a fuselage 102, a wing structure 104, a tail section 106, and a motor module 108. As described in greater detail herein, the fuselage 102 may be formed from a substantially rigid load bearing frame and a polymer foam body that at least partially encapsulates the frame. The fuselage 102 may also have a shape that provides lift to the UAV during flight, in addition to the wing structure 104. (As used herein, flight may refer to sustained flight operations as well as takeoff and landing operations.)

The wing structure 104 may provide lift to the UAV during flight, and may be releasably coupled to the fuselage 102. The wing structure 104 may be part of a single, integrated structure that includes a first wing segment 110 on one side of the fuselage 102, a second wing segment 112 on an opposite side of the fuselage, and a central section 114 between and joining the first and second segments 110, 112. As described herein, the wing structure 104 may be releasably coupled to the fuselage 102 via an integrated coupling and control unit. While the example in the current figures shows a single structure that includes two wing segments (or wings), in other examples a wing structure may include separate structures or components that are each releasably coupled to the integrated coupling and control unit.

The wing structure 104 may include movable flight control surfaces 116, which may be or may resemble flaps. The flight control surfaces 116 may be configured to move to control and/or change the attitude of the UAV in flight (e.g., to change the pitch and/or roll of the UAV 100). The flight control surfaces 116 may be coupled to cause the movable flight control surfaces 116 to move to control the UAV 100. More particularly, the avionics of the UAV 100 may send signals to the actuators that cause the actuators to move the flight control surfaces 116 in a particular way. The actuators may be or may include any suitable actuator or actuation technology, including servos, electric motors, hydraulic actuators, pneumatic actuators, piezoelectric actuators, or the like. The actuators may be mechanically coupled to the flight control surfaces 116 in any suitable way, including via linkages, push rods, cables, or the like. As described herein, the actuators may be electrically coupled to the avionics of the UAV 100 via a releasable electrical connection between the wing structure 104 and the integrated coupling and control unit.

The UAV may also include a power module 122 that is attached to the fuselage. The power module 122 may provide power and/or fuel for the UAV 100. For example, the power module 122 may be or may include a battery pack that provides electrical power for the avionics and optionally any electric motors and/or other components on the UAV 100. In cases where a UAV includes internal combustion motors for propulsion, the power module 122 may also or instead include a fuel tank or other fuel storage system. The power module 122 may also or instead include a capacitor or group of capacitors, fuel cell, or any other suitable fuel and/or power (e.g., electrical power) storage unit. The power module 122, which may be removable from the fuselage 102 to facilitate easy swapping, may also define exterior surfaces 126 (FIG. 1A) and 128 (FIG. 1B) of the UAV 100. As described herein, these exterior surfaces may provide various functionality, including acting as a heat exchanger (e.g., a heat sink) for batteries inside the power module 122, and providing a sacrificial component in the event of a battery cell failure. Like the wing structure 104, the power module 122 may be removably attached to the fuselage 102 via a releasable coupling with an integrated coupling and control unit.

The tail section 106 may also include movable flight control surfaces 118 that may move to control the attitude of the UAV 100 during flight. The movable flight control surfaces 118 are also moved by actuators, which may be similar to the actuators that move the flight control surfaces 116 of the wing structure 104. The tail section 106 may be attached to the fuselage 102 via a tail support 107 that may be attached to an internal load bearing frame of the fuselage 102. The tail support 107 may have a hollow interior channel that carries wires for electrically connecting the actuators and/or other tail-mounted electronics to the avionics of the UAV 100.

The motor module 108 may include one or more motors for propelling the UAV 100 during flight. As shown, the motor module 108 includes two propellers, which are configured to act in concert to propel the UAV 100. In other cases, more or fewer propellers may be used. Moreover, while the instant UAV 100 is described as using one or more electric motors and propellers for propulsion, other types of propulsion may also be used, including internal combustion motors with propellers, turbines, rockets (e.g., solid and/or liquid fuel rocket motors), or the like. Further, while the motor module 108 is shown positioned at a particular location on the UAV 100, the motor module 108 may be positioned elsewhere, such as at a nose of the fuselage 102, the wings, the tail (or any other suitable location).

As shown in FIG. 1B, the UAV 100 may also include doors 124. The doors 124 may be configured to open and close to allow access to an internal cargo bay. For example, the doors 124 may be opened (e.g., by actuators within the UAV 100 and attached to the doors 124) to allow a payload to be placed within the cargo bay. During flight, the doors 124 may be closed to contain the payload within the cargo bay. In order to deliver the payload to an intended recipient or location, the doors 124 may be opened, during flight, and the payload may be dropped to the ground. The payload may be attached to a parachute or other descent-controlling component so that the payload reaches the ground safely, and optionally to direct the payload to a particular location. The payload may be any suitable payload. For example, the payload may include medical supplies, pharmaceuticals, mail, blood for blood transfusions, or the like. In one embodiment the payload doors 124 may open to expose a fixed payload such as a camera, LIDAR, RADAR, or other instrument. The payload doors 124 can be opened for a portion of a flight so that the instrument can operate and then closed to protect the instrument for the remainder of the flight.

The UAV 100 may also include a capture hook 120. The capture hook 120 may be attached to the UAV 100 via the tail support 107 or via any other suitable attachment point. The capture hook 120 may be used at the end of flight to engage a capture line of a UAV retrieval system. For example, the UAV 100 may be flown at or near a capture line that is positioned above the ground. The capture line may slow the UAV 100 to a complete stop and lower the UAV 100 to the ground after for safe retrieval. The capture hook 120 may be configured to pivot, extend, or otherwise move from a first (e.g., stowed) position to a capture (e.g., deployed) position prior to engaging a capture line. The capture hook 120 may be deployed in response to a signal, which may be based on a location of the UAV. In some cases, the UAV itself may generate the signal (e.g., based on a proximity to a retrieval system as determined by the UAV), or it may be sent from a retrieval system to the UAV. The capture hook 120 may be used in conjunction with a retrieval system such as that described in U.S. patent application Ser. No. 15/712,107, entitled "Automated Recovery System for Unmanned Aircraft," which is incorporated by reference herein in its entirety. In some cases, instead of or in addition to the capture hook 120, the UAV may include landing gears, wheels, or other landing systems or components.

The UAV 100 may also include a parachute access panel 130 that may cover a deployable parachute system. The parachute access panel 130 may be removed when the parachute is deployed. More particularly, in cases a deployable parachute system uses a propellant (e.g., an explosive charge) to rapidly deploy a parachute. The deploying parachute may force open the parachute access panel 130 to allow the parachute to exit the fuselage 102 and begin slowing the descent of the UAV 100.

Figure 2A:
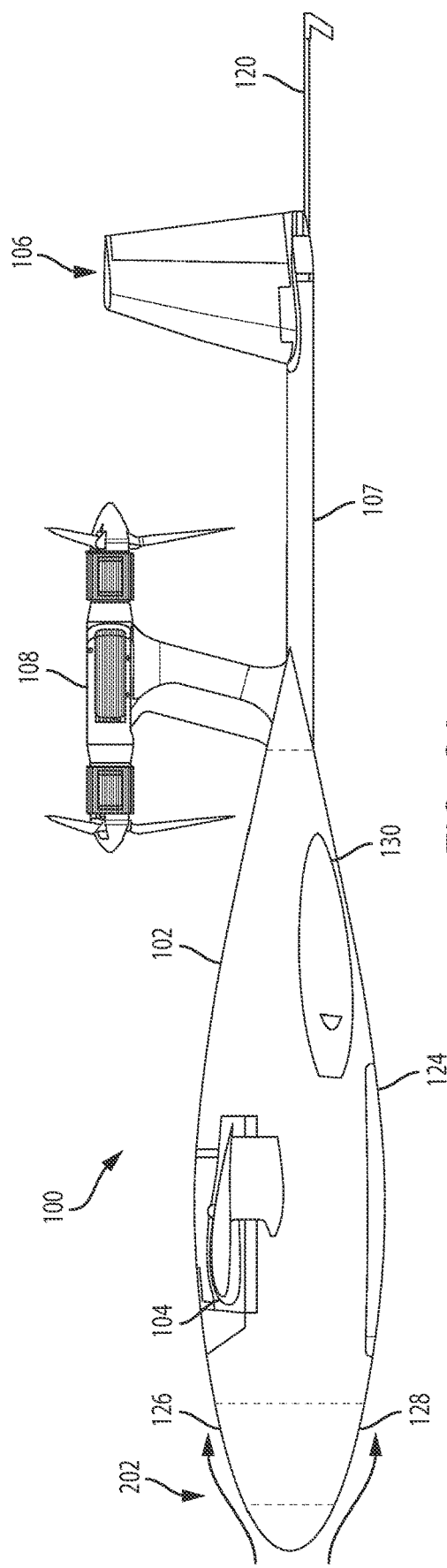
FIGS. 2A-2B depict side views of the UAV of FIGS. 1A-1B.
Figure 2B:
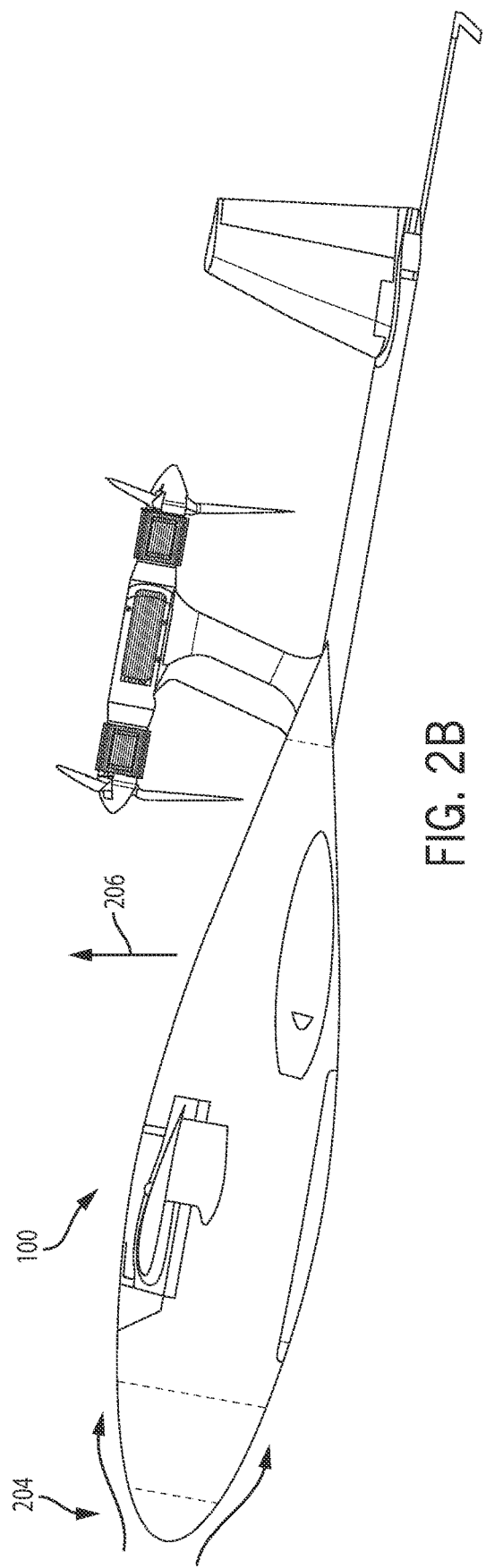

FIGS. 2A and 2B depict side views of the UAV 100, with FIG. 2A showing a representation of the UAV 100 during level flight (e.g., with an angle of attack of approximately zero), and FIG. 2B showing a representation of the UAV 100 at an increased angle of attack. Example airflow is shown by arrows 202 (FIG. 2A) and 204 (FIG. 2B). As shown in FIG. 2A, the fuselage 102 may have a substantially symmetrical side cross-section. Accordingly, during level flight, the UAV 100 may rely substantially entirely on the wing structure 104 to provide lift to the UAV 100, as the symmetrical shape of the fuselage 102 may result in little additional lift.

As shown in FIG. 2B, when the angle of attack of the UAV 100 is increased, the fuselage 102 may generate lift (represented by arrow 206) that helps maintain the UAV 100 aloft during flight. Further, the increased lift may decrease the stall speed of the UAV 100, allowing the UAV 100 to stay aloft at lower speeds. This may be particularly useful during low-speed maneuvers that may be critical to the success of UAV missions. For example, in order to accurately and safely deliver cargo to a particular location by dropping the cargo from the air, it may be particularly beneficial for the UAV 100 be able to maintain lift at as low a speed as possible. The shape of the fuselage 102 may allow the UAV 100 to decrease its stall speed (and thus fly at a lower speed) prior to and during a cargo delivery portion of a mission by simply changing its angle of attack. The UAV 100 may also decrease its stall speed at other times during a mission, such as prior to and during takeoff and/or landing.

Because the fuselage 102 is symmetrical, it may not generate substantial lift during level flight. This may make level flight more efficient, as lift-induced drag may be reduced or eliminated. At the same time, lift may be increased selectively by changing the angle of attack of the UAV 100, as described above. Accordingly, the symmetrical wing shape of the fuselage 102 provides additional lift to the UAV 100 when it is needed, without adding substantial lift-induced drag during level flight.

FIGS. 2A-2B also illustrate how the exterior surfaces 126, 128, which may be defined by a part of a removable power module and/or battery pack, are positioned in the airflow that flows over the fuselage 102 when the UAV 100 is in flight. As described herein, these surfaces may be heat sink surfaces that are thermally coupled to heat-generating components within the fuselage 102, such as battery cells. The airflow over the surfaces 126, 128 during flight may aid in removing heat from the power module. Further, in cases where the power module is configured to vent the gasses of failed battery cells through the surfaces 126, 128, the vented gasses may be directed directly into the airflow. This may prevent and/or reduce the likelihood of the escaping gasses from damaging other battery cells or other portions of the UAV 100.

UAVs in accordance with the concepts described herein may be formed using any suitable constructions. In some cases, UAVs—and in particular the fuselage of UAVs—may include a load bearing frame that is at least partially encapsulated and/or surrounded by a foam outer shell or body. The load bearing frame may be the main structural portion of the UAV, while the foam body may define the overall shape of the UAV and/or the fuselage.

Figure 3B:
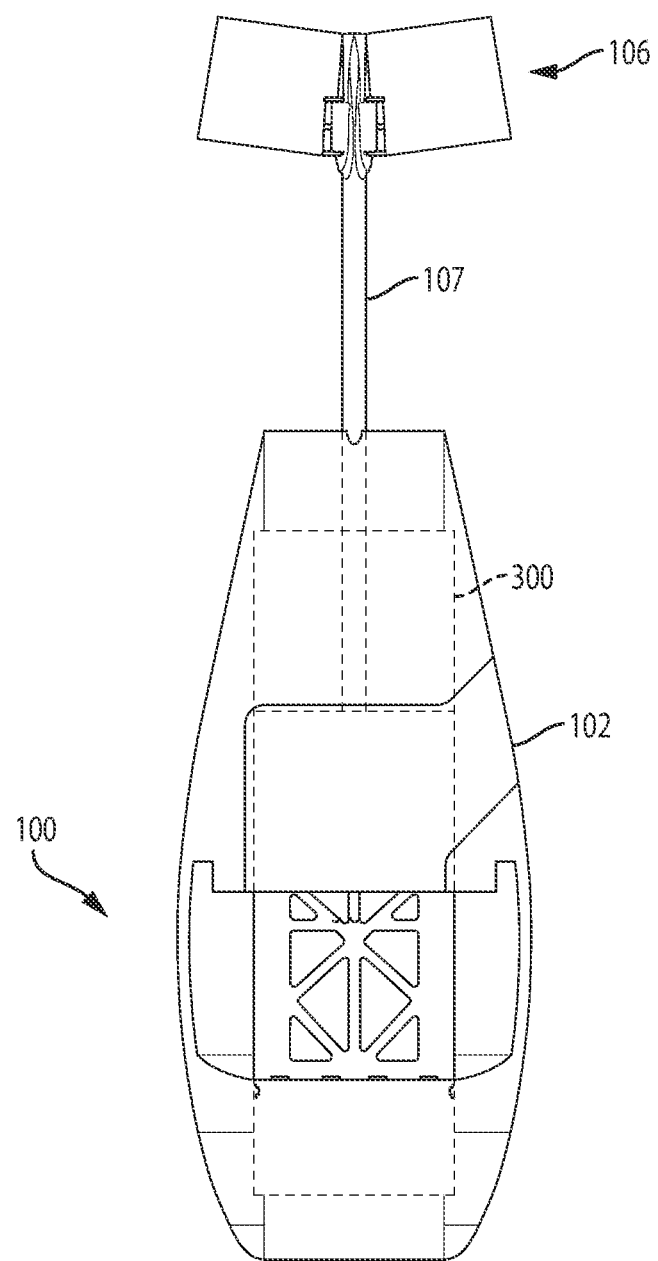

FIG. 3A is a partial top view of a portion of the UAV 100, and FIG. 3B is a partial perspective view of a portion of the UAV 100. In FIGS. 3A-3B, the UAV 100 is shown with the motor module 108 and the wing structure 104 removed. The UAV 100 may include a frame 300 that is at least partially encapsulated by a body 301. The frame 300 may be a rigid load-bearing frame that is configured to act as the primary structural member for the UAV 100. For example, the wing structure 104 and the tail support 107 may be structurally attached to the frame 300 to allow forces from the wing structure 104 and the tail section 106 (e.g., lift and other flight-control forces) to be transferred to the fuselage 102.

The frame 300 may include multiple struts, walls, plates, rods, and/or other structural members, that are secured to one another to form a substantially rigid structure. The structural members of the frame 300 may be secured to one another in any suitable manner, including fasteners (e.g., screws, bolts, rivets, etc.), adhesives, welding, brazing, soldering, or the like. The frame 300 may be formed from or include any suitable material, such as carbon fiber, fiberglass, metal (e.g., aluminum, titanium, etc.), plastics, or any other suitable material (or combination of materials).

The frame 300 may also be configured to interface with other structures and/or components of the UAV 100. For example, as described herein, the UAV 100 may have an integrated coupling and control unit that provides a quick-release style coupling between the wing structure 104 and the fuselage 102 and between the power module 122 and the fuselage 102. The integrated coupling and control unit may include an anchor structure that defines the retention structures to which the wing structure 104 and the power module 122 are coupled, and through which the loads from the wing structure 104 and the power module 122 are transferred to the rest of the UAV 100. Accordingly, the frame 300 may include an anchor support member 302. The anchor support member 302 may be configured to receive and securely attach the anchor structure to the frame 300. For example, the anchor structure may be secured to the anchor support member 302 via fasteners, adhesives, or any other suitable attachment technique.

The body 301 of the fuselage may be attached to the frame 300 to define the outer shape of the fuselage 102. The body 301 may be formed from or include any suitable material, such as a polymer foam material (e.g., expanded polystyrene or any other suitable open-cell or closed-cell polymer foam), wood (e.g., balsa wood), or the like. The body 301 may be attached to the frame 300 in any suitable way. For example, in cases where a polymer foam is used, the frame 300 may be placed into a mold, and the polymer foam (or a precursor material of a polymer foam) may be introduced into the mold and around the frame 300. When expanded, the polymer foam may at least partially encapsulate the frame 300. The encapsulation of the frame 300 by the foam may structurally secure the frame 300 and the foam, thus producing a structurally sound fuselage.

The body 301 may be attached in other manners as well. For example, one or more body panels may be retained to the frame 300 using fasteners, elastic members, interlocking structures (on either or both the frame 300 and the body panels), or the like. In some cases, the body 301, and/or individual body panels that make up the body 301, may be configured to detach from the frame 300 in the event of an impact such as may occur during a hard landing or a crash event. In such cases, the detachment of the body panels may distribute impact forces and prevent, limit, or reduce the likelihood of damage to the frame 300. The panels defining the body 301 may be configured with quick-release style fasteners (e.g., elastic members, non-permanent fasteners, interference fit fasteners, etc.) for easy removal and replacement without damaging the panels or the frame 300.

The body 301 also defines a cavity 304 between a nose portion of the UAV 100 and the wing structure 104 that is configured to receive the power module 122. The cavity 304 and the power module 122 may be shaped so that when the power module 122 is received in the cavity 304, exterior surfaces 126, 128 of the power module 122 form exterior surfaces of the fuselage 102. Accordingly, the cavity 304 may extend completely through the fuselage 102 to define a first opening in a top surface of the fuselage 102 and a second opening in a bottom surface of the fuselage 102.

The cavity 304 may be adjacent the anchor support member 302. In particular, because the anchor support member 302 is configured to receive an anchor structure, the placement of the cavity 304 allows the power module 122 to easily mechanically and electrically couple to the anchor structure, as described herein.

The internal walls of the cavity 304 may be defined by portions of the frame 300, and may include guiding mechanisms 308 that engage with corresponding guiding mechanisms on the power module 122 to facilitate proper alignment between the power module 122 and the frame 300 (and thus the anchor structure) when the power module 122 is inserted into the cavity 304. The guiding mechanisms 308 are shown in FIG. 3A as channels that receive corresponding features (e.g., protrusions, pins, fins, tabs, etc.) on the power module, though other guiding mechanisms may be used, or the positions of the guiding mechanisms may be swapped.

The portions of the frame 300 that define the cavity 304 may also include load bearing features (e.g., the top edges of the frame portions that define the cavity 304) on which a portion of the power module 122 may rest when the power module 122 is in the cavity. By allowing a portion of the power module 122 to contact and/or rest on the load bearing features, some of the weight of the power module 122 can be transferred to the frame 300 via the walls of the cavity 304, rather than through the anchor structure (to which the power module 122 is otherwise mechanically and electrically coupled, as described herein).

The body 301 also defines a wing channel 306. The wing channel 306 is a channel that receives a portion of a wing structure 104. The wing channel 306 may be positioned over the anchor support member 302 to allow the wing structure 104 access to the anchor structure (which may be mounted on the anchor support member 302) to mechanically and electrically couple to the anchor structure, as described herein.

FIGS. 4A-4D depict the UAV 100 with the power module 122 and the wing structure 104 removed from the fuselage 102. With the wing structure 104 and the power module 122 removed, an anchor structure 400 can be seen attached to the frame 300 of the UAV 100. The anchor structure 400 may be a load-bearing component of an integrated coupling and control unit 401, described in greater detail herein.

As noted above, the wing structure 104 and the power module 122 are releasably coupled to the UAV 100 via the anchor structure 400. In particular, and as shown in greater detail herein, the anchor structure includes wing retention structures and power module retention structures. The wing structure 104 and the power module 122 include complementary retention structures that engage with the wing and power module retention structures and form a load bearing connection between the anchor structure and both the wing structure 104 and the power module 122.

The power module 122 may be configured to assist in maintaining the wing structure 104 in engagement with the anchor structure 400. For example, as shown in FIGS. 4A-4D, a process of releasably securing the wing structure 104 and the power module 122 to the fuselage 102 may include first attaching the wing structure 104 to the UAV 100 by engaging retention structures of the wing structure 104 (e.g., a mounting bracket, as described herein) to the anchor structure 400. As shown by the dotted lines in FIGS. 4A-4C, this may include sliding the wing structure 104 aft, or towards the tail of the UAV 100, which may cause the retention structures of the wing structure 104 to slidably engage with wing retention structures on the anchor structure 400. The coupling between the retention structures of the wing structure 104 and the anchor structure 400 may represent the exclusive lift-transferring mechanical connection between the wing structure 104 and the fuselage. More particularly, the fuselage 102 and the wing structure 104 may not have any other engaging features that provide sufficient strength to hold the wing structure 104 to the fuselage 102 to enable sustained flight. Because it may be the exclusive (and sufficient) lift-transferring connection, attachment of the wing structure 104 to the fuselage 102 is ultimately extremely simple and efficient, as only one connection action is required in order to mechanically (and electrically and optionally fluidically) connect the wing structure 104 to the fuselage 102.

Subsequent to attaching the wing structure 104 to the UAV 100, the power module 122 may be inserted into the cavity 304 in such a way that retention structures on the power module 122 engage with power module retention structures on the anchor structure 400. The weight of the power module 122 may be transferred to the UAV 100 via the anchor structure 400 and optionally additional load bearing structures or interfaces between the power module 122 and the frame 300 of the UAV 100.

The power module 122 may be configured so that when it is positioned in the cavity 304 and engaged with the anchor structure 400, the power module 122 prevents the wing structure 104 from disengaging from the anchor structure 400. For example, a portion of the power module 122 may be positioned in a removal path of the wing structure 104, thereby preventing the wing structure 104 from moving in a removal direction (e.g., forward, or towards the nose of the UAV) and becoming disengaged or decoupled from the anchor structure 400. In some cases, as described in greater detail below, an interfacing side 402 of the power module 122 may be positioned adjacent a corresponding interfacing side 404 of the wing structure 104 and may impart a force (in the aft direction, or towards the tail of the UAV) to the corresponding interfacing side 404 of the wing structure. The force imparted on the wing structure 104 by the interfacing side 402 may bias the wing structure 104 in the aft direction, or otherwise prevent disengagement of the retention structures of the wing structure 104 and the anchor structure 400.

The power module 122 may include a locking mechanism that is configured to securely retain the power module 122 to the fuselage. The locking mechanism may include any suitable mechanism that can retain the power module 122 in place during flight. For example, latches, cams, pins, detents, clips, spring-loaded mechanisms, or the like. Several example locking mechanisms are described in greater detail herein with respect to FIGS. 6A-7C and 8A-9E. In some cases, the power module 122 includes a handle 406 that is movable between an open position (shown in FIGS. 4A-4C) and a locked or flight position (shown in FIG. 1A).

The handle 406 may be attached to or may include a portion of the locking mechanism. When the handle 406 is rotated, it may cause the locking mechanism to engage to lock the power module 122 to the UAV 100. For example, when the handle 406 is in an open position, the locking mechanism may be disengaged and the power module 122 may be removed or inserted into the cavity 304. As shown, the open position of the handle corresponds to the handle 406 being in a convenient position to allow the power module 122 to be lifted into or out of the cavity 304. When the handle 406 is in the closed or flight position (as shown in FIG. 1A), the locking mechanism is engaged or locked, thereby securing the power module 122 to the UAV 100.

As described above, the process of installing and/or removing the wing structure 104 and the power module 122 to the fuselage 102 is an efficient and simple process, and requires few steps. For example, assembling these components may include sliding the wing structure 104 onto the anchor structure 400, inserting the power module 122 into the cavity 304, and engaging a locking mechanism to lock the power module 122 and/or the wing structure 104 to the UAV 100. The locking mechanism thus provides sufficient mechanical security to both the power module 122 and the wing structure 104 to secure these components to the fuselage 102 during flight, while also allowing fast and efficient attachment and removal of the components.

In addition to allowing quick and efficient attachment and removal, the UAV 100 is configured so that the mechanical attachment and removal of the wing structure 104 and the power module 122 also causes electrical connectors that are coupled to the anchor structure 400, the power module 122, and the wing structure 104 to positively engage with one another, thereby forming a path through which electrical signals may be passed between the wing structure 104, power module 122, and circuitry and other components that are coupled to the anchor structure 400. Such signals may include digital and/or analog communication signals as well as electrical power to provide energy to circuitry, servos, motors, or any other electrical component of the UAV 100. The electrical connections between the anchor structure 400 (or more particularly to electrical components that are coupled to the anchor structure) and the power module 122 and wing structure 104 may be created as a direct result of the mechanical attachment of the power module 122 and the wing structure 104 to the anchor structure 400, thus obviating the need to take additional steps to electrically connect components in the wing structure 104 and/or in the power module 122 to the UAV 100 (such as separately electrically connecting cables or wires between such components).

Figure 4B:
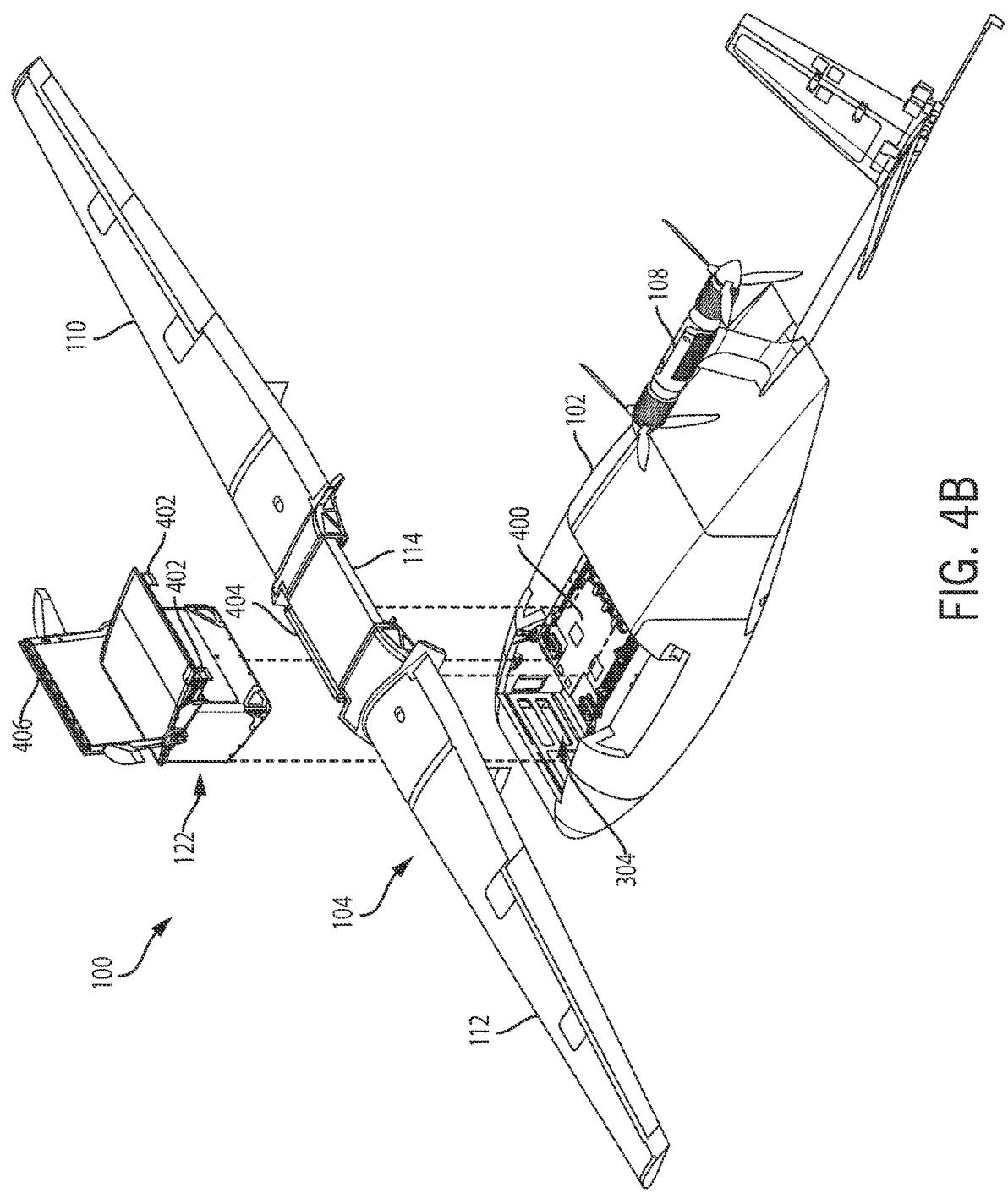
Figure 4C:
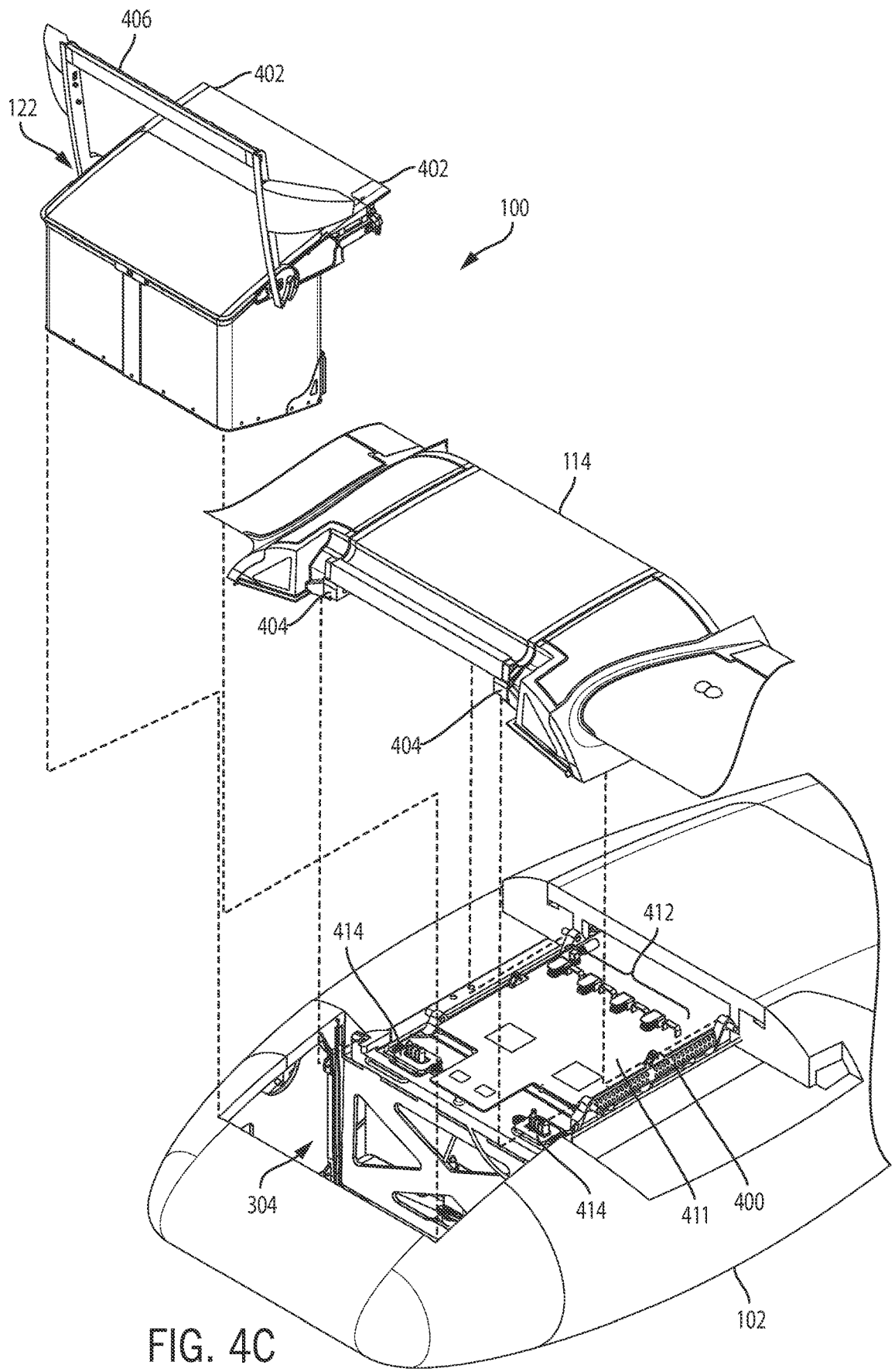
Figure 4D:
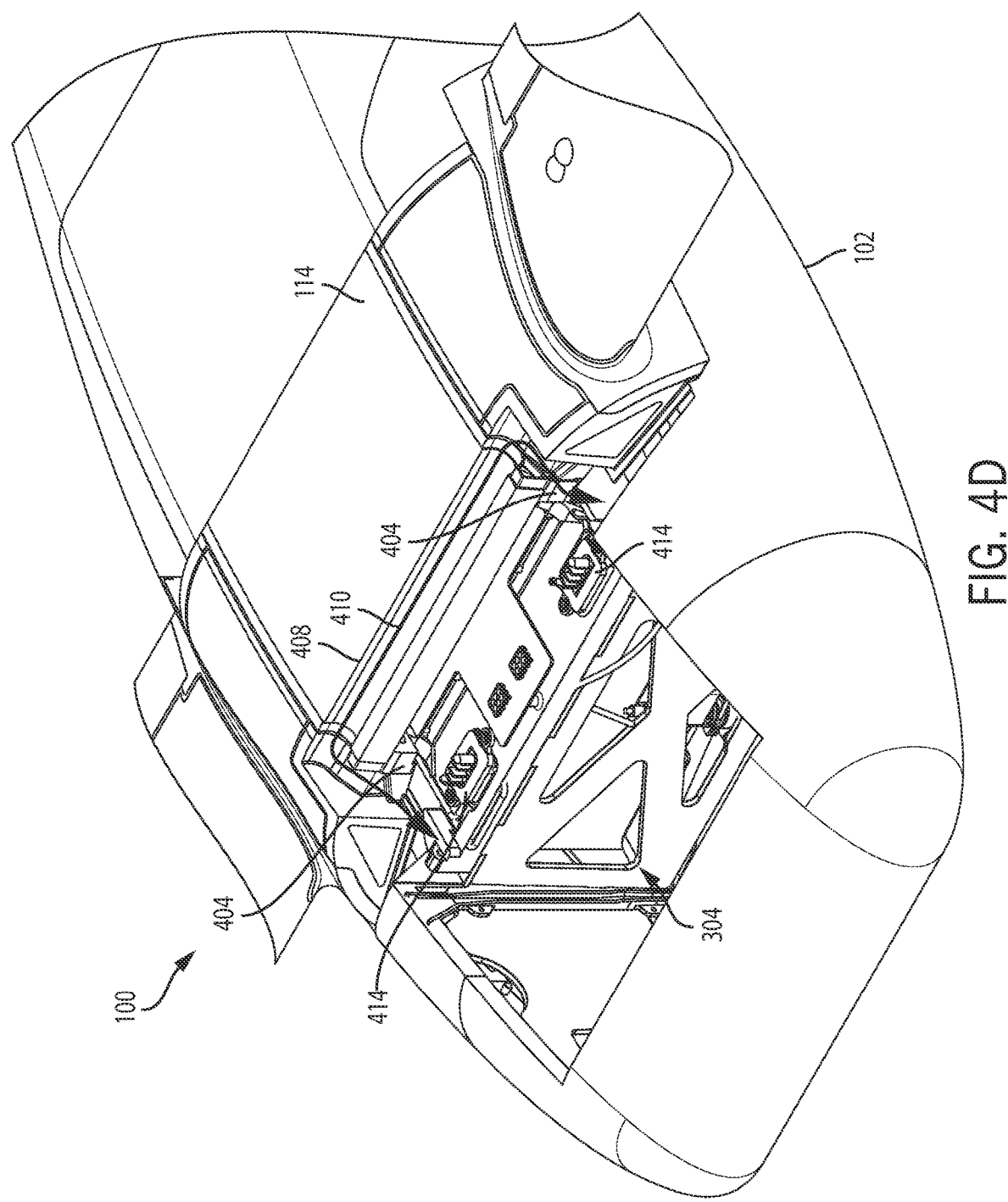

FIGS. 4C and 4D illustrate additional details of an example configuration of electrical connectors on the anchor structure 400. For example, wing electrical connectors 412 may be coupled to the anchor structure 400, and may be configured to mechanically mate and thus electrically couple to corresponding electrical connectors on the wing structure 104. The wing electrical connectors 412 and the corresponding electrical connectors on the wing structure 104 may be positioned relative to the mechanical retention structures so that when the wing structure 104 is being mechanically engaged with the anchor structure 400, the wing electrical connectors 412 are aligned with the corresponding electrical connectors on the wing structure 104. Accordingly, the mechanical attachment of the wing structure 104 to the anchor structure 400 results in a positive mate between the electrical connectors, thus forming both a mechanical and an electrical coupling to the wing structure 104. Proper alignment between the electrical connectors when the wing structure 104 is being mechanically engaged with the anchor structure 400 may be ensured by having the electrical connectors in a fixed positional relationship with respect to the mechanical retention structures, as shown and described herein. In particular, because each of the electrical connectors on the anchor structure 400 is in a fixed positional relationship with respect to the retention structures (e.g., they are not free to move substantially relative to one another), and because the corresponding the connectors and retention structures on the wing structure 104 are similarly fixed, engagement of the mechanical retention structures may cause the electrical engagement of the electrical connectors.

The anchor structure 400 may also include (or have coupled thereto) power module electrical connectors 414 that are configured to electrically mate with corresponding electrical connectors on the power module 122. The power module electrical connectors 414 may also be in a fixed positional relationship with respect to mechanical retention structures for the power module 122 and the anchor structure 400, thus allowing a positive electrical coupling between the power module 122 and the components attached to the anchor structure 400 as a result of a mechanical coupling between the components. The power module electrical connectors 414 may be positioned on the anchor structure 400 so that they are exposed when the wing structure 104 is coupled to the fuselage, which allows the power module 122 to couple with them after the wing structure 104 has been attached. The power module electrical connectors 414 may be configured to transfer electrical power from the power module 122 (e.g., from batteries, fuel cells, capacitors, or other energy storage components) to electrical components of the anchor structure 400. Such power may be used to provide energy to the propulsion system of the UAV 100 (e.g., electric motors), to avionics (e.g., processors, GPS systems, radios, etc.), flight control hardware (e.g., servos and/or other motors for moving flight control surfaces), and the like. The power module electrical connectors 414 may also be configured to transfer electrical signals between the power module 122 and electrical components coupled to the anchor structure 400. Such electrical signals may be intended for communication between components rather than to provide motive power to the propulsion motors or flight control components. In some cases, there may be separate electrical connectors for power and for communications, and both types of connectors may be physically configured to facilitate engagement in the manner described above.

As noted above and described herein, the electrical connectors for the power module and the wing structure may not require direct manual manipulation in order to form the electrical connections. Moreover, the connectors may not be visible or accessible by a user's fingers once the wing structure 104 and the power module 122 begin to be coupled to the anchor structure 400. Accordingly, the physical positioning of the connectors may be specifically configured to facilitate positive mating despite the lack of visibility or physical access by a user. More particularly, because each of the power module electrical connectors on the anchor structure 400 is in a fixed positional relationship with respect to the power module retention structures (e.g., they are not free to move substantially relative to one another), and because the corresponding the connectors and retention structures on the power module 122 are similarly fixed, engagement of the mechanical retention structures may cause the electrical engagement of the electrical connectors.

While the wing electrical connectors 412 and the power module electrical connectors 414 are described as being in a fixed positional relationship with respect to mechanical retention structures, the wing and power module electrical connectors 412, 414 may be configured to have some float so that small-scale misalignments between the wing and power module electrical connectors 412, 414 and corresponding connectors can be tolerated. The degree of float may be configured so that when the mechanical retention structures are correctly engaged, the electrical connectors cannot become misaligned significantly enough to damage the electrical connectors or otherwise not correctly engage each other. Thus, the float may be primarily for accommodating small misalignments due to component wear, manufacturing tolerances, or the like, and may not be significant enough to allow the electrical connectors to improperly couple if the mechanical retention structures are aligned. Further, each electrical connector may be configured to float independently of other electrical connectors, thus being more accommodating of slight misalignments between the electrical connectors. It will be understood that the floating configuration of the electrical connectors described herein is not inconsistent with the otherwise fixed positional relationship between the electrical connectors and the mechanical retention structures.

While the instant application refers in many cases to electrical connectors, other types of connectors may be used instead of or in addition to electrical connectors, such as optical connectors, fluidic connections (e.g., to deliver liquid or gaseous fuel to a propulsion system), or the like. For example, if a UAV includes an internal combustion engine, the power module may include fuel tanks that can be fluidly coupled to the UAV via releasable fluidic connections between the power module and the UAV. The releasable fluidic connections (as well as any other types of connectors) may operate in substantially the same way as the connectors described herein.

As noted above, the power module 122 may include a handle 406. As shown in FIG. 4D, the wing structure 104 may include or define a channel 408 on a top side of the wing structure 104 that is configured to receive the handle when the handle is in the locked or "flight" position. The channel 408 and the handle 406 may be configured so that when the handle 406 is in the channel 408, an exposed portion of the handle 406 (e.g., a top surface of the handle 406) is substantially flush with adjacent portions of the fuselage 102 and/or the wing structure 104 (e.g., the top surface of the handle and an adjacent surface of the fuselage 102 and/or the wing structure 104 may define a substantially continuous exterior surface). In this way, undesirable aerodynamic drag on the UAV 100 from the handle 406 may be avoided or minimized during flight.

The channel 408 may also be configured to divert water or other liquids or debris generally away from the anchor structure 400 (and/or away from certain components that are coupled to the anchor structure 400, such as circuit boards, processors, electrical connectors, etc.). An example water flow path defined by the channel 408 is shown by path 410 in FIG. 4D. Water and other debris may be encountered by the UAV 100 during flight due to precipitation, condensation, or the like.

Figure 5:
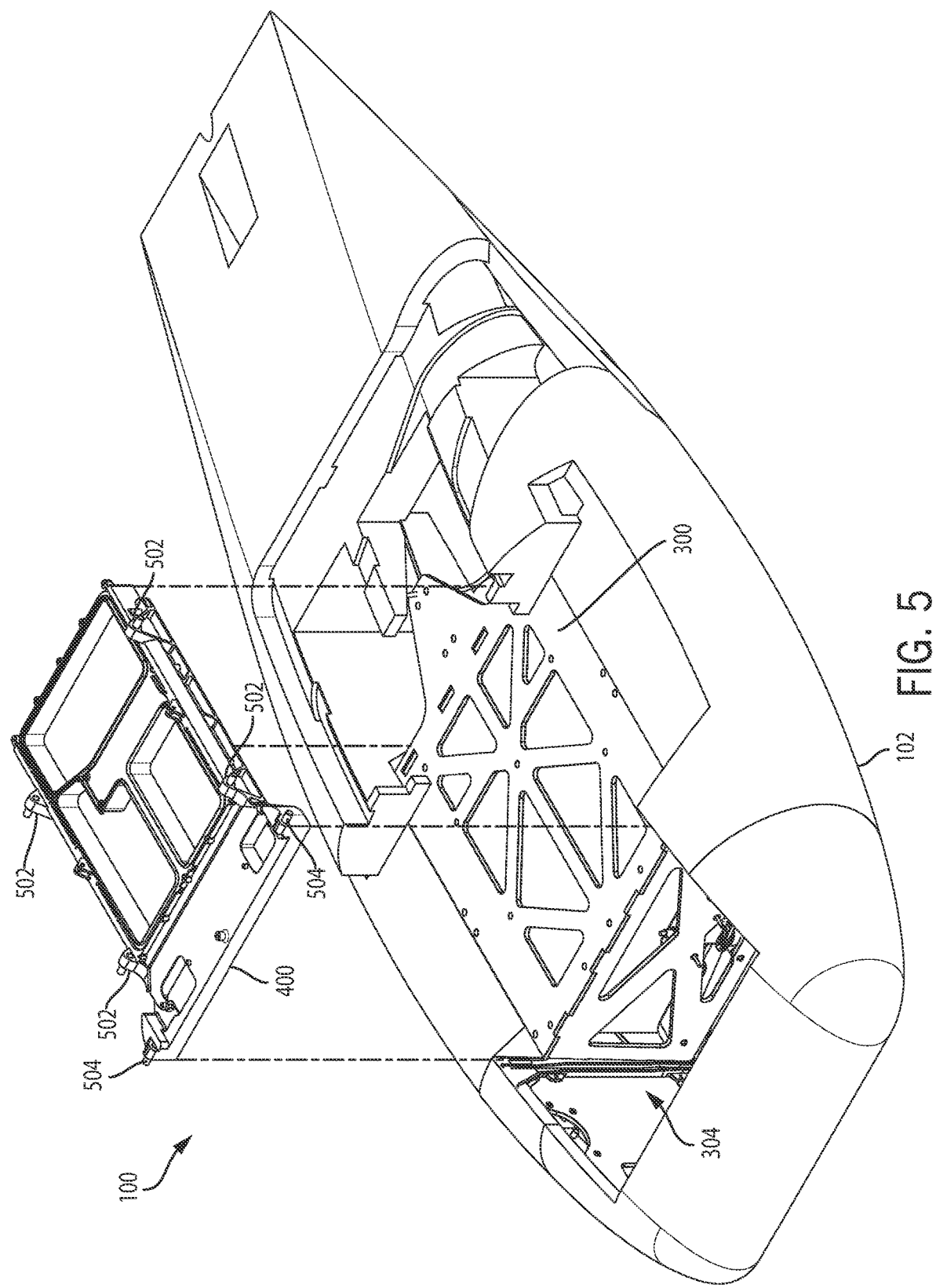
FIG. 5 depicts an exploded view of a portion of the UAV of FIGS. 1A-1B, showing an anchor structure removed from a frame of the UAV.

FIG. 5 shows the anchor structure 400 removed from the frame 300, with electrical components (e.g., circuit boards, electrical connectors, processors, etc.) removed from the anchor structure 400. FIG. 5 shows examples of the wing and power module retention structures. In particular, in the example shown in FIG. 5, the anchor structure 400 includes wing retention structures 502 and power module retention structures 504 that are or include retention pins (or any other suitable retention protrusion). The retention pins (or protrusions) may be configured to slidably or otherwise mechanically engage with corresponding retention structures on the wing structure 104 and the power module 122. In some cases, the retention structures may be swapped so that the retention structures 502 and/or 504 are slots, guides, channels, or the like, and the pins (or tabs, guides, protrusions, or other complementary mating structures) are coupled to or otherwise integrated with the wing structure 104 and/or the power module 122. Other retention structures are also contemplated, including ball bearing guides, latches, detents, spring-loaded connectors, clips, or the like.

The retention structures 502, 504 may be formed or coupled to the anchor structure in any suitable manner. For example, in some cases the retention structures 502, 504 (including any pins, protrusions, tabs, fins, or the like) are machined or otherwise formed from a single piece of metal (e.g., forming a monolithic anchor structure 400). Where the retention structures include protrusions (such as the pins shown in FIG. 5), the protrusions may be separate components that are coupled to a base of the anchor structure 400. In such cases, the protrusions or pins may be configured as sacrificial components that are designed to break under a certain load or stress. For example, the protrusions may be configured to be the first point of failure in the event of a crash or other potentially damaging impact or force being applied to the UAV 100. Thus, in the event of a crash or other potentially damaging impact, the wing structure 104 and/or the power module 122 may break the protrusions, resulting in the decoupling of the wing structure 104 and/or the power module 122 from the anchor structure 400. This may help prevent other damage to the anchor structure 400 and/or the UAV 100 that may be more difficult or expensive to repair. The protrusions may be replaceable to facilitate quick and efficient repair of a UAV 100 with damaged or broken protrusions. For example, the protrusions may be threaded, interference fit, or otherwise secured using removable fastening techniques (or fasteners) to allow for easy replacement separate from the larger base portion of the anchor structure 400. As noted, the protrusions of the retention structures are shown as retention pins, though other types of protrusions may be used instead or in addition to pins, such as fins, tabs, rounded bumps, etc. Moreover, while the retention pins are shown as cylindrical pins, other shapes are also possible (e.g., oblong pins, square pins, rectangular pins, etc.).

Figure 6A:
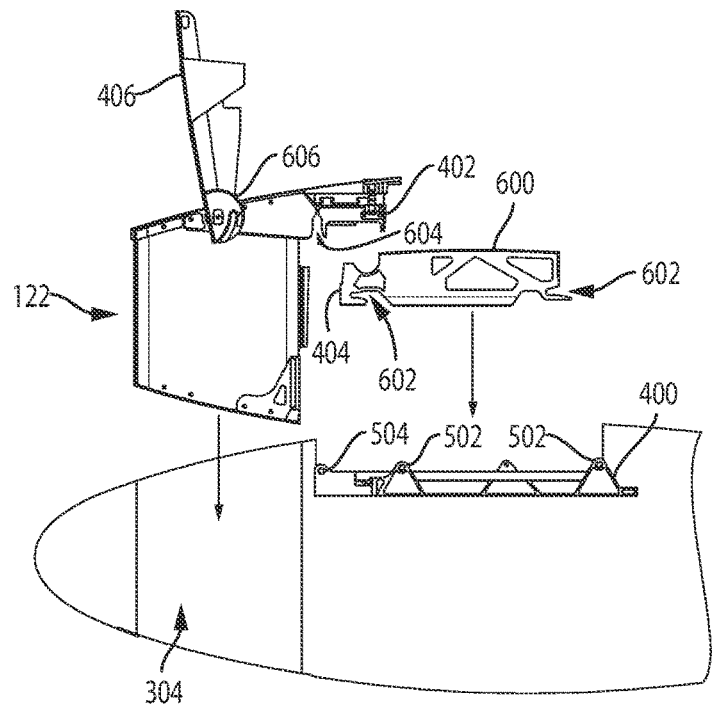
FIGS. 6A-6C depict a portion of the UAV of FIGS. 1A-1B at various stages of attaching the wing structure and power module to the fuselage.
Figure 6B:
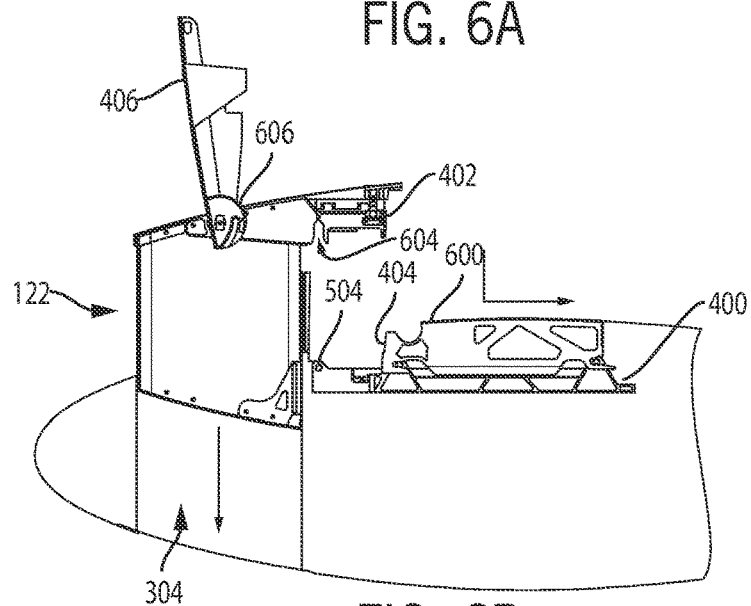
Figure 6C:
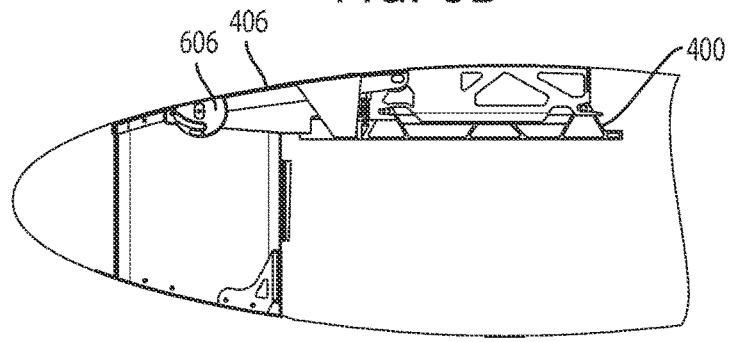

FIGS. 6A-6C depict a portion of the UAV 100 at various stages of attaching the wing structure 104 and the power module 122 to the fuselage 102. Some components of the UAV 100 are omitted in order to avoid obscuring certain aspects of the UAV 100. FIG. 6A shows the UAV 100 at a state prior to the wing structure 104 and the power module 122 being coupled to the fuselage 102. A mounting bracket 600 (which may be part of the wing structure 104, which is largely omitted from FIGS. 6A-6C for clarity) is positioned above the anchor structure 400. The mounting bracket 600 (referred to herein as a bracket) may include retention structures 602 that are configured to engage the retention structures 502 on the anchor structure 400. FIGS. 6A-6C show the complementary retention structures 602 as retention slots, though this is merely one example retention structure that may be used for the wing structure 104. Moreover, the retention structures 602 are shown as being located on a bracket 600 (of which there may be multiple for a given wing structure), though in other cases the retention structures 602 may be formed or otherwise incorporated with other components or structures of the wing structure 104. Further, other bracket configurations other than that shown in FIGS. 6A-6C may be used.

As shown in FIGS. 6A-6B, the wing structure 104 may be releasably coupled to the anchor structure 400 by engaging the retention structures 602 with the retention structures 502. As shown in the instant figures, the retention structures are engaged by translating the wing structure 104 in an aft direction (e.g., along an installation path) to cause the pins and slots to slidably engage one another. In other examples, the installation path may be different than that shown, and it may depend at least in part on the type, shape, and/or configuration of the retention structures of the anchor structure 400 and the wing structure 104. For example, the retention structures may be engaged by translating the wing structure 104 downwards (relative to the orientation shown in FIGS. 6A-6C), or diagonally, or along any other path that results in engagement of the retention structures.

After the wing structure 104 has been releasably coupled to the anchor structure 400 via the wing retention structures 502, the power module 122 may be inserted into the cavity 304 and releasably coupled to the anchor structure 400 via the power module retention structure 504. The power module 122 may include a complementary retention structure 604 that slidably or otherwise engages the power module retention structure 504. The mass of the power module 122 may be transferred to the anchor structure 400 (and thus the UAV 100 as a whole) via the complementary retention structures 504, 604. In some cases, as noted above, the power module 122 may also contact a portion of the frame 300 of the UAV 100, thus transferring at least a portion of the mass load of the power module 122 to the UAV 100 via the frame 300.

As shown in FIGS. 6B-6C, when the power module 122 is within the cavity 304, the interfacing side 402 of the power module 122 is in contact with (or otherwise positioned adjacent to) the corresponding interfacing side 404 of the wing structure 104. Because the interfacing side 402 of the power module 122 is blocking the wing structure 104 from moving in the foreword direction (left, as shown in FIGS. 6A-6C), the wing structure 104 cannot be disengaged from the anchor structure 400 along the designed removal path when the power module 122 is installed (e.g., the power module 122 prevents the retention structures of the wing and anchor structures from disengaging one another).

As represented by FIGS. 6B-6C, after the power module 122 is inserted into the cavity 304 and engaged with the anchor structure 400, the power module 122 (and optionally the wing structure 104) may be locked to the fuselage 102. FIGS. 6A-6C show an example embodiment in which a locking mechanism 606 is integrated with and/or actuated by the handle 406 of the power module 122. In particular, as discussed in greater detail with respect to FIGS. 7A-7C, the locking mechanism 606 may be or may include a sliding cam mechanism that secures the power module 122 to the UAV 100 when the handle 406 is rotated or moved into the flight or locked position. The locking mechanism 606 may provide sufficient force to maintain the handle 406 in the flight or locked position during flight, and also to securely hold the power module 122 (and the wing structure 104) to the anchor structure 400. The locking mechanism 606, in conjunction with the design of the retention structures on the wing structure 104, the power module 122, and the anchor structure 400, may also provide sufficient locking and/or biasing forces to prevent or reduce vibration, rattling, or other undesirable movement between the wing structure, power module, and anchor structure.

Figure 7A:
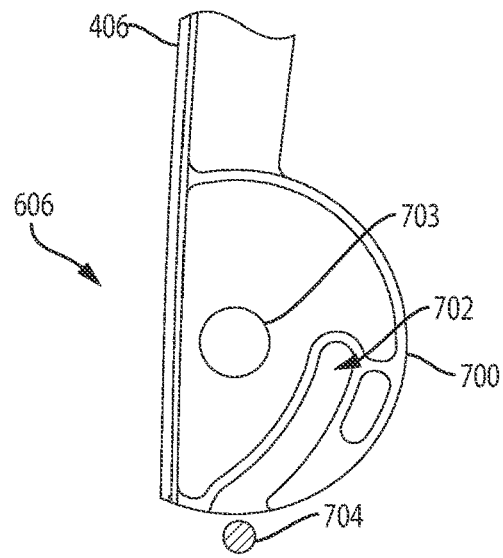
FIGS. 7A-7C depict a locking mechanism of a power module in various stages of engagement.
Figure 7B:
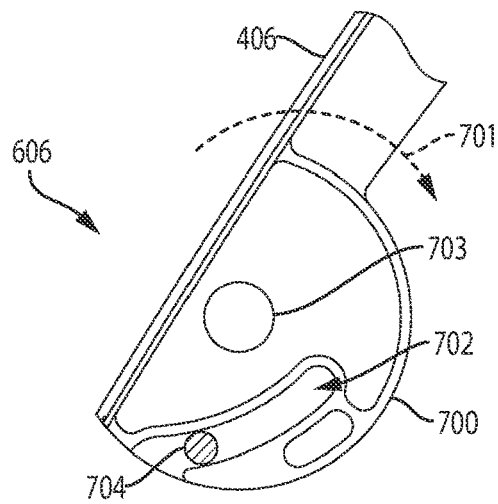
Figure 7C:
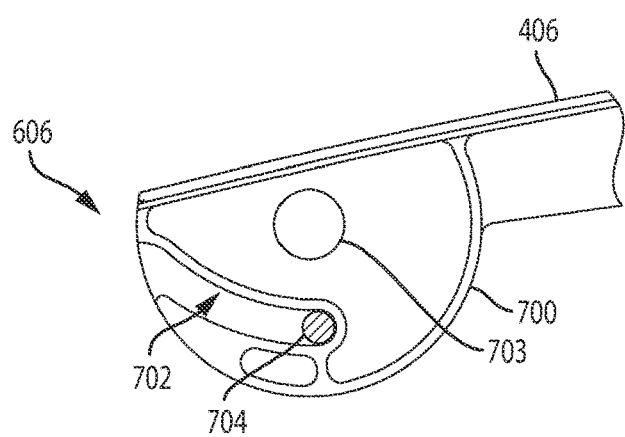

FIGS. 7A-7C depict the locking mechanism 606 that secures the power module 122 (and by extension the wing structure 104) to the UAV 100, showing the locking mechanism 606 at different states of engagement. While the locking mechanisms 606 is one particular type of locking mechanism, others are also possible and contemplated. For example, FIGS. 8A-9E illustrate another example locking mechanism that may be used instead of or in addition to the locking mechanism 606.

The locking mechanism 606 includes a body 700 that includes a channel 702. The channel 702 may be a machined or forged feature of the body 700, or it may be formed in any other suitable way. The body 700 may be coupled to the handle 406 such that rotation of the handle 406 results in rotation of the body 700 about a pivot 703. The pivot 703 may be coupled to the power module 122.

FIG. 7A shows the locking mechanism 606 prior to engagement with a locking pin 704. The locking pin 704 may be attached to or otherwise integrated with the UAV 100, such as via the frame 300. As the power module 122 is inserted into the cavity 304 while the handle 406 is in an open configuration (as represented by the configurations in FIGS. 6B and 7A), the locking pin 704 enters the channel 702. As the handle 406 (or any other member or component that may be actuated by a user to rotate the body 700) is rotated about the pivot 703, as represented by arrow 701 in FIG. 7B, the pin 704 slides along the channel 702. As it slides, the pin 704 may contact one or both sides of the channel 702, which may apply a force that draws the power module 122 downward (e.g., into the cavity 304 and into a flight-ready position). Further, the channel 702 may be configured as a sliding cam so that as the body 700 is rotated about the pivot 703, a force between the pin 704 and one or more walls of the channel 702 increases. This force may prevent and/or inhibit unintended counter-rotation of the body 700 during flight, thereby retaining the handle 406 in the flight position and securely coupling the power module 122 to the fuselage 102.

FIG. 7C shows the locking mechanism 606 in a fully locked configuration, corresponding to the handle 406 (or other actuating member) in a flight position. In some cases, the cam profile defined by the channel 702 varies along its length so that the force produced by the cam is somewhat reduced when the locking mechanism 606 is in the fully locked configuration. This may act as a tactile detent that may be felt by a user to indicate that the locking mechanism 606 is fully engaged or locked, and may also bias the locking mechanism 606 in the locked configuration.

Reversing the process shown and described with reference to FIGS. 7A-7C unlocks the locking mechanism 606, allowing the power module 122 to be removed from the UAV 100. In some cases, the interaction between the pin 704 and the channel 702 while the locking mechanism 606 is being unlocked applies a force on the power module 122 that lifts the power module 122 out of the UAV 100 (e.g., an upward force), or that otherwise tends to decouple the power module 122 from the UAV 100. The upwards motion of the power module 122 (or a different decoupling motion caused by unlocking a locking mechanism) may result in the decoupling of one or more electrical connections between the power module 122 and the integrated coupling and control unit 401. For example, as the power module 122 is raised upwards by the pin 704 and channel 702, electrical connectors on the power module 122 (e.g., a power module electrical connector 1004, FIG. 10B) may become mechanically and/or electrically decoupled from the power module electrical connectors 414 of the anchor structure 400. In this way, the action of moving the handle 406 from a flight position to an open position may unlock the locking mechanism 606, lift the power module 122 at least partially out of engagement with the integrated coupling and control unit 401, and disconnect the electrical connectors of the power module 122 and the integrated coupling and control unit 401.

FIGS. 8A-8J depict portions of a UAV 800 that includes a different mechanism for engaging and maintaining a wing structure and power module to a UAV. In this example, instead of the power module having a handle that actuates a locking mechanism, a different locking mechanism may be used, which may include one or more handles or levers that are part of or coupled to the fuselage of the UAV 800. Additionally, the retention structures on the wing structure, power module, and anchor structure may have a different configuration to accommodate the operation of the different locking mechanism.

Figure 8A:
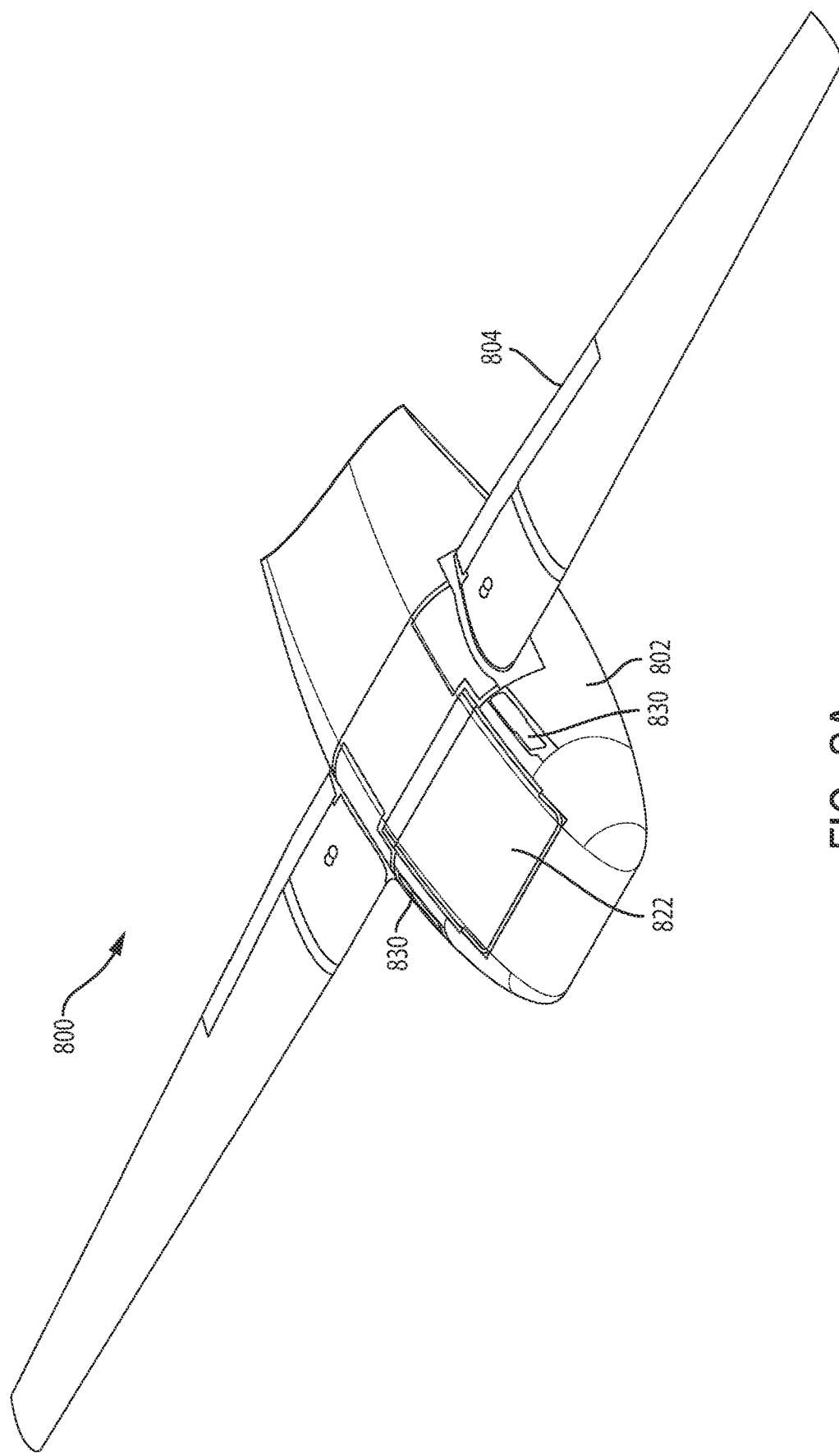
FIGS. 8A-8B depict a portion of a UAV having an alternative mounting arrangement and locking mechanism for the wing structure and power module.

FIG. 8A shows the UAV 800 in a flight mode. The UAV 800 may include a fuselage 802, a wing structure 804, and a power module 822. Apart from the differences described herein, the UAV 800 may be the same as or similar to the UAV 100. Accordingly, details of the UAV 100 that are described above are omitted here for clarity, but will be understood to apply equally and/or by analogy to the UAV 800.

The UAV 800 may also include lock levers 830 that are part of or otherwise coupled to the fuselage 802 and remain on the fuselage 802 when the power module 822 and/or the wing structure 804 are removed. When the UAV 800 is in the flight mode, as represented in FIG. 8A, the lock levers 830 may be substantially flush with surrounding areas of the fuselage 802 to minimize drag produced by the lock levers 830.

Figure 8B:
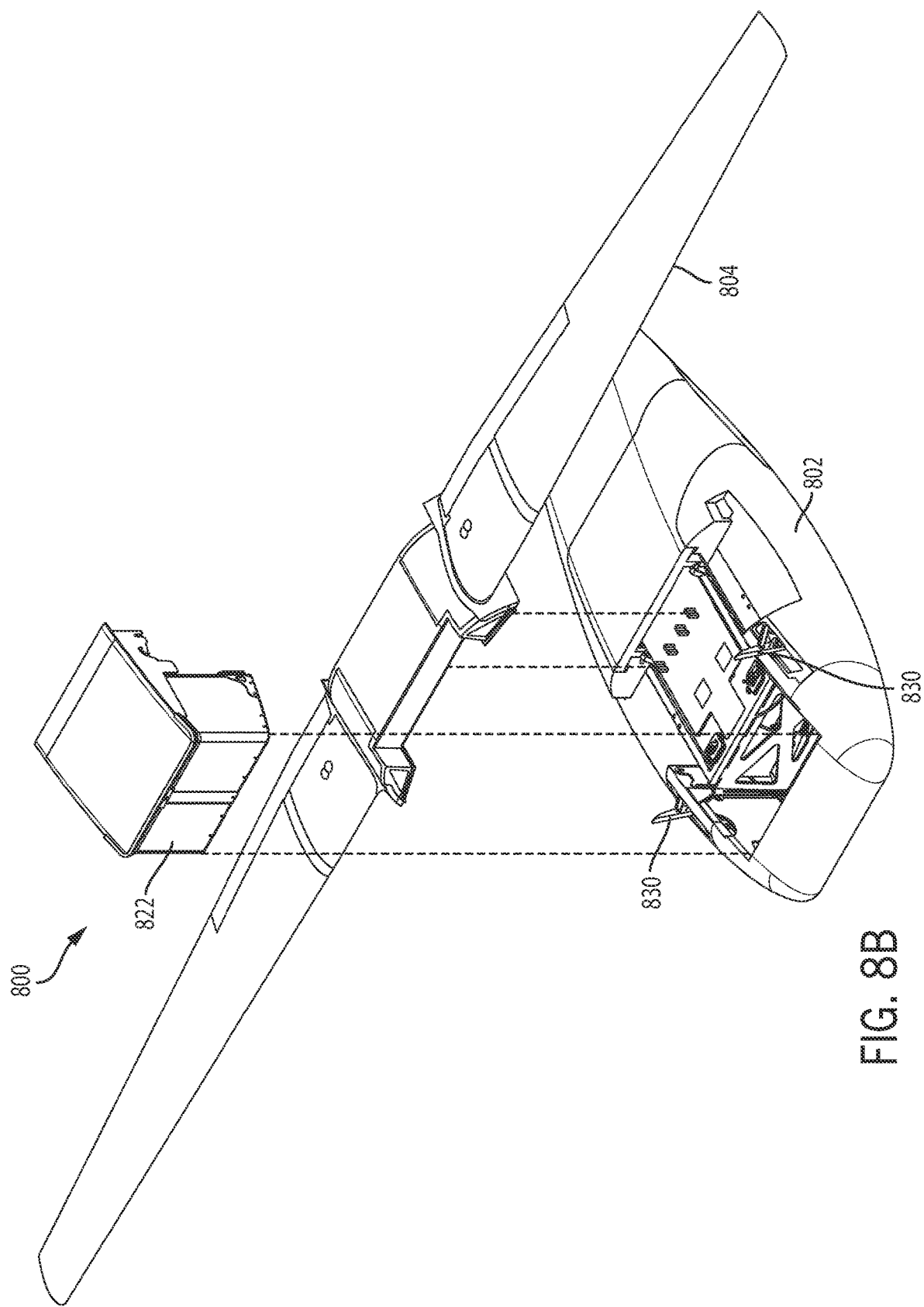

FIG. 8B shows a portion of the UAV 800 in a partially disassembled state in which the power module 822 and the wing structure 804 are removed from the fuselage 802. In order to release or unlock the power module 822 and the wing structure 804 so that they can be removed from the fuselage 802, the lock levers 830 are rotated or otherwise manipulated to cause an internal locking mechanism 818 (FIG. 8C) to release the power module 822 and wing structure 804. Details of the locking mechanism 818 are described herein with respect to FIGS. 8A-9E.

FIGS. 8C-8J depict a portion of the UAV 800 at various stages of attaching the wing structure 804 and the power module 822 to the fuselage 802. Some components of the UAV 800 are omitted in order to avoid obscuring certain aspects of the UAV 800. FIG. 8A shows the UAV 800 at a state prior to the wing structure 804 and the power module 822 (FIGS. 8A-8B) being coupled to the fuselage 802. A mounting bracket 806 (which may be part of the wing structure 804, which is largely omitted from FIGS. 8C-8J for clarity) is positioned above an anchor structure 808. The anchor structure 808 may be similar to the anchor structure 400, except that it may have different mechanisms, retention structures, and other features to form the alternative locking mechanism used by the UAV 800. For example, the anchor structure 808 may include a locking mechanism 818 that includes a locking shaft 817. The locking shaft 817 may be coupled to an arm 816 that allows the locking shaft 817 to rotate, translate, or otherwise move in order to engage the mounting bracket 806 (as well as a portion of the power module 822), thereby retaining the wing structure 804 and the power module 822 to the fuselage 802. The structure and operation of an example embodiment of the locking mechanism 818 are discussed in greater detail herein.

The mounting bracket 806 (also referred to herein as a bracket) may include a first retention structure 812 and a second retention structure 814 that are configured to engage corresponding retention structures (e.g., a third retention structure 813 and a fourth retention structure 815, respectively) on the anchor structure 808. FIGS. 8C-8J show the retention structures 812, 814 as retention slots, though this is merely one example retention structure that may be used for the wing structure 804. Other example retention structures may include channels, recesses, detents, divots, blind or through holes, or the like. The retention structures 812, 814 are shown as being located on a bracket 806 (of which there may be multiple for a given wing structure), though in other cases the retention structures 812, 814 may be formed or otherwise incorporated with other components or structures of the wing structure 804. The corresponding retention structures 813, 815 are shown as pins (e.g., solid cylindrical members), though other types of retention structures may also be used, such as hollow cylinders, protrusions, bumps, non-cylindrical bars, or any other suitable component or feature that engages the retention structures 812, 814 of the mounting bracket 806.

Figure 8C:
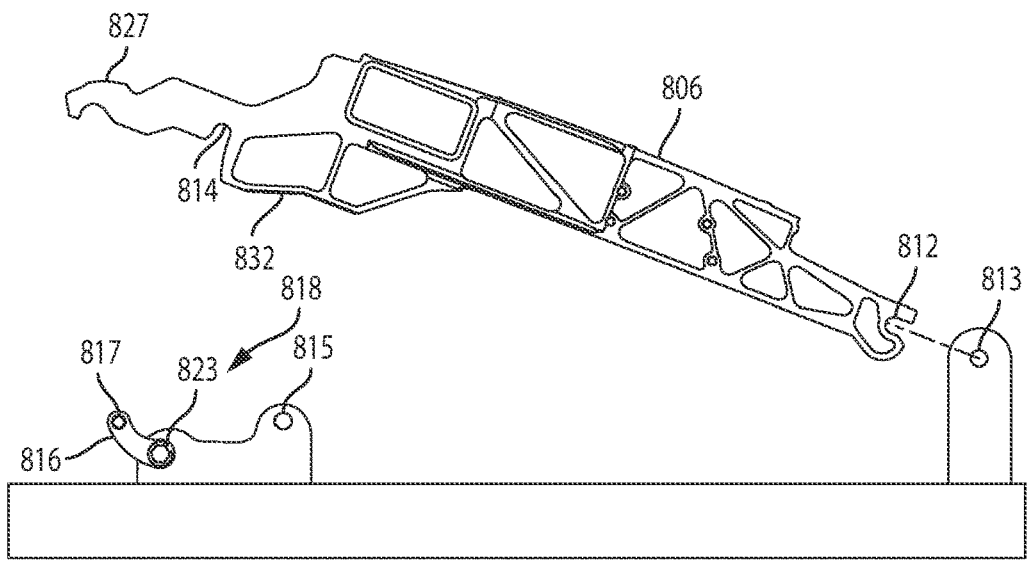
FIGS. 8C-8J depict a portion of the UAV of FIGS. 8A-8B showing aspects of the mounting arrangement and locking mechanism for the wing structure and power module.
Figure 8D:
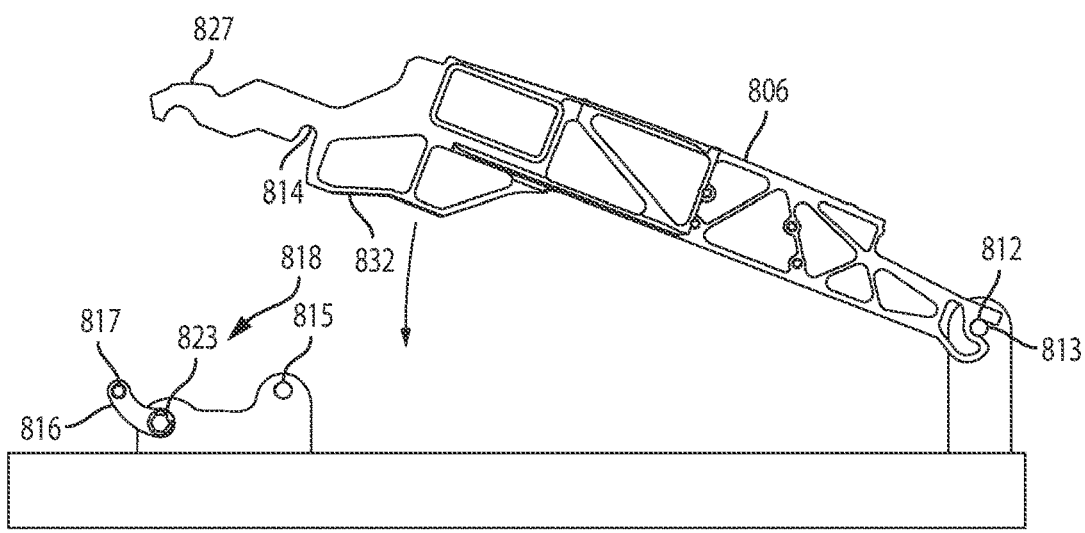

FIG. 8D shows the retention structure at a first stage of an engagement process. In particular, the first retention structure 812 has been engaged with the corresponding third retention structure 813. The first and third retention structures 812, 813 are configured to allow the mounting bracket 806 to rotate after the initial engagement of the retention structures. Accordingly, the mounting bracket 806 may be initially engaged with the anchor structure 808 while the mounting bracket 806 (and thus the wing structure 804) is at an angle relative to the fuselage 802. The wing structure 804 and mounting bracket 806 may then be rotated (e.g., as shown in FIG. 8D) to engage the second retention structure 814 with the fourth retention structure 815. The mounting bracket 806 may also include a support surface 824 that contacts a corresponding support member 823 of the locking mechanism 818 when the mounting bracket 806 is in the engaged position. The act of engaging the mounting bracket 806 to the anchor structure 808 may also result in the alignment and coupling of electrical (or other) connectors between the wing structure 804 and an integrated coupling and control unit, as described herein.

Figure 8E:
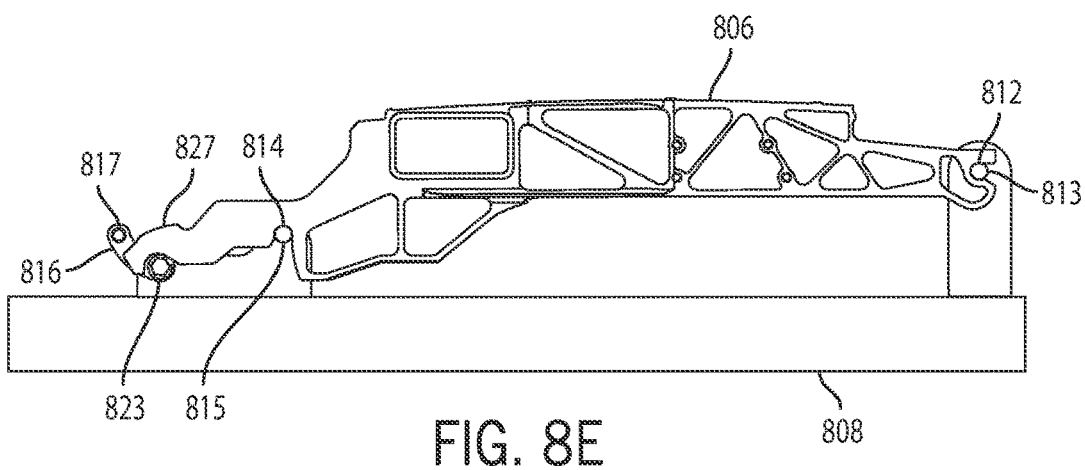

FIG. 8E shows the mounting bracket 806 in an engaged position, which may correspond to the wing structure 804 (to which the mounting bracket 806 is attached) being in an engaged, flight-ready position. As shown in FIG. 8E, the locking mechanism 818 is not in a locked or secured configuration. As such, while the mounting bracket 806 is engaged with the anchor structure 808, the mounting bracket 806 (and thus the wing structure 804) may not be retained to the anchor structure 808. Nevertheless, the configuration of the first and third retention structures 812, 813 and the second and fourth retention structures 814, 815 may constrain the mounting bracket 806 in at least some directions. For example, the second and fourth retention structures 814, 815 may prevent the mounting bracket 806 from translating to the left (based on the orientation in FIG. 8E, and thus may prevent the decoupling of the first retention structure 812 from the third retention structure 813.

The retention structures 812, 813, 814, 815, along with the support surface 824 and the corresponding support member 823 of the locking mechanism 818, may be the primary and in some cases the only load-bearing connections between the wing structure 804 and the fuselage 802.

That is, all or substantially all of the lift produced by the wing structure 804 (as well as any other aerodynamic forces acting on the wing structure 804) may be transferred to the rest of the UAV 800 via the mechanical engagements of the retention structures 812, 813, 814, 815, and the contact between support surface 824 and the corresponding support member 823.

FIGS. 8C-8D illustrate the mounting bracket 806 being correctly aligned with and coupled to the anchor structure 808. During coupling of a wing structure to the fuselage, however, a user may not correctly align the mounting bracket 806 to the anchor structure, or may otherwise attempt to force the wing structure (and thus the mounting bracket 806) downwards before the retention structures 812, 813, 814, 815 are correctly aligned and/or engaged. Accordingly, the mounting bracket 806 and the anchor structure 808 may be configured to prevent damage to the system under such circumstances. For example, the mounting bracket may include a brace 832 that is positioned adjacent the second retention structure 814 and configured to contact the fourth retention structure 815 if the wing structure is translated or pivoted downward before the first retention structure 812 is fully engaged with the third retention structure 813 (e.g., before a pin is received or positioned at a terminal end of a slot or channel). This may produce an abrupt or hard stop to further motion of the wing structure, signaling to the user that the wing structure is not fully engaged and also preventing components on the wing structure and/or the anchor structure from being crushed. In particular, the brace 832 may have a dimension (e.g., a height, as depicted in FIG. 8E) that will prevent components such as wing electrical connectors, processors, circuit elements, circuit boards, or other mechanical and/or electrical components from contacting one another when the bottom surface of the brace 832 is in contact with the fourth retention structure 815. Thus, if a user tries to force a misaligned wing structure 804 downward, the brace 832 may prevent the components from being crushed or damaged.

Figure 8F:
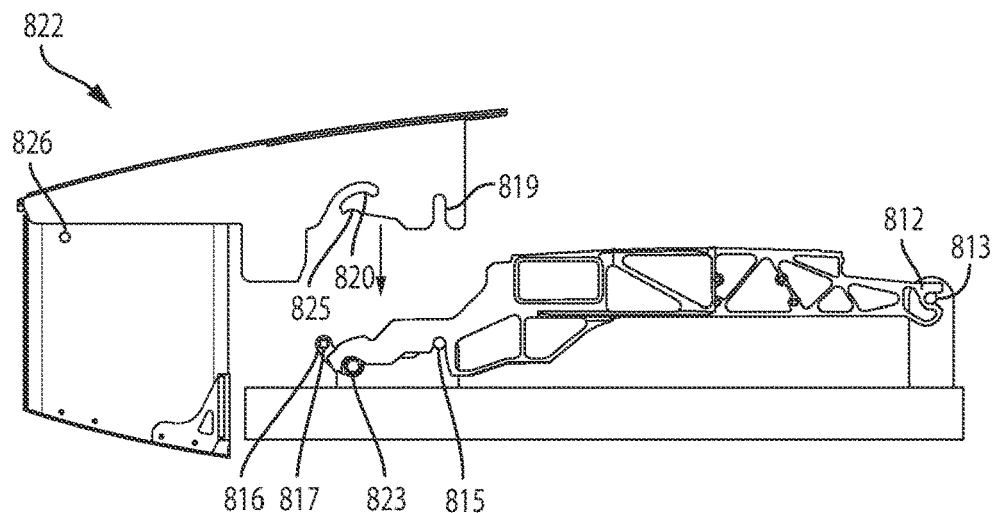
Figure 8G:
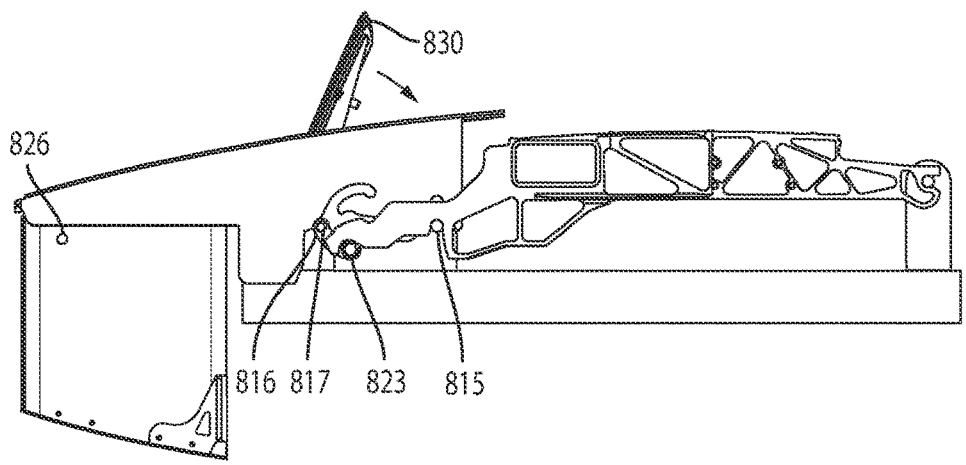
Figure 8H:
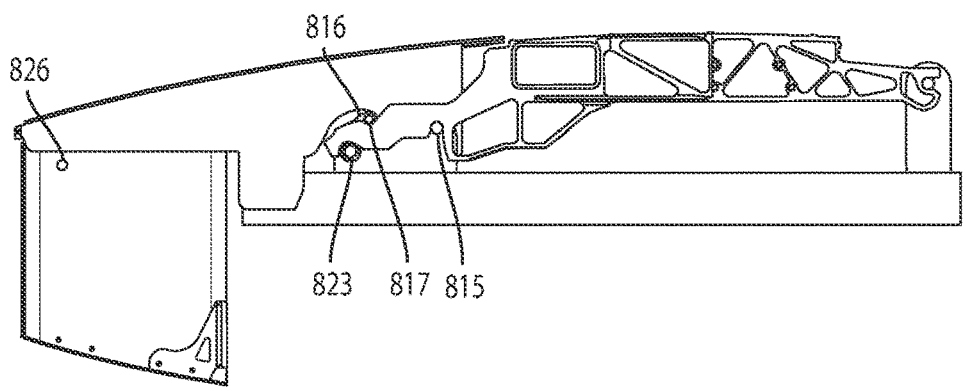

FIG. 8F shows the retention structure engaged with the anchor structure 808, and shows the power module 822 above the anchor structure 808 and aligned for engagement with the anchor structure 808. As shown in FIGS. 8F-8G, the power module 822 may be engaged with the anchor structure 808 by translating the power module 822 downward along a linear path. In other embodiments, the power module 822 may be engaged with the anchor structure 808 in other manners.

The power module 822 may include a fifth retention structure 819 that is configured to engage the fourth retention structure 815, as well as a support surface 825 that is configured to contact the support member 823 of the locking mechanism 818. The power module 822 may also include a sixth retention structure 826, which may engage a corresponding retention structure on the fuselage 802 (e.g., in a cavity such as the cavity 304, FIG. 3). Similar to the engagement of the mounting bracket 806 with the anchor structure 808, the retention structures 819, 815, and 826, along with the support surface 825 and the corresponding support member 823 of the locking mechanism 818, may be the primary and in some cases the only load-bearing connections between the power module 822 and the fuselage 802. That is, all or substantially all of the weight of the power module 822 may be transferred to the rest of the UAV 800 via the mechanical engagements of the retention structures 819, 815, 826, and the contact between support surface 825 and the corresponding support member 823. Further, the retention structures 819, 815, and 826 may be configured to align electrical connectors between the power module 822 and an integrated coupling and control unit, as described herein, thus allowing fast and accurate blind mating of the power module 822 with the UAV 800.

FIG. 8G shows the portion of the UAV 800 after the power module 822 has been initially engaged with the anchor structure 808 and prior to the locking mechanism 818 securing the power module 822 and the mounting bracket 806 to the anchor structure 808. As noted above, the locking mechanism 818 may include a locking shaft 817 that is coupled to an arm 816. The arm 816 may be coupled to the lock levers 830 (FIGS. 8A-8B) such that rotation or actuation of the lock levers 830 results in rotation or movement of the locking shaft 817. More particularly, rotating the lock levers 830 from an unlocked position (as shown in FIG. 8B) to a stowed or flight position (as shown in FIG. 8A) may result in the arm 816 rotating or otherwise moving to cause the locking shaft 817 to engage locking surfaces 827, 820 of the mounting bracket 806 and the power module 822, respectively. The locking shaft 817 may contact and slide along at least a portion of the locking surfaces 827, 820 as the lock levers 830 are rotated, and the locking shaft 817 may remain in contact with the locking surfaces 827, 820 (or a portion thereof) when the locking mechanism 818 is in a locked configuration. In this way, the locking shaft 817 may secure the power module 822 and the wing structure 804 to the fuselage 802. In some cases, the locking shaft 817 does not contact and slide along the entire lengths of the locking surfaces 827, 820 as the locking mechanism 818 is moved from an unlocked position to a locked position. Instead, the locking shaft 817 may remain out of contact with one or both of the locking surfaces 827, 820 until the locking shaft 817 is proximate a locked position, at which point it may contact one or both of the locking surfaces 827, 820 (e.g., in a recess defined by the locking surfaces) in order to secure the power module 822 and the wing structure 804 to the fuselage 802.

The locking mechanism 818 may be configured to be maintained in the locked configuration unless it is intentionally unlocked. For example, the locking surfaces 827, 820 (and the locking mechanism 818 more generally) may be configured to exhibit bistability, such that when the locking mechanism 818 is moved into the locked configuration it is moved into an over-centre state. The bistability may be produced by any suitable technique, including cams (e.g., defined by the shape of the locking surfaces 827, 820, or components within the locking mechanism 818), actuators (e.g., electromechanical actuators), detents, latches, springs, or the like. As shown, the locking surfaces 827, 820 define recessed regions in which the locking shaft 817 may be received. The shape of the recesses may be such that the locking shaft 817 is retained as a result of contacting the portions of the locking surfaces 827, 820 that define the recesses.

Notably, the locking mechanism 818 locks both the power module 822 and the wing structure 804 to the fuselage 802. Accordingly, similar to other UAV configurations described herein, the power module 822 and the wing structure 804 can both be secured to the fuselage 802 with a single process (e.g., rotating or otherwise actuating the lock levers 830).

Figure 8I:
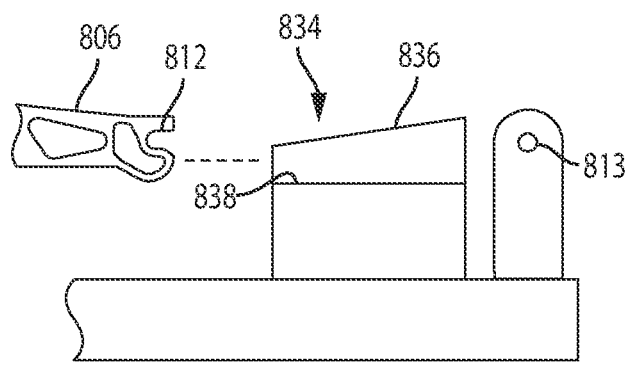
Figure 8J:
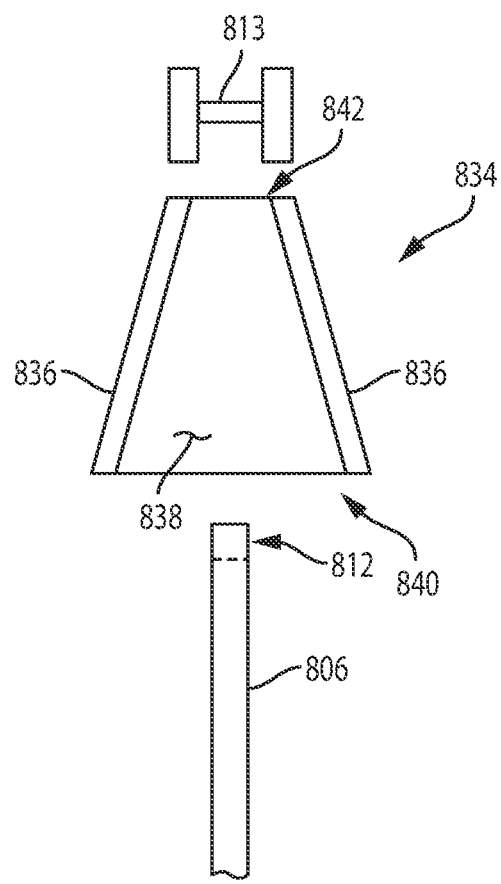

In some cases, guides may be included on a UAV to help align and mate the various retention structures of the wing structure, power module, and anchor structure. FIGS. 8I-8J illustrate a side and top view, respectively, of an example guide 834 that may be configured to guide the first retention structure 812 into engagement with the third retention structure 813 during attachment of the wing structure to the fuselage. The guide 834 may include side walls 836 and a bottom wall 838. The side walls 836 may be angled to define an entry opening 840 that is wider than an exit opening 842 and to guide the bracket 806 (and more particularly the first retention structure 812) into alignment with the third retention structure 813. More particularly, the wider entry opening 840 may provide a larger area on which the bracket 806 may be placed during assembly, while still ensuring that the first and third retention structures will be properly engaged when the bracket 806 is translated towards an engaged orientation (e.g., to the right, as oriented in FIG. 8I). The guide 834 may be formed of or include any suitable material, such as plastic, metal, or the like. In some cases, the guide 834 (or at least the surfaces of the bottom and side walls 838, 836 that contact the bracket 806) is formed of a polymer material that has relatively low friction to allow the bracket 806 to glide along the material without binding or otherwise resisting assembly.

Figure 9A:
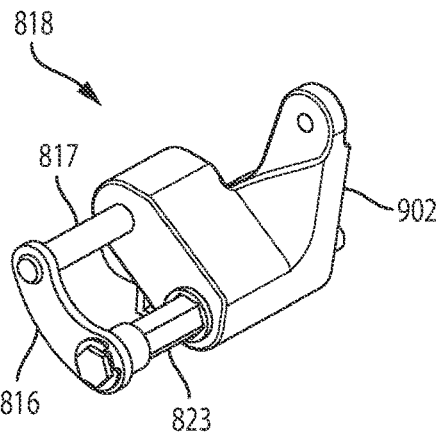
FIGS. 9A-9E depict the locking mechanism of the UAV of FIGS. 8A-8H in various stages of engagement.

FIGS. 9A-9E depict a portion of the locking mechanism 818 that secures the power module 822 and the wing structure 804 to the UAV 800, showing the locking mechanism 818 at different states of engagement. FIG. 9A shows a portion of the locking mechanism 818 that includes the arm 816, the locking shaft 817, and the support member 823, all of which may be coupled to other mechanisms (and ultimately to a lock levers 830) via a linkage member 902 (or by any other suitable mechanism, feature, or component). The lock lever 830 may be configured to rotate the arm 816 about a pivot defined by the support member 823, thereby moving the locking shaft 817 into engagement with the locking surfaces 827, 820 of the mounting bracket 806 and the power module 822, respectively.

The power module 822 and the locking mechanism 818 may be configured so that the process of locking the locking mechanism 818 (e.g., by moving the lock levers 830 from an unlocked position to a stowed or flight position) pulls the power module 822 into a stowed or flight position. For example, when the power module 822 is initially inserted into a fuselage, the locking mechanism, which would be in an unlocked configuration, may prevent the power module 822 from moving to its stowed or flight position. FIG. 8G may illustrate the initial rest position of the power module 822 before the locking mechanism 818 is manipulated to lock the power module 822 in place. As the lock levers 830 are moved into the stowed or flight position, the rotation of the arm 816 may cause the locking shaft 817 to engage the locking surface 820 (or any portion of a channel that is defined in part by the locking surface 820), and the shape of the locking surface 820 may be configured to force or pull the power module 822 into its final stowed or flight position. This configuration may also improve the process of removing the power module 822. In particular, moving the lock levers 830 from the stowed to the unlocked position may cause the locking shaft 817 to push the power module 822 upwards (based on the orientation shown in FIG. 8H), thus forcing the power module 822 away from the fuselage and making it easier to grasp the power module 822 to remove it from the fuselage. In particular, this process may result in the power module 822 moving from the position shown in FIG. 8H to the position shown in FIG. 8G, which may cause a gap to be formed between the power module 822 and the fuselage. This gap may allow a person to easily grasp an edge of the power module 822 and lift the power module 822 out of the fuselage. The partial ejection of the power module 822 may be achieved solely due to the action of the lock levers 830, and without requiring a user or operator to apply additional force on the power module 822.

As noted above with respect to FIGS. 7A-7C, the partial ejection of the power module 822 may also result in the decoupling of one or more electrical connections between the power module 822 and the integrated coupling and control unit of the UAV 800 (which may be the same as or similar to the integrated coupling and control unit 401). For example, as the power module 822 is raised upwards by the locking shaft 817, electrical connectors on the power module 822 (e.g., a power module electrical connector 1012, FIG. 10E) may become mechanically and/or electrically decoupled from the power module electrical connectors coupled to the anchor structure 808. In this way, the action of moving the lock levers 830 from a flight position to an open position may unlock the locking mechanism 818, lift the power module 822 at least partially out of engagement with the anchor structure (e.g., causing the fourth retention structure 815 to slide out of secure engagement with the fifth retention structure 819), and disconnect the electrical connectors of the power module 822 and the integrated coupling and control unit of the UAV 800.

Figure 9B:
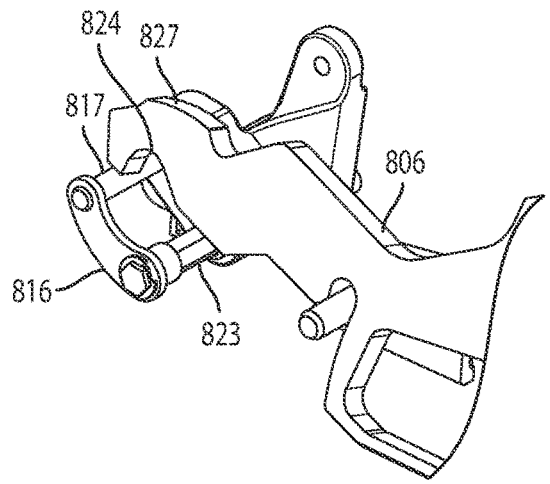
Figure 9C:
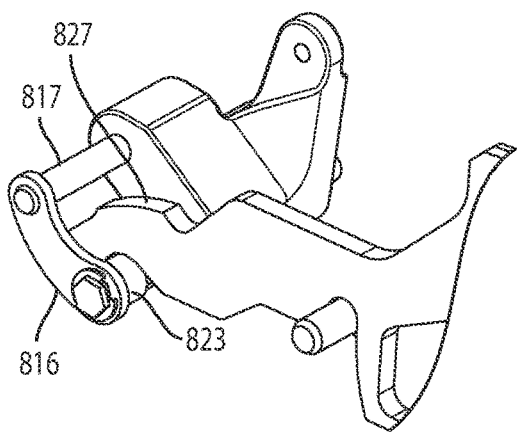

FIG. 9B shows the locking mechanism 818 with the mounting bracket 806 aligned with the locking mechanism 818 and prior to the mounting bracket 806 being placed on the locking mechanism 818. FIG. 9C shows the mounting bracket 806 placed on the locking mechanism 818, with its support surface 824 in contact with or near the support member 823. The placement of the mounting bracket 806 on the locking mechanism 818 as shown in FIG. 9C may result from the engagement process of the mounting bracket 806 illustrated with respect to FIGS. 8C-8J.

Figure 9D:
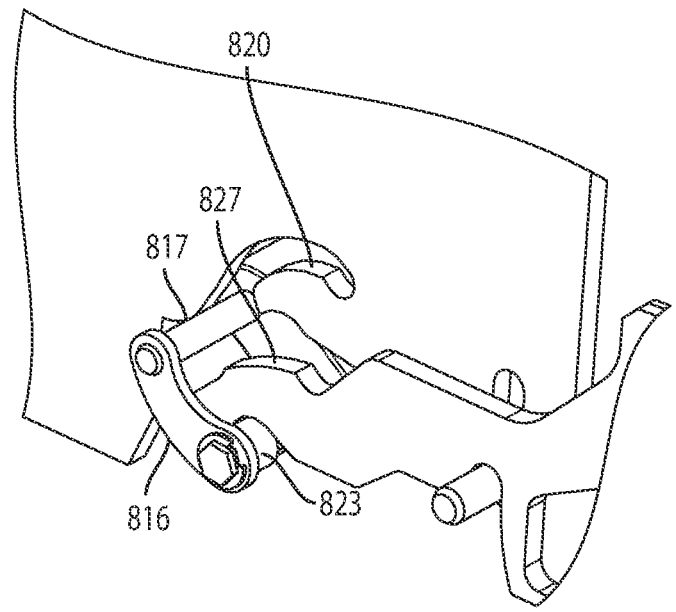

FIG. 9D shows the locking mechanism 818 with a portion of the power module 822 placed on the locking mechanism 818, with its support surface 825 in contact with or near the support member 823. The placement of the power module on the locking mechanism 818 as shown in FIG. 9D may result from the engagement process of the power module 822 illustrated with respect to FIGS. 8F-8J.

Figure 9E:
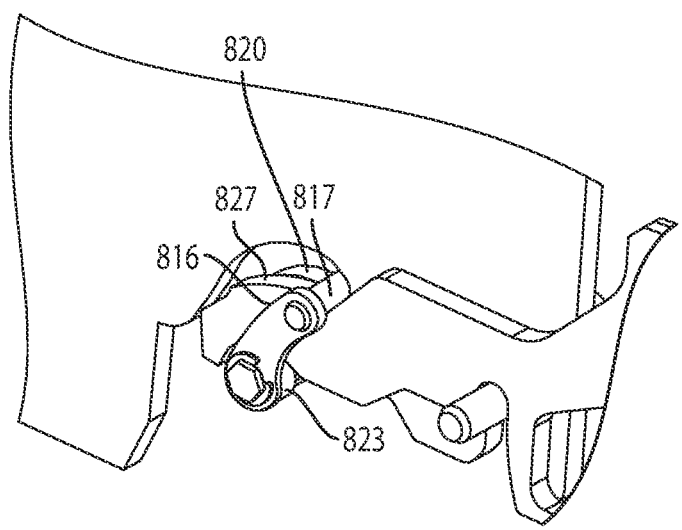

As shown in FIG. 9D, both of the locking surfaces 827, 820 are substantially flush or even, and define a surface that the locking shaft 817 may engage to lock the power module 822 and the wing structure 804 in place. For example, the action of moving one or both of the lock levers 830 into a locked configuration may cause the arm 816 to rotate or otherwise move, thereby sliding the locking shaft 817 along the locking surfaces 827, 820 and into a locked position. FIG. 9E shows the lock mechanism 818 in a locked position, with the locking shaft 817 positioned at an end of its travel relative to the locking surfaces 827, 820. The locking surfaces 827, 820 may have a shape that acts as a cam lock, such that a force between the locking surfaces 827, 820 and the locking shaft 817 increases as the locking shaft 817 is slid towards a locked position. In some cases, as described above, the force may decrease slightly as the locking shaft 817 reaches its locked position (e.g., entering an over-centre state), thus helping to maintain the locking mechanism 818 in the locked configuration and reducing unintentional unlocking of the locking mechanism 818.

In the figures and description relating to the components and/or mechanisms for attaching a power module and a wing structure to a fuselage (e.g., FIGS. 6A-7C, 8C-8J, 9A-9E), a single example pair of each mating component and/or mechanism is shown. However, it will be understood that UAVs in accordance with the instant description may include more pairs of the mating components. For example, the wing structures 104, 804 may include one, two, three, or more mounting brackets that are the same as or similar to the mounting brackets 600, 806. Similarly, the power modules 122, 822 may include one, two, three, or more instances of the engagement structures shown in the instant figures. Further, UAVs may have single or multiple instances of any other of the components, mechanisms, structures, and/or features shown or described herein, even if only one instance of such components, mechanisms, structures, and/or features is shown in any given figure.

Figure 10A:
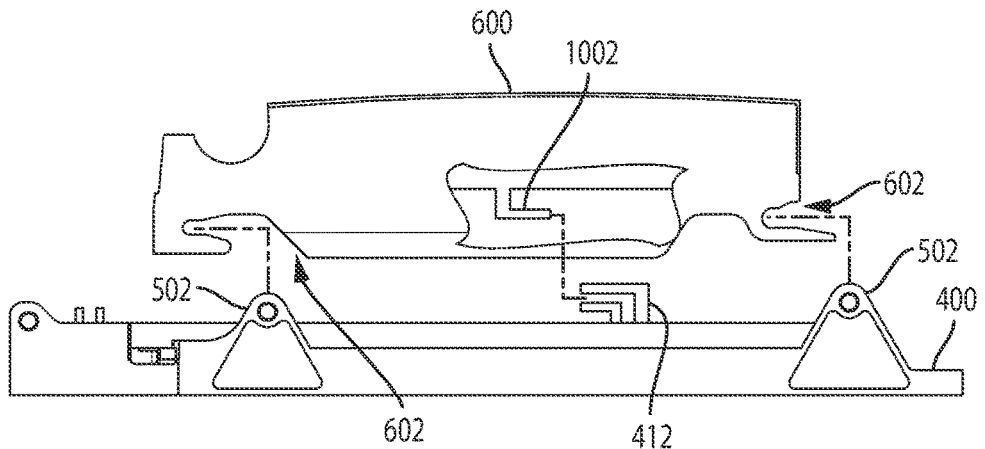
FIG. 10A depicts a partial view of the engagement between a wing bracket and the anchor structure.
Figure 10B:
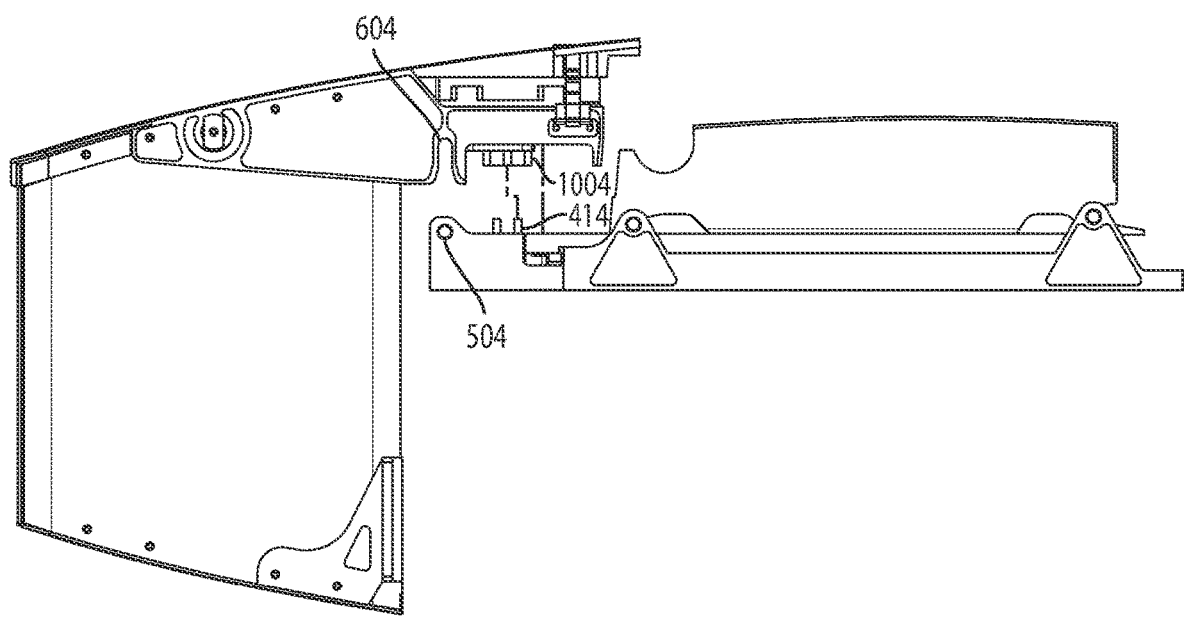
FIG. 10B depicts a partial view of the engagement between a power module and the anchor structure.

FIGS. 10A-10B depict details of how the mechanical attachment of the wing structure 104 and the power module 122 to the anchor structure 400 also results in forming positive electrical connections between the components. FIG. 10A, for example, shows a partial cutaway view of the bracket 600 from the wing structure 104 prior to mechanical engagement with the anchor structure 400. As described above, the anchor structure 400 may have wing electrical connectors 412 coupled thereto. For example, the wing electrical connectors 412 may be mounted on a circuit board that is coupled to the anchor structure 400, as described herein.

As shown in FIG. 10A, the process of attaching the bracket 600 to the anchor structure 400 results in the wing electrical connector 412 engaging and thereby electrically coupling to a corresponding wing electrical connector 1002 on the wing structure 104. More particularly, the translation path used to slide the pins of the retention structure 502 into the slots 602 of the bracket 600 (e.g., the installation path of the wing structure 104) corresponds to a translation path that results the engagement of the corresponding wing electrical connectors 412, 1002.

The corresponding wing electrical connector 1002 may be electrically coupled to electronic components in the wing structure 104, and may be configured to facilitate the transfer of power and/or signals to and/or from the circuit board (e.g., signals to/from the avionics, power from the power module 122, etc.) to the electronic components in the wing structure 104. For example, the wing structure 104 may include actuators (e.g., servos, motors, etc.) or other components and the avionics may be configured to send and/or receive signals (e.g., communication signals, power signals, etc.) to the components via the electrical connectors. Where the wing structure 104 includes actuators for moving flight control surfaces, the signals transmitted via the wing electrical connectors may cause movement of the flight control surfaces.

As shown in FIG. 10B, the process of attaching the power module 122 to the anchor structure 400 results in the power module electrical connector 414 engaging and thereby electrically coupling to a corresponding power module electrical connector 1004 on the power module 122. More particularly, the translation path used to slide the pins of the retention structure 504 into the slot 604 of the power module 122 corresponds to a translation path that results the engagement of the corresponding power module electrical connectors 414, 1004.

Figure 10C:
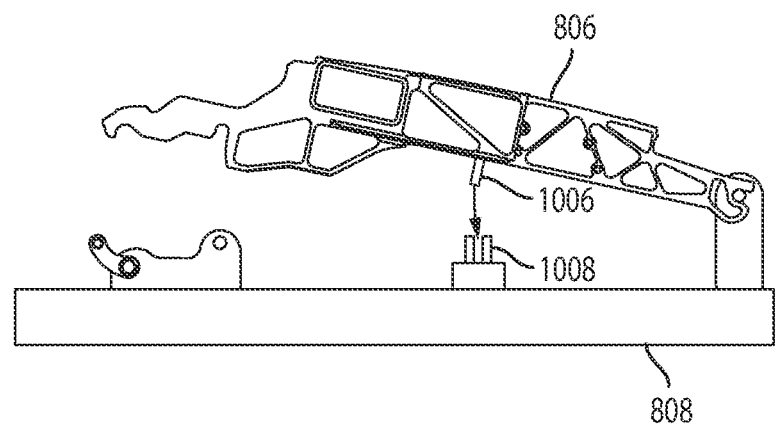
FIG. 10C depicts a partial view of the engagement between another example wing bracket and another example anchor structure.
Figure 10D:
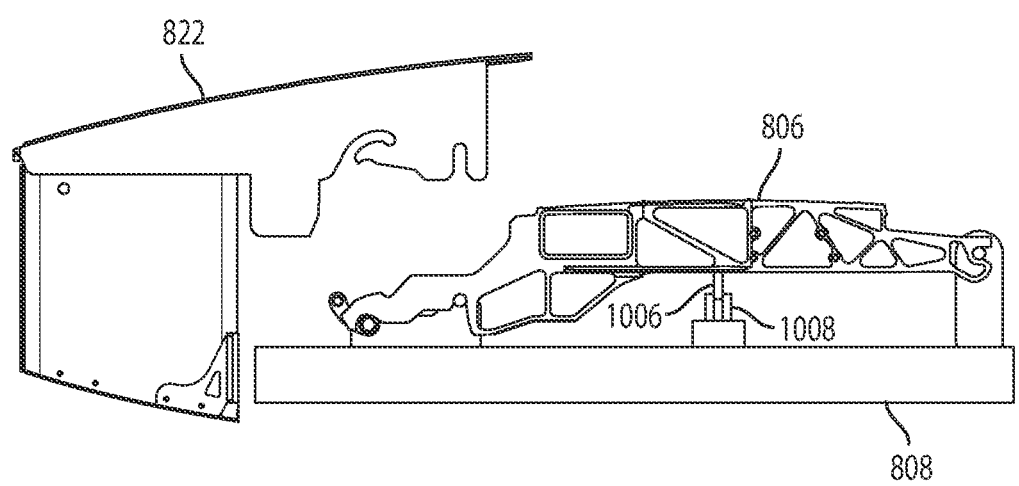
FIGS. 10D-10E depicts a partial view of the engagement between another example power module and the anchor structure of FIG. 10C.
Figure 10E:
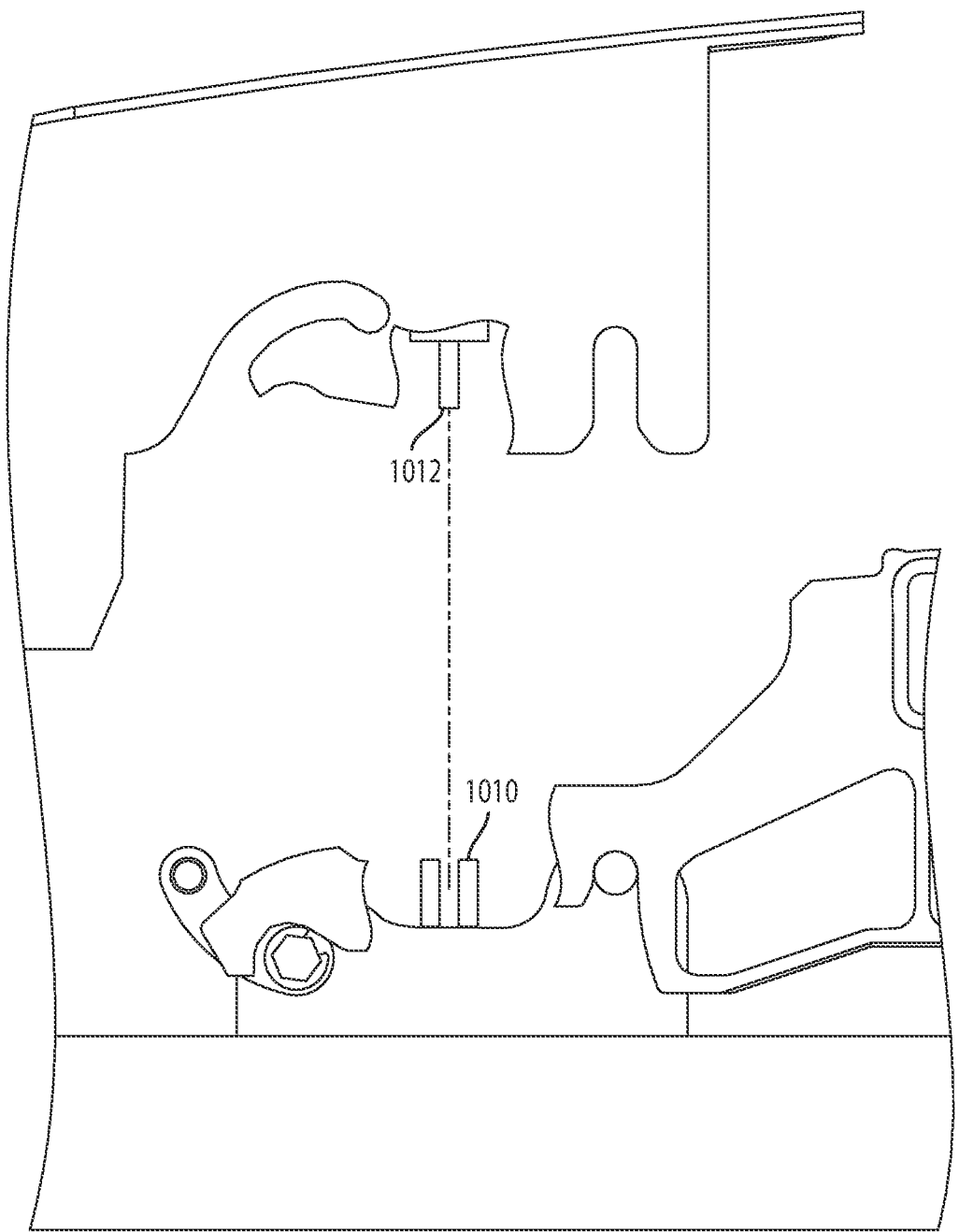

FIGS. 10C-10E depict details of how the mechanical attachment of the wing structure 804 and the power module 822 to the anchor structure 808 also results in forming positive electrical connections between the components. The discussion of FIGS. 10C-10E is similar to that relating to FIGS. 10A-10B, but relate to the different configuration of the components of the UAV 800.

FIG. 10C shows the bracket 806 prior to mechanical engagement with the anchor structure 808. Similar to the anchor structure 400, described above, the anchor structure 808 may have a wing electrical connector 1008 coupled thereto. For example, the wing electrical connector 1008 may be mounted on a circuit board that is coupled to the anchor structure 808, as described herein.

As shown in FIG. 10C, the process of attaching the bracket 806 to the anchor structure 808 results in the wing electrical connector 1008 engaging and thereby electrically coupling to a corresponding wing electrical connector 1006 on the wing structure 804. More particularly, the rotation or pivoting motion used to engage the engagement structures of the bracket 806 with the anchor structure 808 (e.g., the installation path of the wing structure 804) corresponds to a movement that results the engagement of the corresponding wing electrical connectors 1008, 1006.

Like the corresponding wing electrical connector 1002 (the discussion of which applies equally to the connector 1006), the corresponding wing electrical connector 1006 may be electrically coupled to electronic components in the wing structure 804, and may be configured to facilitate the transfer of power and/or signals to and/or from the circuit board (e.g., signals to/from the avionics, power from the power module 822, etc.) to the electronic components in the wing structure 804.

As shown in FIGS. 10D-10E, the process of attaching the power module 822 to the anchor structure 808 results in a power module electrical connector 1010 engaging and thereby electrically coupling to a corresponding power module electrical connector 1012 on the power module 822. More particularly, the translation path used to engage the engagement structures of the power module 822 with those of the anchor structure 808 (and optionally the fuselage 802, as described above) corresponds to a translation path that results the engagement of the corresponding power module electrical connectors 1010, 1012.

While the foregoing examples show particular example assembly paths that result in mechanical and electrical couplings between the various illustrated components, it will be understood that the shape, type, and positioning of the electrical connectors on the various components may be determined by the shape, type, and positioning of the retention structures. Accordingly, the electrical connector coupling path may substantially match or otherwise correspond to whatever mechanical coupling path is used, thereby ensuring that the process of mechanically coupling the components results in the electrical coupling as well. In some cases, the electrical connectors (e.g., 412, 414, 1002, 1004, 1006, 1008, 1010, 1012) may be configured to allow some degree of misalignment during the engagement process and still make a secure and sufficient electrical coupling between the complementary connectors. This may allow the electrical connectors to be securely coupled despite the type of common misalignment or jostling that may occur when attaching the wing structure and the power module to the fuselage. Moreover, the foregoing figures are shown in side views, and thus illustrate only one pair of complementary electrical connectors for the wing structures and the power modules. It will be understood that additional connectors may be used. For example, a UAV may include one, two, three, four, five, or more sets of complementary electrical connectors for each wing structure and power module.

Figure 11A:
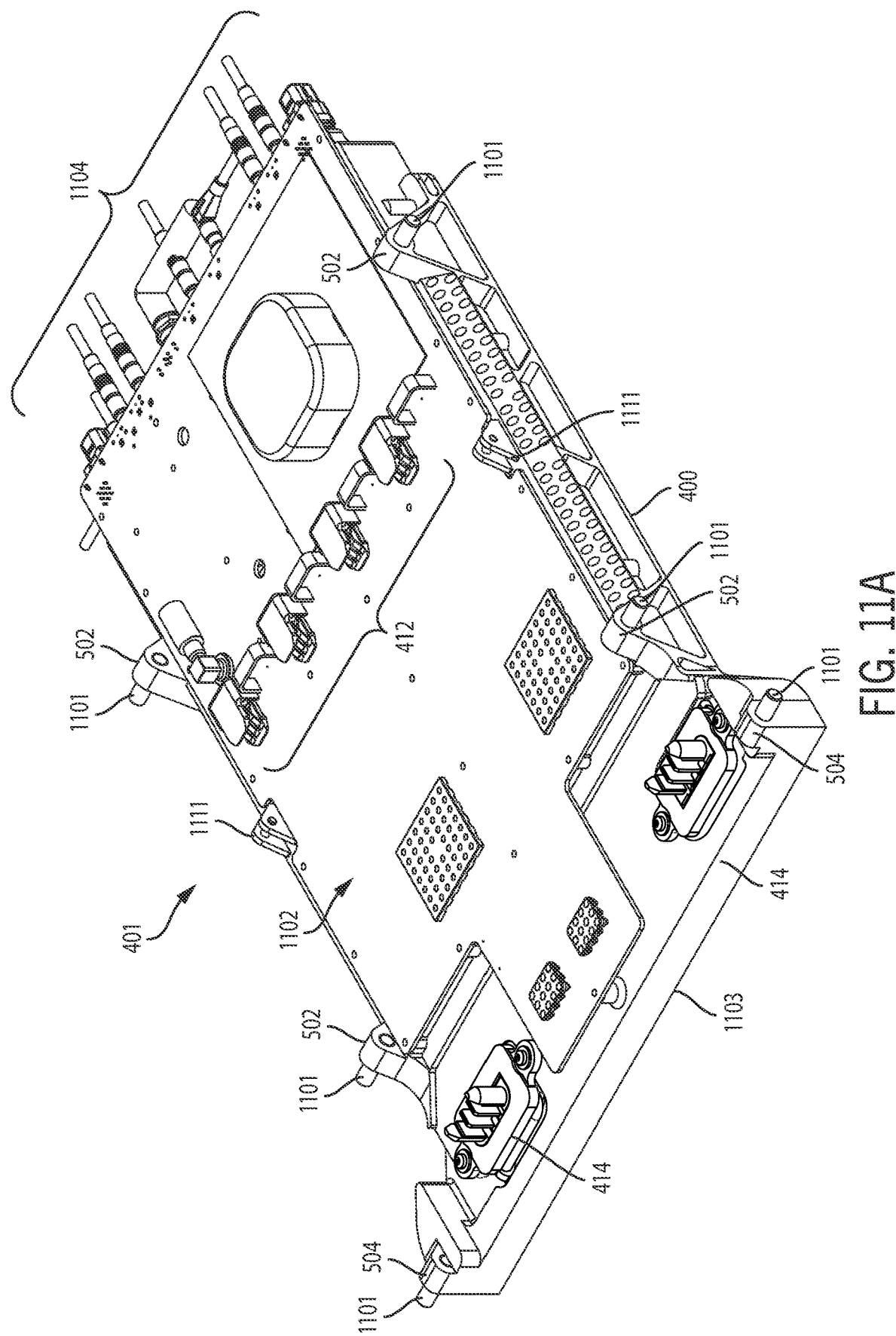
FIG. 11A depicts an integrated coupling and control unit.
Figure 11B:
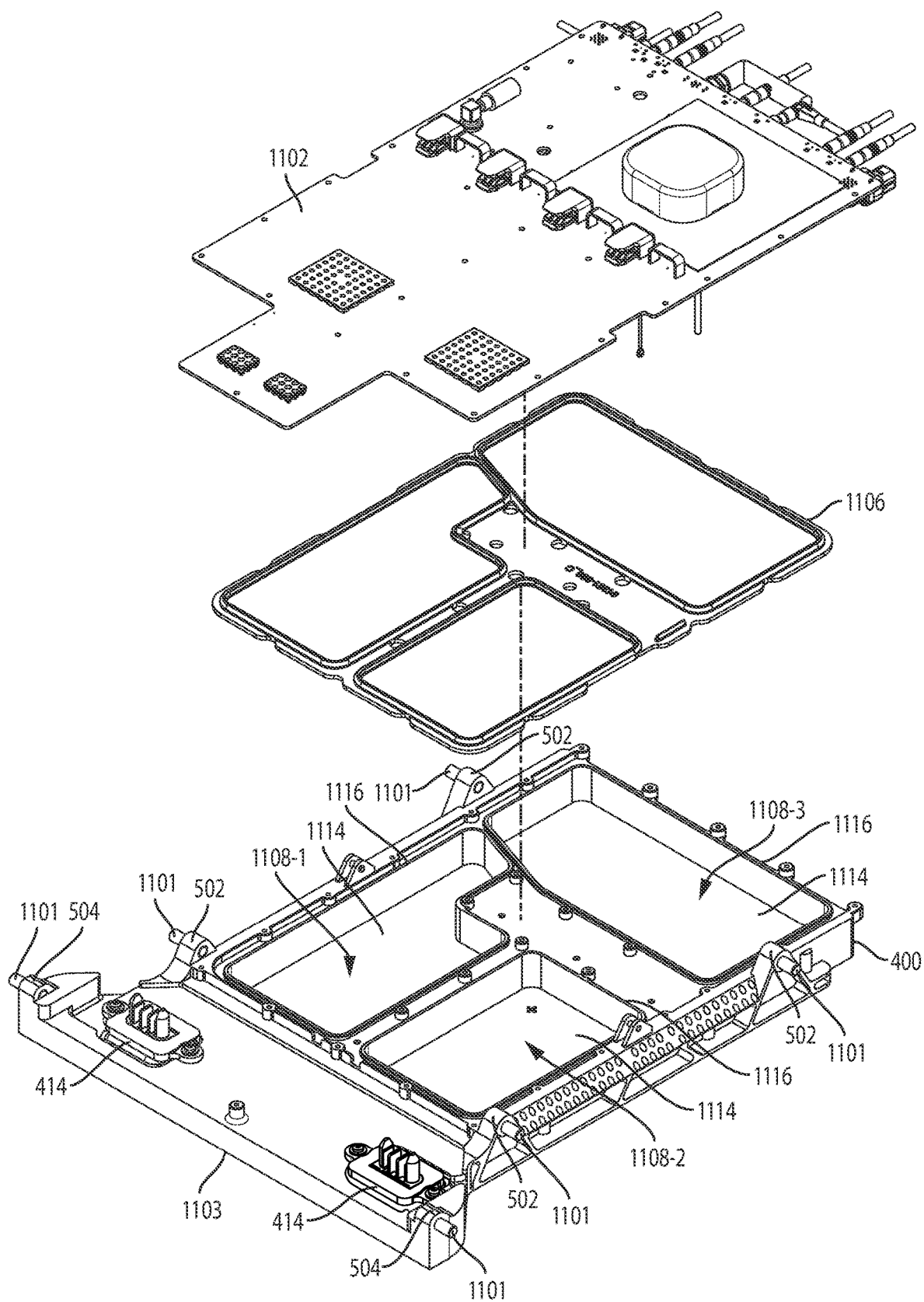
FIG. 11B depicts an exploded view of the integrated coupling and control unit of FIG. 11A.
Figure 11C:
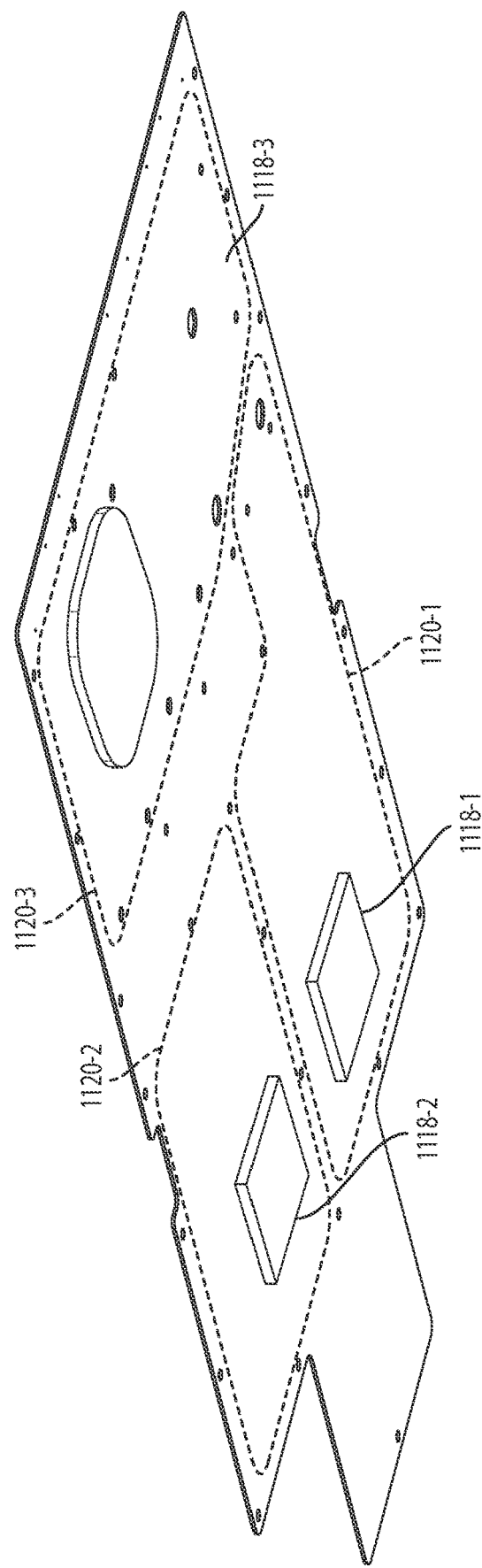
FIG. 11C depicts a bottom view circuit board of the integrated coupling and control unit of FIG. 11A.

As described above, the anchor structure 400 may be part of an integrated coupling and control unit that serves as both a principle component for mechanical couplings to the wing structure and power module, as well as a principle mounting location for avionics of a UAV. FIGS. 11A-11C depict the integrated coupling and control unit 401 in accordance with some example embodiments.

The integrated coupling and control unit 401 may include the anchor structure 400, a circuit board 1102, and a seal

1106 (FIG. 11B). The anchor structure 400 may be or may include a frame member 1103 that includes wing and power module retention structures 502, 504, as described above, for rigidly (and releasably) engaging the wing structure 104 and the power module 122 to the fuselage of a UAV. The anchor structure 400, or the frame 1103 of the anchor structure 400, may also include parachute attachment features 1111. As noted above and described herein, the anchor structure 400 may be a principal structure for transferring mechanical loads to the UAV 100, including wing loads (e.g., lift), power module loads, and the like. Thus, the parachute attachment features may be coupled to the cords of parachute or parachute system to transfer the load from the parachute cords to the frame 300 of the UAV 100 in the event of a parachute deployment. While FIG. 11A shows the parachute attachment features 1111 at a particular location, they may be positioned at other locations in other embodiments, or they may be omitted and a parachute cord may be attached to another location or component of the anchor structure 400, such as to the retention structures 502, 504. The parachute cords may be anchored to the anchor structure 400 substantially directly above the center of gravity of the UAV 100, so that the UAV 100 descends substantially horizontally during a parachute landing. In other cases it may be offset from the center of gravity.

The anchor structure 400 may be configured to be coupled to the fuselage of a UAV, as shown and described herein. For example, the anchor structure 400 may be attached to a rigid frame (e.g., the frame 300) of the UAV 100 at a position that is proximate the cavity 304 for receiving the power module 122.

The frame 1103 of the anchor structure 400 may be formed from any material using any suitable process. For example, it may be machined from a single piece of metal or other material, or it may be produced by additive manufacturing (e.g., 3-D printing), molding, or any other suitable process. The frame 1103 may be formed from metal (e.g., aluminum, magnesium, titanium, metal alloys, etc.), composites (e.g., carbon fiber, fiberglass, metal matrix composites, etc.), polymers (e.g., polycarbonate, polyamide, etc.), or any other suitable material. Where the frame 1103 is formed of metal, it may be referred to as a metal frame. In some cases, the frame 1103 of the anchor structure 400 is a monolithic component (e.g., a monolithic metal frame). In some cases, the entirety of the load-bearing structure of the anchor structure 400 (e.g., the portions of the anchor structure 400 that carry the load of the power module 122 and the wing structure 104) includes only a monolithic frame 1103 and the pins of the retention structures (e.g., pins 1101), which may be attached to the monolithic frame 1103.

The integrated coupling and control unit 401 may include a circuit board 1102 coupled to the anchor structure 400. The circuit board 1102 may include electrical components attached thereto. For example, the circuit board 1102 may include wing electrical connectors 412 coupled to a top side of the circuit board 1102, as shown in FIG. 11A. The circuit board 1102 may also include avionics components. The avionics may include any and all electronic components for controlling the UAV and/or allowing the UAV to communicate with other devices such as other UAVs, ground-based controllers, or the like. Example avionics may include processors, memory, circuit components, global positioning systems (GPS), accelerometers, altimeters, barometric sensors, radar, sonar, communication radios, and the like. As described with respect to FIGS. 11B-11C, such components may be mounted on a bottom side of the circuit board 1102 so that they are positioned in the interior volume of a cavity defined by the anchor structure 400 and the circuit board 1102. Antennas and other avionics components 1104 may be coupled to the circuit board 1102 (and/or components on the circuit board), and may extend from the integrated coupling and control unit 401. As shown, the antennas and other components 1104 extend from the rear or aft location of the integrated coupling and control unit 401, though other positions are also contemplated.

The integrated coupling and control unit 401 may also include the power module electrical connectors 414 coupled thereto. The power module electrical connectors 414 may be coupled to the frame 1103 of the anchor structure 400, and electrically connected to the circuit board 1102 (and/or a component on the circuit board) via one or more conductors.

As described above, the integrated coupling and control unit 401 may form an environmental and electromagnetic shield for the avionics and/or electronics of the UAV 100. For example, the integrated coupling and control unit 401 may be configured so that electronic components such as GPS units, processors, memory, circuit elements, and the like, are positioned in sealed and shielded volumes within the integrated coupling and control unit 401. The sealed and shielded volumes may be sealed against ingress of liquids, debris, or other contaminants, and may be shielded against electromagnetic interference. FIG. 11B depicts an exploded view of the integrated coupling and control unit 401, illustrating elements of the sealing and shielding of the integrated coupling and control unit 401. FIG. 11B shows the circuit board 1102 and a seal 1106 removed from the anchor structure 400.

The anchor structure 400, and in particular the frame 1103 of the anchor structure 400, may define one or more cavities that are configured to form volumes in which electronic components on the circuit board 1102 may be received. For example, FIG. 11B shows an anchor structure 400 that defines three cavities, 1108-1, 1108-2, and 1108-3. The cavities may be defined by bottom walls 1114 and side walls 1116 extending from the bottom walls 1114. The bottom and side walls 1114, 1116 may be part of a monolithic structure. For example, the bottom and side walls 1114, 1116 may be formed by machining the cavities 1108 from a single piece of metal.

The seal 1106 may be positioned between the circuit board 1102 and the anchor structure 400 and around the cavities 1108 to form the sealed and shielded volumes. The seal 1106 may perform both shielding and sealing functions. For example, the seal 1106 may be formed from a conductive deformable material that forms a mechanical seal between the circuit board 1102 and the anchor structure 400 and also forms a conductive path between the circuit board 1102 and the anchor structure 400. The conductive deformable material may include, for example, an elastomer material with conductive elements, particles, wires, or the like, embedded in the elastomer material. For example, the conductive deformable material may be a silicone elastomer with carbon particles distributed within the silicone elastomer.

Due to the deformable nature of the seal 1106, the seam or joint between the circuit board 1102 and the anchor structure 400 may be substantially sealed against ingress of liquids, debris, and/or other contaminants (e.g., a water resistant seal). This may be particularly advantageous in the context of UAVs, as they may need to be able to continue to function in numerous weather and environmental conditions. By sealing the electronic components in the sealed volumes of the integrated coupling and control unit 401, the reliability and range of operating conditions of the UAV may be increased.

As noted above, the seal 1106 may be configured to form a conductive path between the circuit board 1102 and the anchor structure 400. More particularly, the anchor structure 400 may include a metal (e.g., conductive) frame 1103, and the circuit board 1102 may include one or more metal layers, traces, or other conductive materials extending over the area of the circuit board 1102. By conductively coupling the metal frame 1103 of the anchor structure 400 (which may form the bottom and side walls of the cavities 1108) to the conductive materials of the circuit board 1102, the metal frame 1103, the seal 1106, and the circuit board 1102 may cooperate to form a substantially continuous conductive covering around the sealed volume. (These conductive components may be coupled to or may form a ground plane for the electrical system of the UAV.) The substantially continuous conductive covering around the volumes may operate as a Faraday cage to prevent or reduce electromagnetic interference to the electronic components that are coupled to the circuit board 1102.

In some cases, the circuit board 1102 may include one or more continuous conductive layers that are conductively coupled to the metal frame 1103 via the seal 1106. In other cases, the circuit board 1102 may include traces, wires, or other discontinuous conductive paths that are spaced sufficiently close together to act as an electromagnetic shield.

As shown in FIG. 11C, electrical components 1118 may be mounted to the circuit board 1102 at particular locations that result in the electrical components being positioned in the cavities 1108. While FIG. 11C shows three electrical components (1118-1-1118-3), these are merely representative of the electrical components that may be coupled to the circuit board 1102. More and/or different electrical components may be used in UAVs in accordance with the instant application. In some cases, the electrical components include redundant components, with the redundant components being positioned in different cavities in the frame 1103. For example, the electrical components 1118-1 and 1118-2 (which may be processors, GPS units, radios, or any other suitable component) may be the same or similar components (or may provide the same or similar functions) and thus may act as redundant backup components for one another.

Because the components 1118-1 and 1118-2 are positioned in separately sealed and shielded volumes in the integrated coupling and control unit 401, electrical components in other volumes may make up for any loss of functionality due to damage (or electromagnetic interference) of an electrical component in a breached volume. Moreover, because the internal volumes are distinct (e.g., defined by physically separate cavities) and are independently sealed, a breach in one volume may be contained to that volume and may not negatively affect other volumes.

FIG. 11C also shows conductive traces 1120-1-1120-3 positioned on the underside of the circuit board 1102. The conductive traces 1120 may be conductively coupled to additional conductive traces, layers, or other shielding components in the circuit board 1102, and may contact the seal 1106 when the integrated coupling and control unit 401 is assembled. Thus, the seal 1106 may conductively couple the circuit board 1102 to the metal frame 1103 via the conductive traces 1120.

Figure 12A:
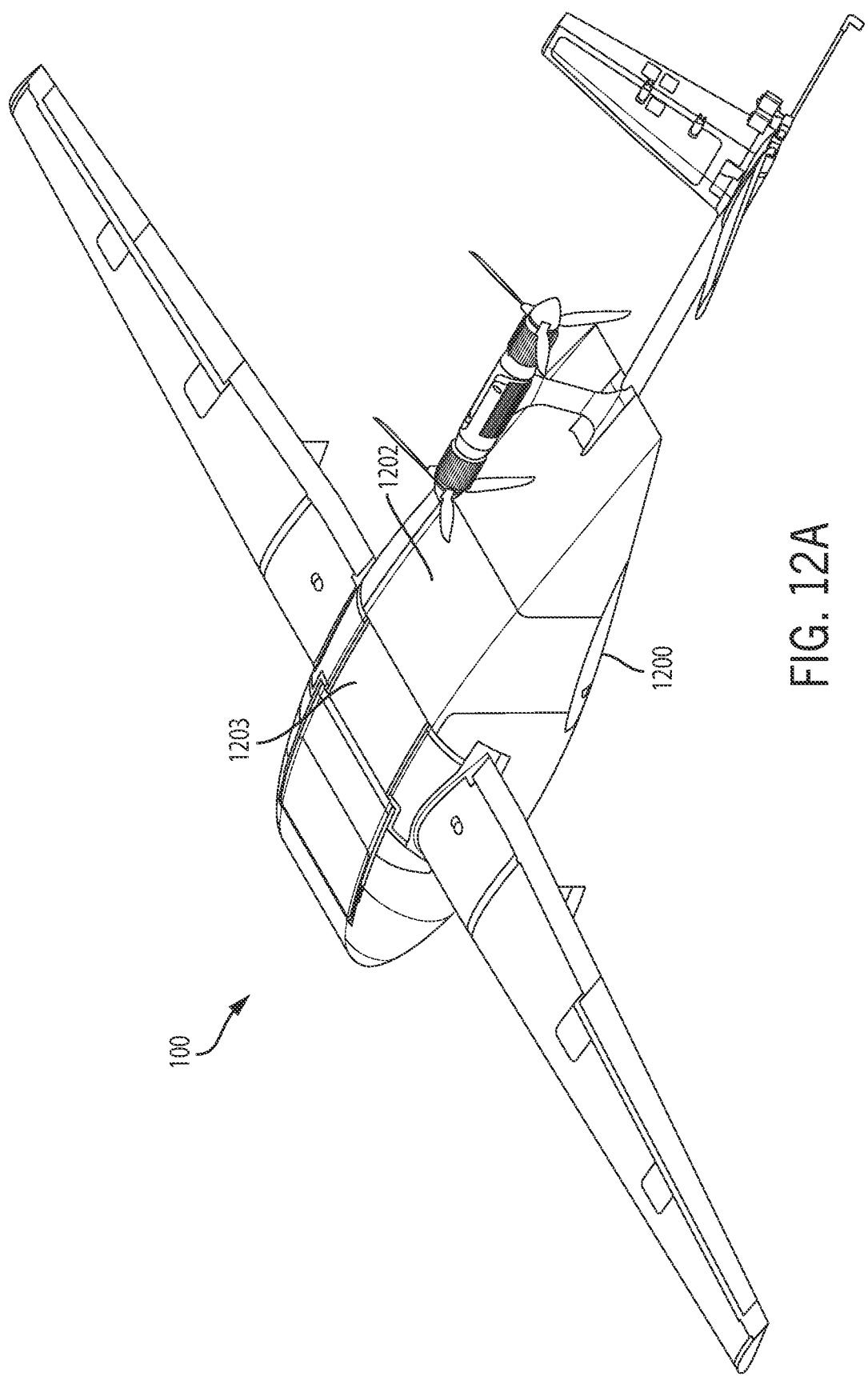
FIGS. 12A-12B depict the UAV of FIGS. 1A-1B during stages of parachute deployment.
Figure 12B:
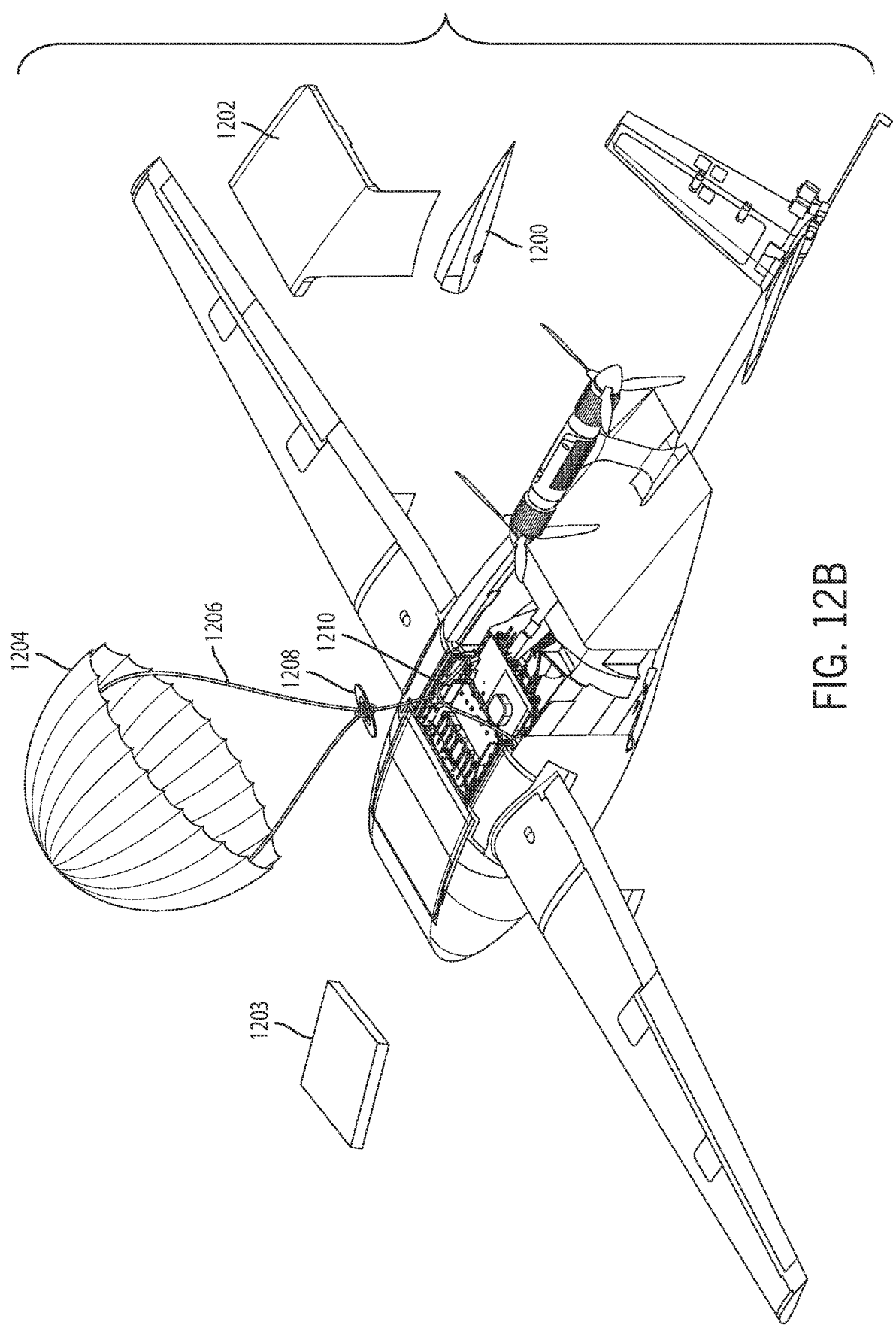

As noted above, the UAV 100 may include a deployable parachute to help slow the UAV 100 during either a planned or unplanned descent. The parachute may be coupled to the UAV 100 via the anchor structure 400 of the integrated coupling and control unit 401, as described herein. FIG. 12A shows the UAV 100 prior to the deployment of a parachute 1204 (FIG. 12B), and FIG. 12B shows the UAV 100 after deployment of the parachute 1204. As described herein, the parachute may be deployed using a propellant to push the parachute 1204 out of a parachute housing and into the air surrounding the UAV 100.

In order to limit aerodynamic drag, a deployable parachute system may be positioned under one or more body panels of the UAV 100, and the body panels may be jettisoned or otherwise displaced as a result of the deployment of the parachute 1204. For example, as shown in FIGS. 12A-12B, body panels 1200, 1202, and 1203 may be jettisoned as a result of the force of the parachutes deployment and/or forces applied to the body panels by parachute cords 1210 and/or 1206. Once the parachute 1204 is deployed, it may fill with air as a result of the motion and/or descent of the UAV 100, and thus slow the UAV 100. As described herein, the parachute 1204 may be coupled to the UAV 100 via the parachute cords 1206 and 1210, both of which may be coupled to a cap 1208 that is used to cover and/or enclose a sealed housing of a deployable parachute system.

The parachute system may be configured to deploy the parachute 1204 in response to any suitable event. For example, a flight plan for the UAV 100 (which may be stored by a flight controller onboard the UAV 100 or may be transmitted in real-time to the UAV 100 from a ground-based controller or another UAV) may include a scheduled parachute descent at a landing zone. In such cases, when the UAV 100 is detected at the landing zone (e.g., by the UAV 100, by ground-based sensors, or using any other suitable system or technique), the UAV 100 may command the parachute system to deploy the parachute 1204. In other cases, the UAV 100 may be configured to detect conditions indicative of or likely to produce an unplanned descent, and in response to detecting such conditions, cause the parachute system to deploy the parachute 1204. Example conditions that may be indicative of or likely to produce an unplanned descent and may be detected by the UAV 100 (or a ground-based system or another UAV) include but are not limited to loss of motor function or propulsion, a loss of power or fuel, a loss of vehicle control, rapid descent and/or deceleration, or the like.

Figure 13:
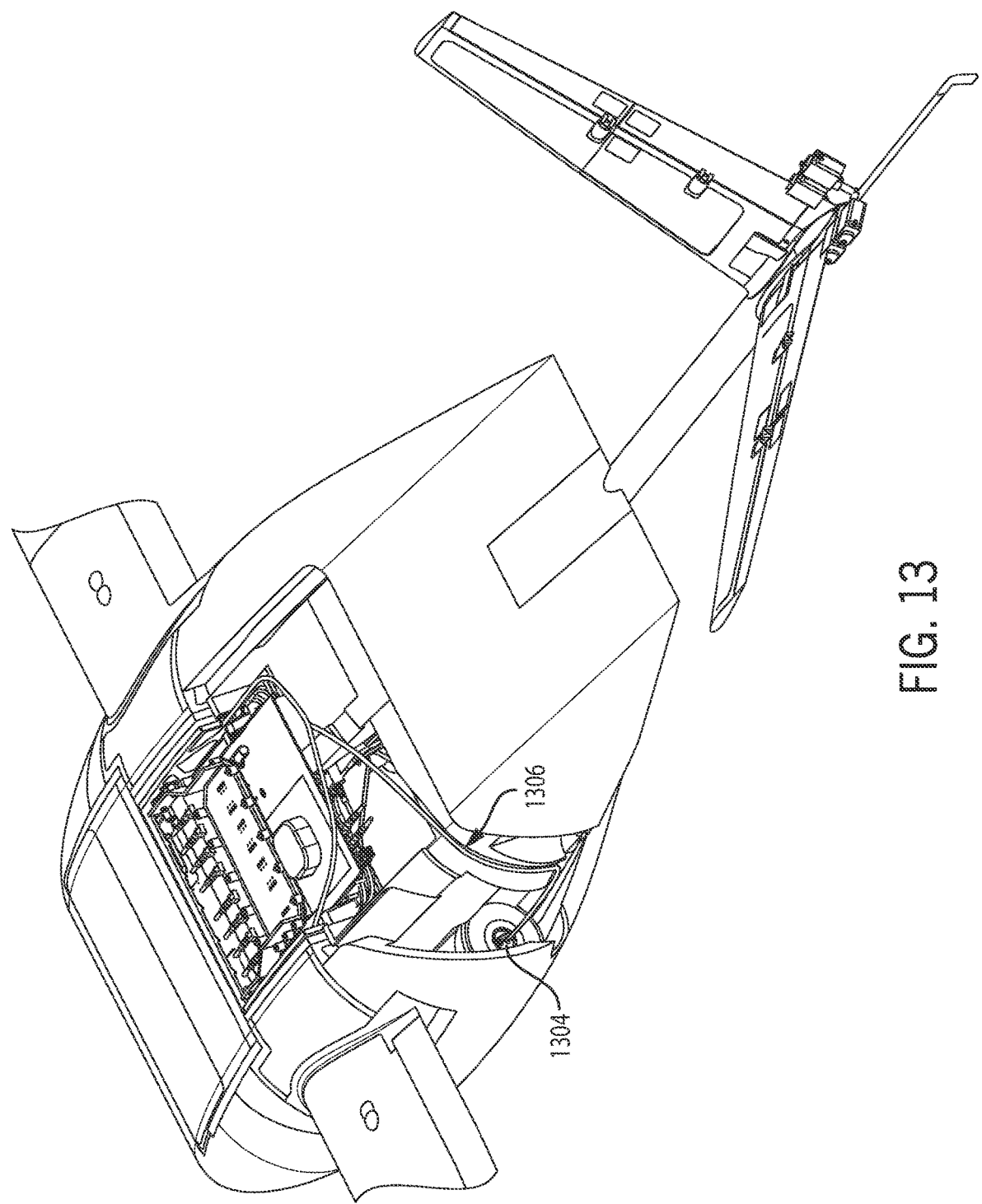
FIG. 13 depicts a portion of the UAV of FIGS. 1A-1B after parachute deployment.

FIG. 13 depicts a portion of the UAV 100 with body panels removed, showing how the parachute of a parachute system may be coupled to the anchor structure 400. For example, a cord 1210 may be coupled to a cap 1302 of the parachute system via a connection point 1304 (e.g., an eyelet or other feature). The cord 1210 may be laid along a path, and optionally within channels, in the fuselage 102 of the UAV 100, and connected to the anchor structure 400. The cord 1210 may split into multiple branches to attach to multiple points on the anchor structure 400. Further, while FIG. 13 shows a single cord 1210 connected to the cap 1302, this is merely representative, and more cords may be connected to the cap 1302.

As shown in FIG. 13, the cord 1210 is positioned under one or more body panels of the UAV 100. When the parachute is deployed from the parachute system (which may be positioned towards a bottom of the fuselage 102), the tension on the cord 1210 and any optional branches may cause the first cord 1210 to force the overlying body panels off of the fuselage 102. This allows the cord 1210 a clear vertical path to allow the parachute to be positioned above the UAV 100 and maintain the UAV 100 in a substantially horizontal attitude (or at least with the bottom of the UAV 100 generally facing downward).

The deployable parachute system of the UAV 100 may be configured so that, despite a rapid and possibly explosive deployment, internal components of the parachute system (other than the parachute and optional packing materials) remain captive in the parachute system and are not expelled from the parachute system. This may increase the safety of the parachute system, and also allow for greater reusability, as internal components, such as plungers, are not lost during parachute deployment and may be reused. FIGS. 14A-14D illustrate aspects of a deployable parachute system 1400 that may be used in the UAV 100 described herein.

Figure 14A:
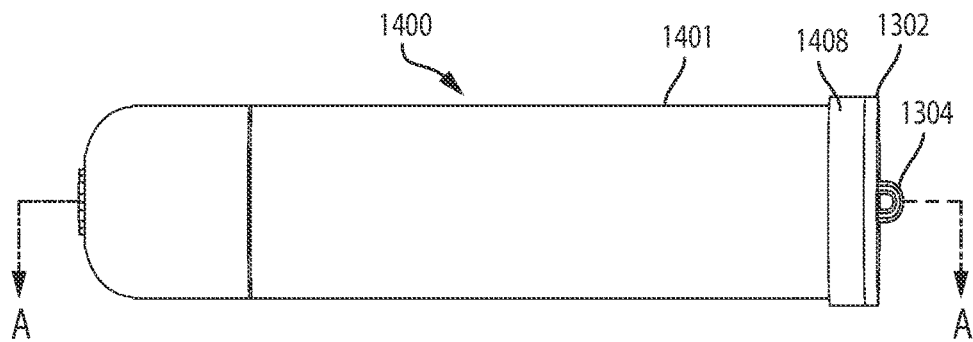
FIGS. 14A-14E depict a deployable parachute system.

FIG. 14A depicts the deployable parachute system 1400 (referred to simply as a parachute system 1400). The parachute system 1400 may include a body 1401 and a cap 1302 that is coupled to an open end of the body 1401. The body 1401 may be substantially tubular (e.g., a hollow cylinder) and may define an internal cavity. The cap 1302 may include the connection point 1304 to which the cord 1210 may be connected. As shown in FIG. 13, the cord 1210 may be routed along a path and connected to the anchor structure 400.

The cap 1302 may be coupled to the body 1401 in any suitable way. In some cases, the cap 1302 is adhered to the body 1401. In some cases, a seam between the cap 1302 and the body 1401 is sealed, such as with a plastic or polymer cover that extends over a seam. The cover may be adhered to the cap 1302 and/or the body 1401 to prevent moisture or other contaminants from entering the body 1401.

Figure 14B:
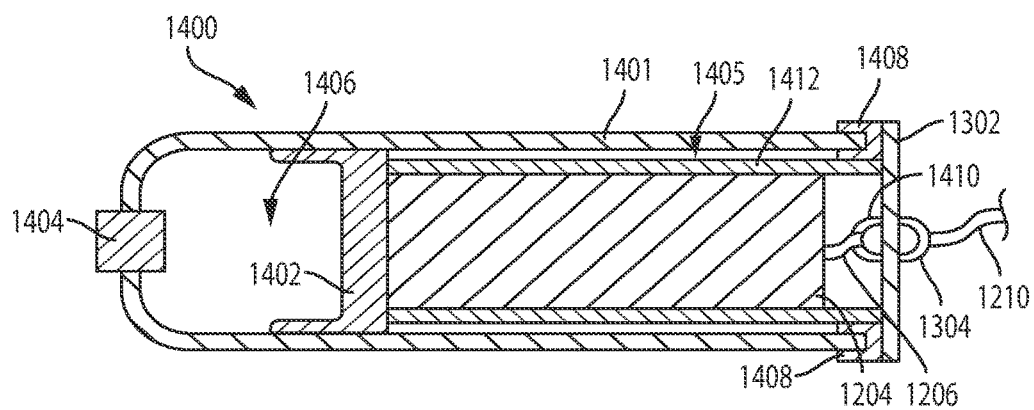

FIG. 14B shows a cross-sectional view of the parachute system 1400, viewed along line A-A in FIG. 14A. As shown, the parachute system 1400 is in an undeployed state. The parachute system 1400 includes a plunger 1402 positioned in the cavity and dividing the cavity into a first chamber 1405 on one side of the plunger 1402 and a second chamber 1406 on an opposite side of the plunger 1402. The parachute system 1400 includes the parachute 1204 in the first chamber 1405. The parachute 1204 may be folded or otherwise packed into a configuration that allows it to expand when deployed so that it can slow the descent of the UAV 100. In some cases, the parachute 1204 is at least partially surrounded (e.g., wrapped) in a sleeve 1412. The sleeve 1412 may help guide the parachute 1204 out of the body (e.g., through an opening in the body 1401) and may prevent the packed parachute 1204 from catching or snagging on any part of the parachute system 1400 during deployment. In some cases, the sleeve 1412 may be stiffer and/or more rigid than the parachute 1204 to help the parachute 1204 easily slide out of the opening during deployment. In some cases, the plunger 1402 may exclusively contact the sleeve 1412 to push the parachute 1204 out of the body 1401. In other cases, then plunger 1402 may contact both the parachute 1204 and the sleeve 1412 to expel the parachute 1204. The sleeve 1412 may become unwrapped from the parachute 1204 when it is deployed, and may simply be jettisoned. In some cases, the sleeve 1412 may be held captive to the UAV 100 via a parachute cord or other suitable tether or attachment mechanism.

The parachute 1204 may be coupled to the cap 1302 via the cord 1206. The cord 1206 may be coupled to the cap 1302 at a parachute connection point 1410. As noted above, because the cord 1206 couples the parachute 1204 to the cap 1302, and the cord 1210 couples the cap 1302 to the anchor structure 400 (or another suitable connection point of the UAV 100), a continuous load bearing cord path is formed between the parachute 1204 and the UAV 100.

The parachute system 1400 also includes a propellant module 1404 configured to provide a force to expel the parachute 1204 from the cavity. The propellant module 1404 may be positioned at least partially in the second chamber 1406, and may be configured to expand (or introduce an expanding gas or other composition) within the second chamber 1406 to push a plunger 1402 along an ejection direction (e.g., to the right, as shown in FIGS. 14A-14D) to expel the parachute 1204 from the cavity. The propellant module 1404 may be removable and/or replaceable, thus allowing other components of the parachute system 1400 to be reused for multiple parachute deployments.

The propellant module 1404 may be or may include any suitable propellant. For example, the propellant module 1404 may include an explosive charge that produces a force (e.g., from rapidly expanding gases) on the plunger 1402. In other cases, the propellant module 1404 may use compressed gas (e.g., air, carbon dioxide, nitrogen, etc.) as a propellant, which may be released into the second chamber 1406 such that the compressed gas expands and pushes the plunger 1402 along the ejection direction to expel the parachute 1204.

Figure 14C:
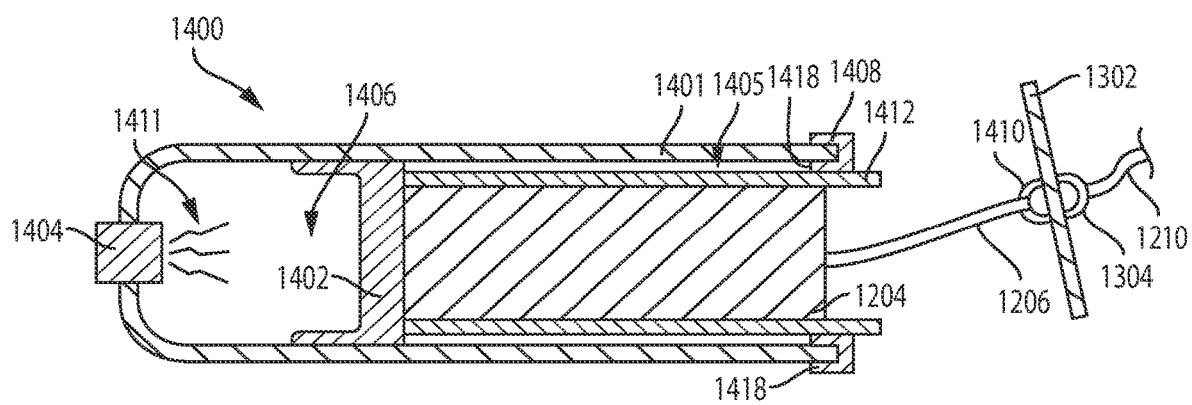
Figure 14D:
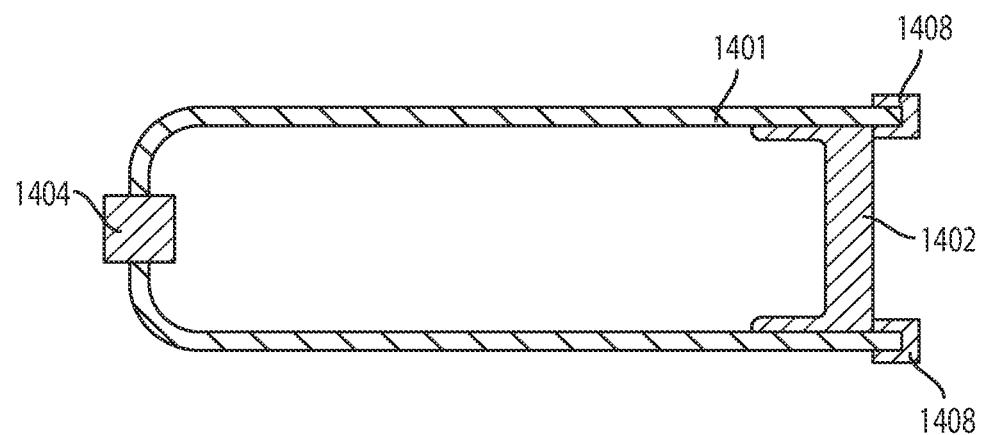

As noted above, the parachute system 1400 may be configured so that, apart from the parachute 1204 and the optional sleeve 1412, other components are not expelled or projected from the parachute system 1400 during deployment. For example, the parachute system 1400 may be configured to retain the plunger 1402 within the body 1401 after the parachute 1204 is expelled. FIGS. 14B-14D illustrate the structures that retain the plunger 1402 to the body 1401.

As shown in FIG. 14B, the parachute system 1400 includes a retention feature 1408 proximate the opening through which the parachute 1204 is expelled. The retention feature 1408 may be integrally formed with the body 1401, or it may be a separate component that is attached to the body 1401 (as shown).

The retention feature 1408 may define a retention lip 1418 that extends into the first chamber 1405 and/or is otherwise configured to overlap a portion of the plunger 1402. As shown in FIG. 14D, when the parachute 1204 is deployed, the plunger contacts the retention lip 1418, which prevents the plunger 1402 from exiting the cavity and/or otherwise retains the plunger 1402 to the body 1401. In some cases, the plunger 1402 and the interior volume defined by the body 1401 is substantially circular. In such cases, the retention lip 1418 may be a circular feature that has a smaller inner diameter or opening than the diameter of the circular plunger. In some cases, the retention feature 1408 and/or the retention lip 1418 does not extend continuously around the opening in the body 1401. For example, two, three, four, or more retention lips may be positioned at various locations around the opening.

FIGS. 14B-14D show the parachute system 1400 at various stages of operation. For example, FIG. 14B shows the parachute system 1400 in an initial state, prior to the parachute being deployed. FIG. 14B may represent how the parachute system 1400 is configured during nominal flight of a UAV.

FIG. 14C shows the parachute system 1400 while the parachute 1204 is being expelled. The propellant module 1404 is producing an expanding gas 1411 (e.g., from a reservoir of compressed gas or from an explosive charge or other chemical reaction) that is applying a force to the plunger 1402. The plunger 1402, in turn, is pushing the parachute 1204 and the sleeve 1412 out through the opening in the body 1401. As shown in FIG. 14C, the cap 1302 has already been decoupled from the body 1401.

FIG. 14D shows the parachute system 1400 after the parachute 1201 has been ejected from the body 1401. Notably, the plunger 1402 has remained within the body 1401, with the retention feature 1408 engaging a peripheral region of the plunger 1402 to prevent it from exiting the body 1401.

Figure 14E:
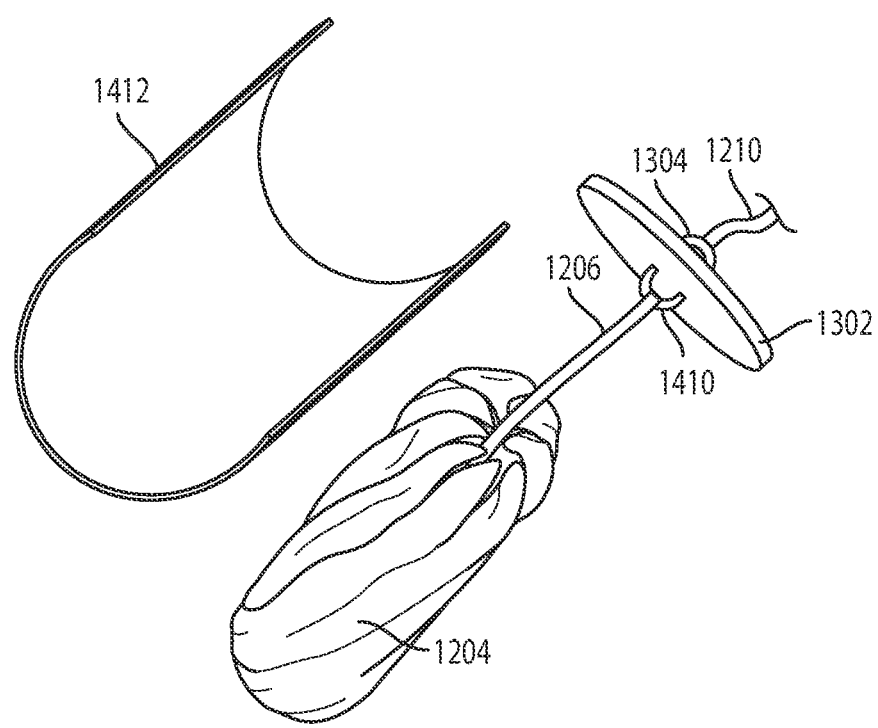

FIG. 14E shows how the parachute 1204 may be separated from the sleeve 1412 after the parachute 1204 and sleeve 1412 are ejected from the body 1401. For example, the sleeve 1412 may unwrap or otherwise open to allow the folded or packed parachute 1204 to become free of the sleeve 1412 and freely expand due to the parachute 1204 being exposed to the airflow around the UAV. In some cases, a pilot parachute may be used to help unpack or unfold the parachute 1204 so that the parachute 1204 can begin slowing the descent of the UAV.

As described above, the UAV 100 may use a removable power module 122 to provide energy to one or more of its flight systems, including its avionics, motors, flight control surface actuators, and the like. The removable power module 122 described herein is configured to be quickly and easily coupled to and decoupled from the UAV 100, and also provide additional advantages. For example, as noted above, the power module 122 may include heat sinks that define exterior surfaces of the fuselage 102 of the UAV 100 (and thus directly in the airflow over the fuselage 102 during flight) to transfer waste heat out of the power module 122 quickly and efficiently. Further, the power module 122 may be designed so that a failure of the power module 122, or a component of the power module 122, is less likely to damage other components of the power module 122.

Figure 15:
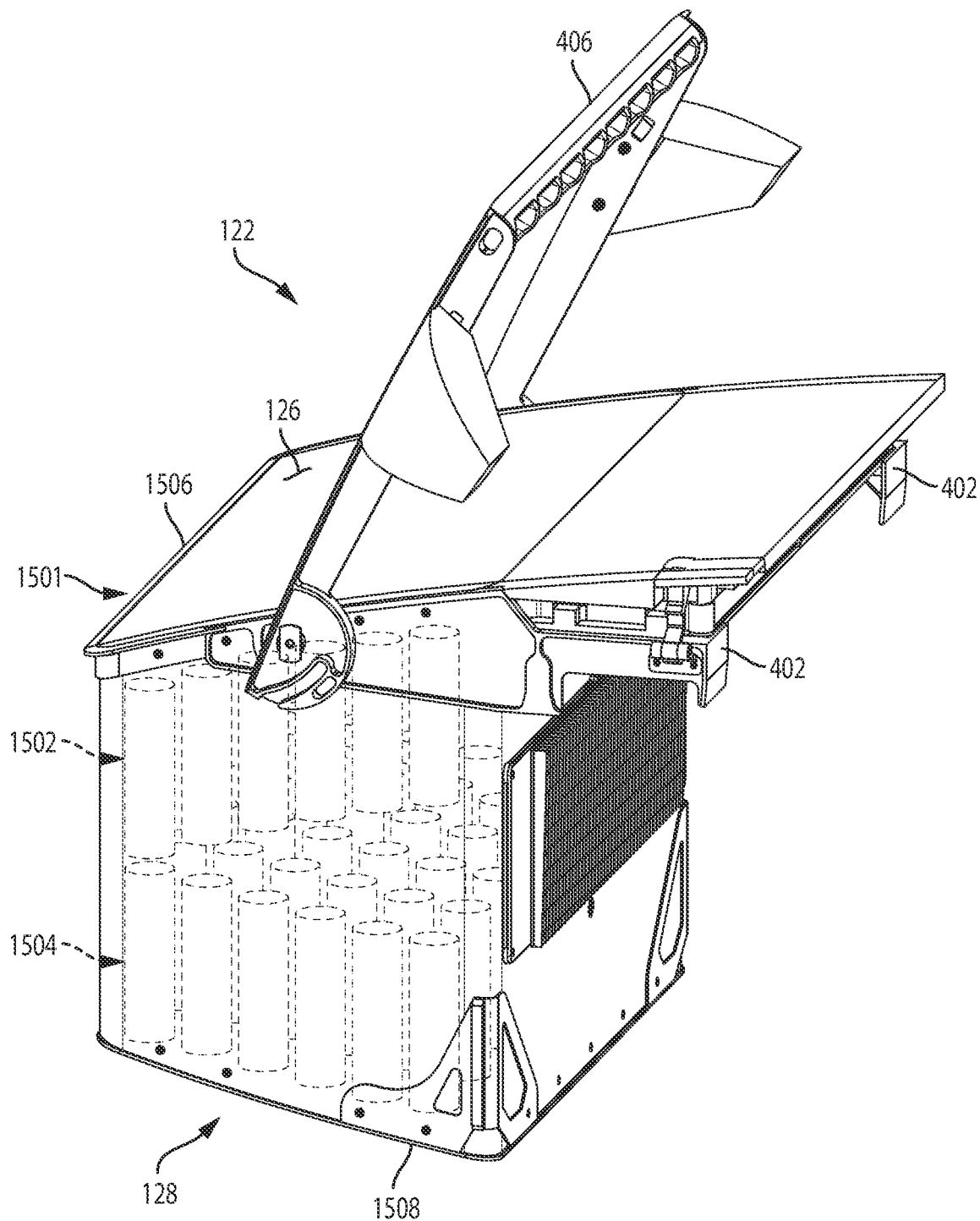
FIG. 15 depicts a power module for a UAV.

FIG. 15 shows an example embodiment of the power module 122. As described above, the power module 122 may include a handle 406 that is pivotally or rotatably attached to a body 1501. The power module 122 may also include an interfacing side 402, which may be or may define a surface of the power module 122 that contacts or otherwise interfaces with a portion of a wing structure (such as the bracket 600 or another bracket embodiment). The interfacing side 402 may act as a mechanical interlock that imparts a force on the wing structure, or a component thereof, to prevent the wing structure from moving in a decoupling direction. As shown, the power module 122 is a battery pack that includes battery arrays 1502, 1504 that provide electrical power to the UAV 100. The power module 122 also includes battery cell holders 1506, 1508 that define surfaces 126, 128 which form exterior surfaces of the fuselage 102 of the UAV 100 when the power module 122 is coupled to the UAV 100. The battery cell holders 1506, 1508 also secure the battery arrays 1502, 1504 to the power module 122.

Figure 16:
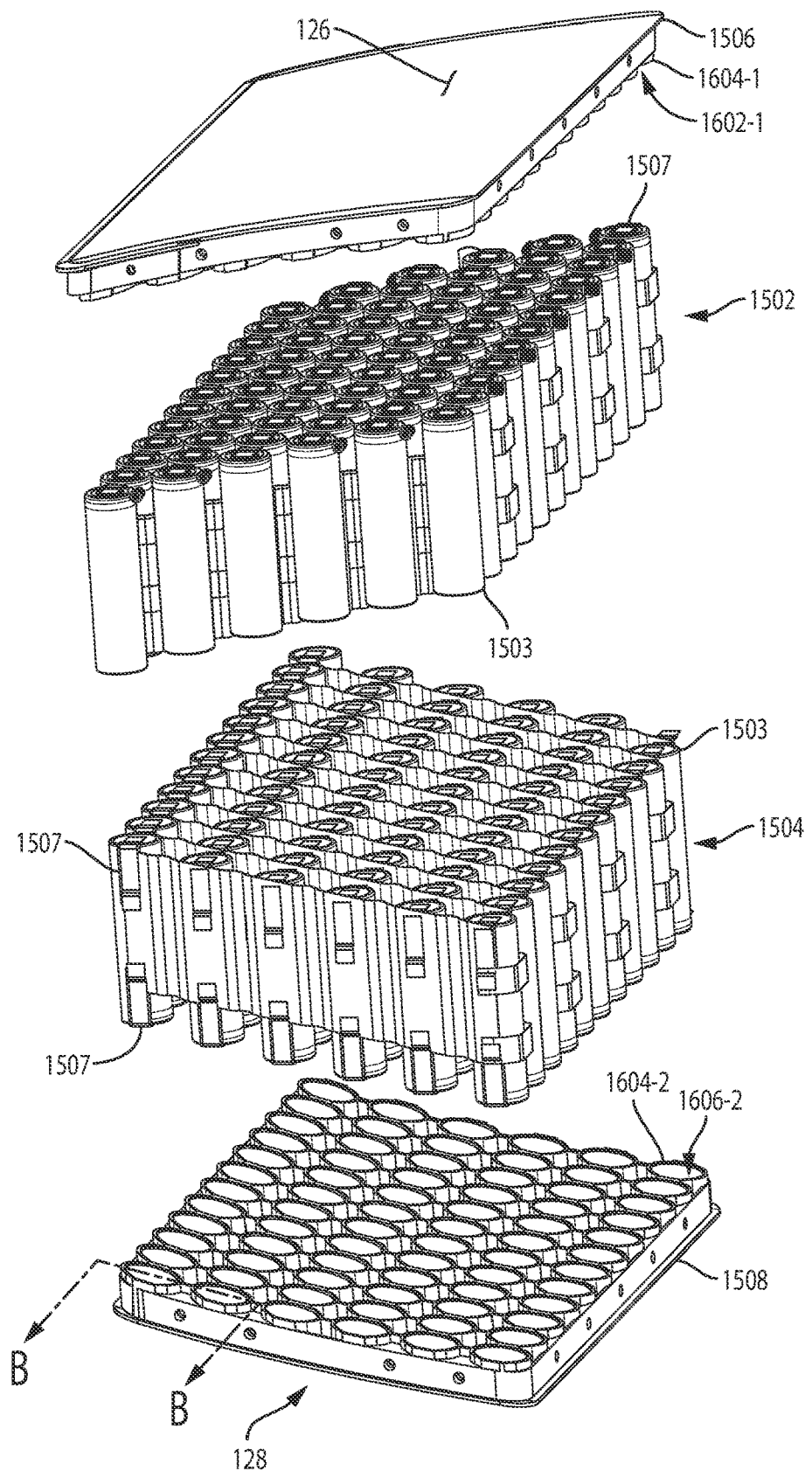
FIG. 16 depicts an exploded view of the power module of FIG. 15.

FIG. 16 depicts an exploded view of a portion of the power module 122. In particular, FIG. 16 shows the battery cell holders 1506 and 1508 and the battery arrays 1502, 1504. The battery arrays 1502, 1504 include multiple individual battery cells 1503. The battery cells 1503 may be any suitable type of battery cell and may use any suitable chemistry or other electrical storage system including but not limited to nickel metal hydride (NiMH), lithium ion, nickel cadmium (NiCd), alkaline, and lead acid. The battery cells 1503 may be electrically coupled to one another via electrical connectors 1507. The electrical connectors 1507 may couple the battery cells 1503 in any suitable way, such as in a series or parallel or series-parallel configuration.

The battery cell holders 1506, 1508 may include features 1604 that define cavities 1602. The cavities 1602 may each be configured to receive a portion of a battery cell 1503. The battery cells 1503 may be held securely in the cavities 1602 via fasteners, adhesives, clips, interference fits, clamps/clamping forces, or other retention structures or techniques. The electrical connectors 1507 or portions thereof may be disposed in the cavities 1602 when the battery cells 1503 are positioned in the cavities 1602. In some cases, the electrical connectors 1507 are attached to the battery cell holders 1506, 1508 and are securely held within the cavities 1602.

The battery cell holders 1506, 1508 may be configured to act as heat sinks for the battery cells 1503. In particular, the battery cells 1503 may be thermally coupled to the battery cell holders 1506, 1508 due to the physical contact between the features 1604 and the battery cells 1503, and the battery cell holders 1506, 1508 may be formed from or include a thermally conductive polymer material. For example, the battery cell holders 1506, 1508 may be formed from or include a polymer material having a thermal conductivity that is greater than 1 W/mK, greater than 5 W/mK, greater than 10 W/mK, greater than 20 W/mK, or the like. Example polymer materials include but are not limited to filled polymers (e.g., a polymer matrix with thermally conductive particles such as metals, graphite, ceramics, or the like, distributed therein). In some cases, the battery cell holders 1506, 1508 are formed from metal such as aluminum, magnesium, titanium, etc.

Due to the thermal coupling between the battery cells 1503 and the battery cell holders 1506, 1508, heat generated by the battery cells 1503 may be drawn away from the battery cells 1503. When the UAV 100 is flying, heat from the battery cells 1503 may be drawn through the material of the battery cell holders 1506, 1508 and transferred via the exterior surfaces 126, 128 to the air that is flowing over the fuselage 102. Thus, the airflow resulting directly from the flight of the UAV 100 also acts as a forced-air cooling system that continually removes heat from the battery cells 1503 via the exterior surfaces 126, 128 to the exterior of the power module 122. By directly physically coupling and retaining the battery cells 1503 to a thermally conductive structure that defines an exterior surface of the fuselage 102, greater electrical efficiencies may be achieved during flight as compared to other battery arrangements. Moreover, coupling the battery cells 1503 to the thermally conductive battery cell holders 1506, 1508 in the removable power module 122 allows the thermal connection to be maintained even when the power module 122 is removed and replaced, obviating the need to separately secure the battery cells to a heat sink or other thermal component when coupling the battery cells to the UAV 100.

In some cases, battery cells 1503 may be thermally coupled to a heat sink or other heat exchanger via other techniques. For example, the battery cells 1503 may be wrapped, jacketed, or otherwise thermally coupled to a fluid conduit that is in turn thermally coupled to a heat sink or other heat exchanger. Fluid inside the fluid conduit may draw or conduct heat away from the battery cells 1503 and towards the heat sink or other heat exchanger, where the heat may be drawn or conducted out of the fluid and into the air surrounding the UAV 100.

One or both of the battery cell holders 1506, 1508 may also act as heat sinks for other components of the UAV 100. For example, processors, motors, electronic circuitry, or other components (including, for example, components of the integrated coupling and control unit 401, FIG. 11A) may be thermally coupled to the battery cell holders 1506, 1508 via fluid conduits or other thermal couplings. In some cases, the fluid conduits or other thermal couplings may include complementary connectors on the power module 122 and the integrated coupling and control unit 401 (which may operate in an analogous manner to the power module electrical connectors 414, 1004) to facilitate the blind mating of the fluid conduits or other thermal conduits when the power module 122 is attached to the UAV 100. In this way, the thermal connections may be formed as part of the same power module attachment process and without any extra steps or operations to complete the thermal connections.

In embodiments where fluid conduits are used to thermally couple components with heat sinks or other heat exchangers, a fluid pump may circulate fluid through the fluid conduits. The fluid pump may be any suitable type of pump or mechanism, and may be powered by the power module 122.

While the power module 122 shown in FIGS. 15-16 have two battery cell holders 1506, 1508 and two battery cell arrays 1502, 1504, this is merely one example embodiment, and more or fewer battery cell holders and battery arrays may be used. For example, in some cases only one battery cell holder and corresponding battery cell array is used. In other cases, three or more battery cell holders and corresponding battery cell arrays are used. As used herein, a battery cell array relates to the group of battery cells that are coupled to a corresponding battery cell holder, and does not necessarily correspond to a particular electrical configuration or grouping.

Under some conditions battery cells may fail, which may result in the battery cell exploding, catching fire, or otherwise forcefully venting gasses and/or particles out of the cell. Where multiple battery cells are positioned in close proximity, the failure of one cell (e.g., venting of hot gasses or particles) may cause other cells to melt, overheat, and/or otherwise fail in a similar manner. Thus, the failure of one battery cell may cause a chain reaction that causes other battery cells to fail. Additionally, any components of a UAV that are in proximity to a failing battery may be destroyed or damaged by the failing battery cell. Due to these risks, the power module 122 may be configured to reduce the likelihood that a failure of one battery cell will cause damage to other battery cells or to other internal components of the UAV 100. FIGS. 17A-17B depict partial cross-sectional views of a portion of the power module 122, viewed alone line B-B in FIG. 16, showing how the damage from a failing battery cell may be limited or mitigated. In particular, the battery cells 1503 may be positioned in the battery cell holders 1506, 1508 such that a failing battery cell 1503 is likely to project any explosion or venting through the battery cell holders 1506, 1508 and to the exterior of the UAV 100. While FIGS. 17A-17B show only a portion of one of the battery cell arrays, it will be understood that each battery array and battery cell holder may have the same or similar configuration.

With reference to FIG. 17A, battery cells 1503 may be configured so that when they fail in a way that causes an explosion or other forceful venting of gasses and/or material, the venting is directed through a venting member 1706. For example, the venting member 1706 may be a portion of the battery housing that is weaker than other portions. Thus, if there is an internal pressure rise in the battery cell 1503, the venting member 1706 will fail or breach first, allowing the gasses and/or other material to escape through the venting member 1706 while the remaining portions of the battery housing stay intact and contain the gasses and/or other material. As shown in FIGS. 17A-17B, the battery cells 1503 may be positioned in the battery cell holders 1506, 1508 so that the venting member 1706 is facing an interior surface of a wall 1702, where the exterior surface of the wall 1702 defines the exterior surface 128 of the power module 122.

FIG. 17B illustrates the battery cell 1503-1 during a failure event in which gasses and/or other material 1704 is being ejected from the battery cell 1503-1. Because the battery cell 1503-1 is positioned in its cavity such that the venting member 1706 is facing the wall 1702 (or otherwise configured to direct vent towards the wall 1702), the venting gasses/materials form a localized opening 1703 in the wall 1702. In this way, the venting gasses/materials are directed away from other battery cells 1503 and away from other components of the UAV 100. Moreover, the venting gasses/materials are directed through the wall 1702 and into the environment exterior to the UAV 100, thus taking advantage of the airflow over the exterior surface 128 to help quickly remove heat and strip the venting gasses/materials away from the other battery cells 1503 and generally away from the UAV 100.

The battery cell holder 1508 may be configured to locally fail in the event of a battery cell failure. For example, the battery cell holder 1508 may be formed from a material (and have a particular shape, thickness, or other dimension) that is configured to be breached in response to a typical venting event of a failing battery cell. More particularly, the material may have a strength, heat resistance, toughness, or other property that is below a threshold for containing the venting of a failing battery cell. Because the battery cell holder 1508, and in particular the wall 1702, is designed to locally fail, the battery cell holder 1508 can improve the likelihood that venting gasses/materials are expelled or otherwise directed outside the UAV 100.

Thus, though a failing battery cell 1503 may damage the power module 122 by forming an opening in the wall 1702, the damage may be limited and/or contained to the failed cell and the opening, rather than causing other cells to fail or damaging internal components. Indeed, a failure of a single cell (or even multiple individual cells) may be tolerated during flight and not substantially disrupt the flight or otherwise require an unplanned landing. By contrast, in a conventional configuration a failed cell may damage the structure or electronics of a UAV, or even cause a cascading effect that could destroy a significant portion or even all of the cells of a battery pack, either of which could cause the UAV to make an unplanned landing or even crash.

In addition to carrying battery cells, the power module 122 may include other electronic components, such as processors, memory, GPS radios, sensors (e.g., altimeters, pressure transducers), avionics, or other components. For example, the power module 122 may have a GPS radio that supplements or otherwise works with the processors on the integrated coupling and control unit of a UAV. The GPS radio may be configured to store a current location of the power module 122 even when the power module 122 is not coupled to a UAV, such as when the power module 122 is being charged. When the power module 122 is coupled to a UAV, the GPS radio (and/or other associated processors and circuitry) on the power module 122 may communicate with the processors of the UAV and provide GPS information (e.g., a current location, the location or identifiers of available GPS satellites, or the like) to the processors of the UAV. In this way, the UAV may be capable of flying more quickly after a power module 122 is attached. In particular, the GPS radios that are resident on the UAV may have been unpowered due to the lack of a power module. Providing GPS or other location information to the UAV from the power module 122 thus prepares the UAV for flight without requiring the UAV to wait until the UAV-mounted GPS system starts up and acquires suitable location information.

The power module 122 may also include memory that stores data about the UAV to which it is attached. For example, the UAV may capture and store, in the power module's memory, data relating to altitude, speed, received commands, motor speed, commands or signals issued to flight control surfaces, or any other suitable data. When the power module 122 is removed from the UAV for charging, it may also be coupled to a data recovery system that retrieves and optionally stores the data.

In some cases, the same electrical connectors that electrically couple the memory of the power module 122 to the integrated coupling and control system are also used to couple the memory of the power module 122 to the data recovery system. Similarly, the same electrical connectors that provide power from the power module 122 to the UAV are also used to charge the power 122. For example, a charging system may include mechanical retention structures and electrical connectors that mimic or are otherwise similar to those on a UAV. Accordingly, the power module 122 may be easily and simply coupled to the charging system in the same manner that would be coupled to a UAV, and the mechanical coupling process may result in the electrical coupling between the power module 122 and the charging system (e.g., for the transfer of both power and data).

The foregoing description relates to the features and functions of a UAV. The UAV described herein may be part of an Unmanned Aerial System (UAS) that operates multiple UAVs (such as multiple ones of the UAV 100 and/or any other suitable UAVs). An example UAS is now described with reference to FIGS. 18A-21. The UAS may operate one or more UAVs to perform various functions, including, but not limited to, package delivery, data capture, mapping, surveillance, and infrastructure-provisioning. Additional details of a UAS that may include and/or use UAVs as described herein may be found, for example, in U.S. Pat. No. 9,489,852, entitled "Unmanned Aerial Vehicle Management System," and in U.S. Pat. No. 9,488,979, entitled "System And Method For Human Operator Intervention In Autonomous Vehicle Operations," U.S. patent application Ser. No. 14/966,265, entitled "Decentralized Air Traffic Management System For Unmanned Aerial Vehicles," and U.S. patent application Ser. No. 15/229,099, entitled "Vision Based Calibration System for Unmanned Aerial Vehicles," each of which are incorporated by reference herein in their entireties.

Figure 18A:
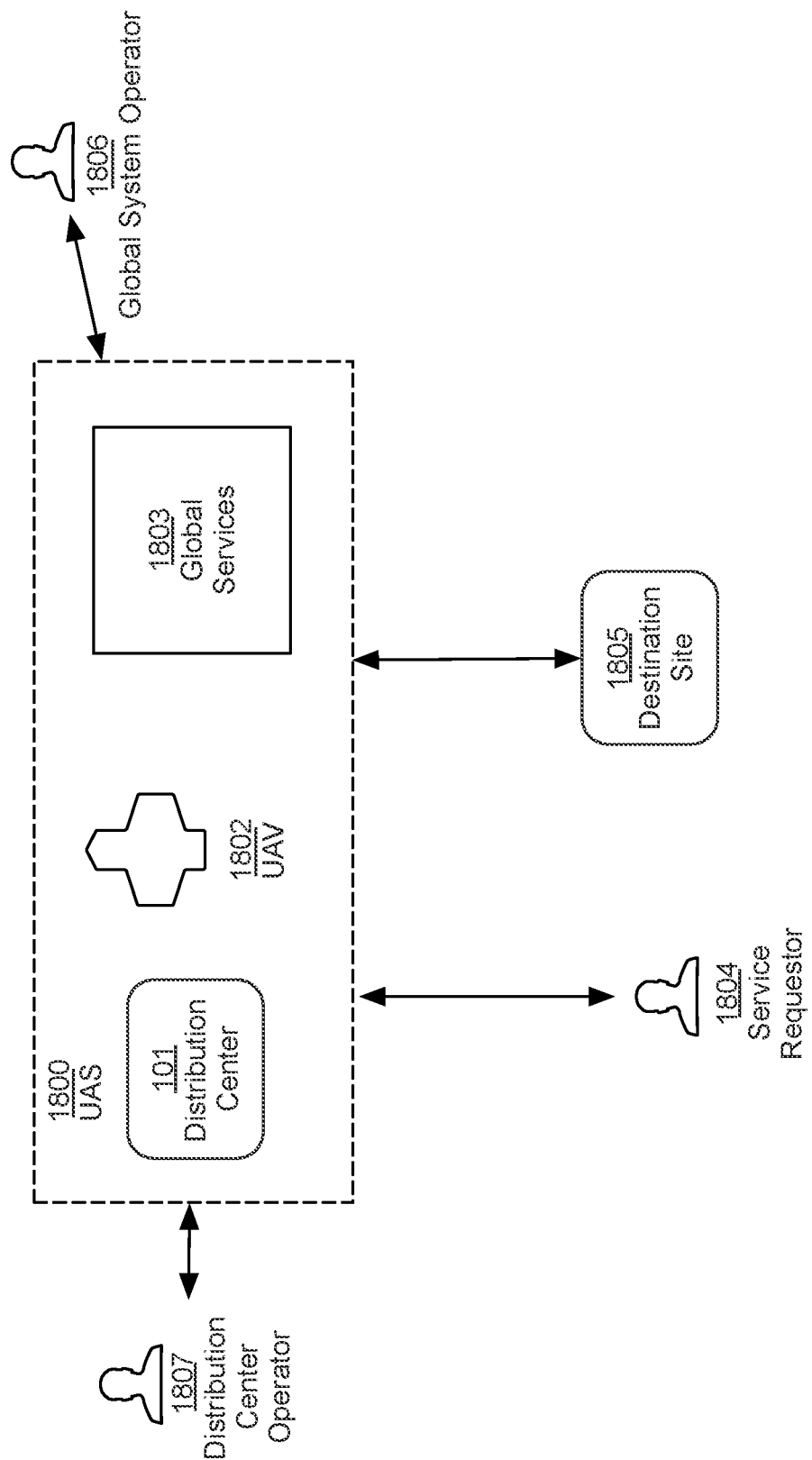
FIG. 18A is a diagram illustrating the components of an unmanned aerial system (UAS) and entities that may interface with it.

FIG. 18A illustrates an embodiment of a UAS and interfacing entities. The UAS 1800 receives a service request from a service requestor 1804 and deploys a UAV 1802 (e.g., the UAV 100, FIG. 1) to fulfill that request. In this embodiment, the UAS 1800 comprises a distribution center 1801, a UAV 1802, and global services 1803. Although a single UAV 1802 is depicted in FIG. 18A, there may be more than one UAV 1802 in a UAS 1800. As noted above, the UAVs in a UAS may include multiple UAVs such as those described above, as well as other types of UAVs (e.g., multi-rotor aircraft, balloons, lighter-than-air vehicles, etc.).

The service requestor 1804 may be a human user or an autonomous system that issues a service request to the UAS 1800. In the case where the service requestor 1804 is a human user, that user may use a remote client device such as a mobile phone, tablet, or personal computer to issue the request. A service request is an instruction to the UAS 1800 to provide some service at the destination site 1805. The destination site 1805 may be any designated location, such as a portion of open ground, a building, a mailing address, a GPS coordinate, or a slice of airspace. In some embodiments, the destination site 1805 is the location of a beacon device. The beacon device may be any device that emits a signal that can be used to track or identify a location, such as for example a transponder, a mobile phone, etc. The destination site 1805 may also be designated by identifying a particular object, such as, for example, a designated vehicle, a mailbox, a delivery pad, or some other target object that can be tracked to indicate a target location for a service. In another embodiment, the destination site 1805 is the location of the service requestor 1804, although this need not be the case. Although one service requestor 1804 and one destination site 1805 are illustrated in this embodiment, in practice there can be many service requestors 1804 and destination sites 1805.

The requested service may be any service that can be provided from an airborne platform. For example, in one embodiment, the service request issued by the service requestor 1804 is a request to deliver a package containing a specific payload to the destination site 1805. In another embodiment, the service request is a request to capture image data using a camera mounted on the UAV 1802, at the destination site 1805 or along a route to and from the destination site 1805. In yet another embodiment, the service request is a request to provide an Internet access point at the destination site 1805 using a Wi-Fi gateway mounted on the UAV 1802. Many other services can be provided using the UAS 1800 at the destination site 1805, such as package pickup, surveillance, mapping, data capture using UAV-mounted instruments, etc.

The distribution center 1801 may be a fixed or mobile facility that facilitates the launch, recharge, recovery, communications, repair, and payload logistics for the UAV 1802. The distribution center 1801 is explained in further detail in the description for FIG. 20. Although a single distribution center 1801 is shown in FIG. 18A, there may be more than one distribution center 1801 in the UAS 1800. In one embodiment, each UAV 1802 in the UAS 1800 is based at a single distribution center 1801, and is repaired, reloaded, and recharged at that distribution center 1801. In another embodiment, each UAV 1802 can be repaired, reloaded, and recharged at any distribution center 1801 in the UAS 1800, and UAVs 1802 may be routed between distribution centers 1801 based on the logistical requirements of current service requests and the projected requirements for future service requests.

The global services 1803 may be comprised of one or more computer server systems, running software services (i.e. computer software programs), accessible through the Internet, which provide offsite support, administration, air traffic control, communications, data storage and logistics functions for the distribution centers 1801 and the UAVs 1802. In one embodiment, the global services 1803 route a service request from a service requestor 1804 to a distribution center 1801 that is geographically adjacent to (or in relative geographic proximity to) the destination site 1805. The global services 1803 are explained in more detail in the description for FIG. 21.

The global system operator 1806 may be a human user that monitors and operates the UAS 1800 to ensure the correct and efficient functioning of the system. For example, in some embodiments, the global system operator 1806 may monitor the UAS 1800 through the computer servers of the global services 1803, to ensure that a distribution center 1801 has the appropriate payload in stock to fulfill a service request from a service requestor 1804. In one example embodiment, the global system operator 1806 may use the global services 1803 to route new stock of a particular payload to a distribution center 1801 in anticipation of that payload stock being depleted.

There may be more than one global system operator 1806, and the global system operators 1806 may monitor and provide services for multiple distribution centers 1801, UAVs 1802, and service requesters 1804. In some embodiments, one or more of the global system operators 1806 are trained UAV pilots, and the UAS 1800 may hand over control of a UAV 1802 to one such operator, temporarily or for the duration of a UAV mission.

The distribution center operator 1807 is a human user that monitors and operates the distribution center 1801. The distribution center operator 1807 may ensure that the UAS 1800 components that are local to the distribution center 1801 function correctly. This includes the UAVs 1802 based at the distribution center 1801, as well as other components such as launchers, rechargers, payloads, etc. The distribution center 1801 provides systems and methods to facilitate the tasks of the distribution center operator 1807. For example, in some embodiments, the distribution center operator 1807 operating a distribution center 1801 is provided with an operator interface that allows her to determine the inventory of each type of payload at that distribution center 1801, and that enables her to order more of any type of payload that is in short supply. The distribution center systems and methods that facilitate the distribution center operator 1807's work are explained in more detail in the description for FIG. 21.

FIG. 18B illustrates one embodiment of a UAV launch process implemented by the UAS 1800. As an initial step the global services 1803 of the UAS 1800 receive 1850 a service request from a service requester 1804. The service request specifies a destination site 1805, which designates the location where the service is to be delivered. As described herein, the service request may also include payload information, corresponding to a payload requested by the service requester. The global services 1803 then select 1851 a suitable distribution center 1801 from which to fulfill the service request. In some embodiments, the global services 1803 select 1851 the distribution center 1801 from which to fulfill the service request by determining the distribution center 1801 that is closest to the location of the destination site 1805. In another embodiment, the global services 1803 select 1851 a distribution center 1801 to fulfill the service request by taking into account both the proximity of the distribution center 1801 to the destination site 1805 as well as an inventory at the distribution center 1801 that indicates the availability of a payload specified in the service request. For example, if the service request is a request to deliver a specific type of item to the destination site 1805, the global services 1803 will select the distribution center 1801 from those distribution centers that are near the destination site 1805 and have the requested item in their inventory. Other factors can also be used to select a distribution center 1801, such as, for example, the local weather conditions and air traffic at the distribution centers 1801.

Once a distribution center 1801 is selected 1851, at least a portion of the information in the service request is sent 1852 to that distribution center 1801. In addition to the destination site location and payload information, the service request may contain other information that is useful at the distribution center 1801 for the fulfillment of the service request. For example, in some embodiments, the service request further comprises a time designating when the service request should be fulfilled at the destination site 1805.

A UAV 1802 can be selected 1853 to fly a mission to fulfill the request, either during the distribution center selection process or afterwards. The UAV 1802 that will fly the mission may be selected 1853 based on one or more criteria that are relevant to the service request and/or system efficiency. For example, in one embodiment, the UAV 1802 is selected 1853 based on the charge level of its battery and the distance to the destination site 1805. In another embodiment, the UAV 1802 is selected 1853 based on the instruments that are installed on its airframe and a type of data capture specified in the service request. In yet another embodiment, the UAV 1802 is selected 1853 based on a package in its payload matching a package specified for delivery in the service request.

In an alternative embodiment, the UAS 1800 does not select from pre-configured UAVs for a given mission. Instead, either the distribution center 1801 or the global services 1803 determine a set of components that are required to complete the service request, and the distribution center 1801 causes a UAV comprising the required components to be assembled for the mission. For example, if the destination site 1805 is a certain distance from the distribution center 1801, the UAV for the mission can be configured with a suitable battery pack to complete a round-trip flight to that destination.

The selection 1853 of the UAV 1802 may occur after the selection 1851 of the distribution center, or may be used as a factor in selecting 1851 the distribution center 1801. For example, the distribution center 1801 may be selected 1851 from only those distribution centers that have a particular type of UAV airframe, UAV battery (e.g., power module 122, FIG. 1A), or UAV motor, based on the weight of a payload required by the service request.

Once the UAV 1802 is selected 1853 for the mission, mission data is generated 1854 for it. The mission data is information that enables the UAV 1802 to navigate to the destination site 1805 and fulfill the service request. In some embodiments, the mission data includes GPS coordinates for the destination site 1805 as well as flight corridor information facilitating navigation to those GPS coordinates. The flight corridor information is discussed in more detail in the descriptions for FIG. 19A and FIG. 20. Further details related to the mission data are discussed in the descriptions for FIG. 19A, FIG. 20, and FIG. 21. After the mission data is generated 1854, it is uploaded into a database on the UAV 1802.

Once the mission data is generated and uploaded 1854, the UAV 1802 is launched 1855. From the time the UAV 1802 is launched and until it lands again, it is considered to be on a mission to complete the service request. In one embodiment, the UAV 1802 may be launched with a mission to fulfill more than a single service request. In another embodiment, at least a part of the mission data is uploaded and perhaps even generated, after the UAV 1802 is launched 1855.

Figure 19A:
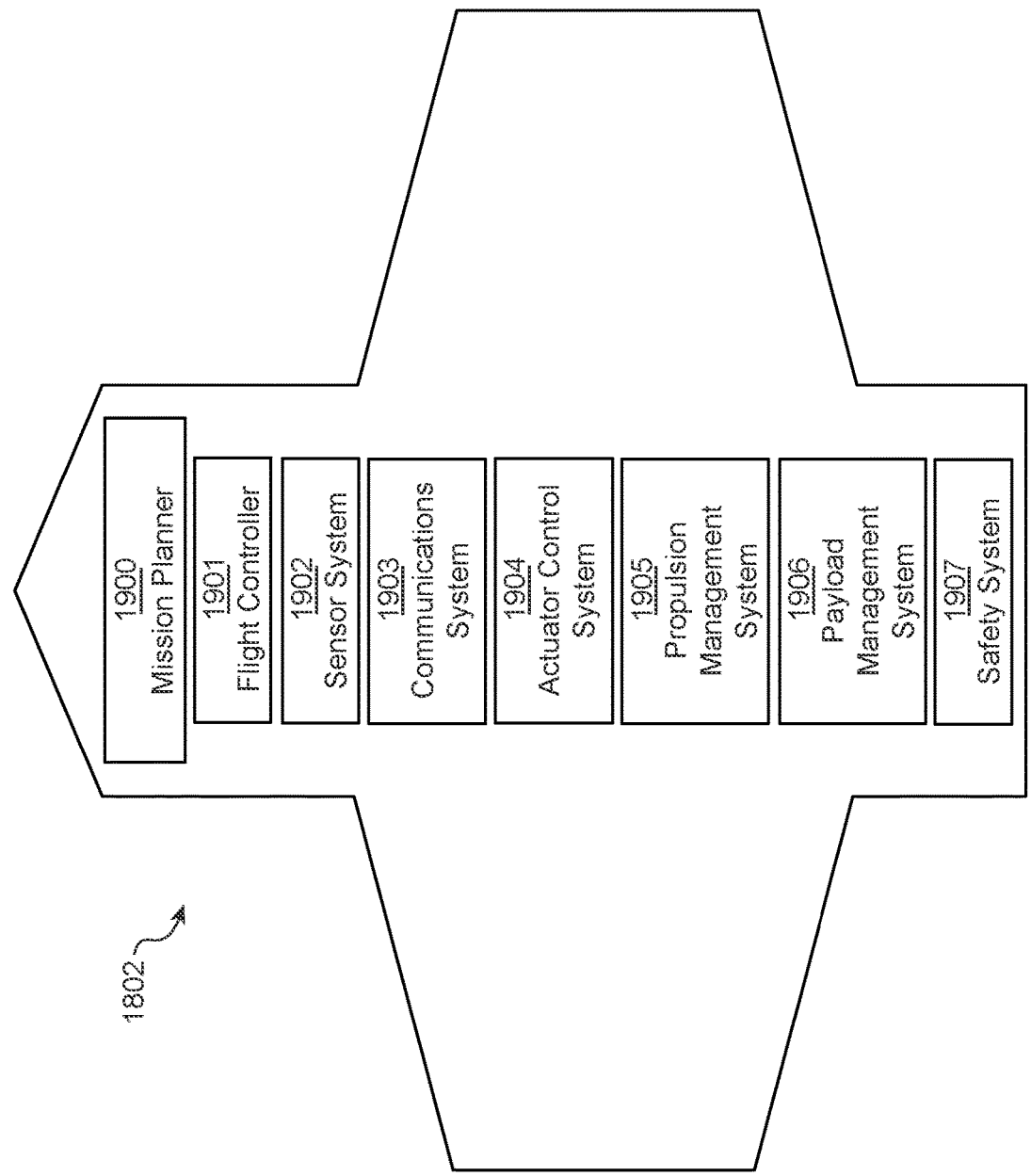
FIG. 19A is a diagram illustrating the components of a UAV.

FIG. 19A is a block diagram of a UAV 1802 according to one example embodiment. The UAV 1802 is an aircraft system with hardware and software modules that enable it to fulfill service requests with little or no human supervision. In one embodiment, the UAV 1802 corresponds to the UAV 100, described above.

The embodiment of the UAV 1802 illustrated in FIG. 19A comprises a mission planner 1900, a flight controller 1901, a sensor system 1902, a communications system 1903, an actuator control system 1904, a propulsion management system 1905, a payload management system 1906, and a safety system 1907. The foregoing systems (also referred to as modules) of the UAV 1802 may include and/or interact with physical components of the UAV 1802. For example, the flight controller 1901 may be implemented at least in part by a processor that is part of an integrated coupling and control unit 401, as described above. As another example, the sensor system 1902 may include sensors that are coupled to the fuselage of the UAV 100, as well as a processor that is part of an integrated coupling and control unit 401. Operations performed by the foregoing systems of the UAV 1802, including algorithmic and/or logical operations, may be implemented at least in part by a processor, memory (e.g., non-transitory computer readable storage media), and/or other components that are part of the integrated coupling and control unit 401.

Although not depicted in the figure, the modules of the UAV 1802 may be interconnected via at least one communications bus. The bus allows the modules to communicate with each other to receive and send information and commands. The bus may be implemented using any of the methods known to those with familiarity in aviation and vehicle engineering. For example, the bus may be implemented using the Controller Area Network (CAN) standard. To improve the reliability of the system, embodiments may use additional redundant buses. For example, a dual-CAN bus can be implemented to prevent a bus failure from causing the UAV to lose control.

The mission planner 1900 is a module that provides the other modules of the UAV 1802 with high-level directives and goals; the execution of these directives and goals causes the UAV 1802 to fulfill a service request. The goals and directives produced by the mission planner 1900 are communicated to the other modules of the UAV 1802, which may then take other actions to complete a mission, including the generation of additional directives and goals for other modules of the system.

For instance, in one embodiment, the mission planner 1900 determines a set of waypoints that the UAV 1802 may traverse in order to reach a destination site 1805, and provides the location of a first waypoint to the flight controller 1901 as a goal, along with a directive to fly to that location. In this embodiment, the flight controller 1901 may then, in turn, compute the orientation and propulsion needed to move the UAV 1802 towards the goal location; the flight controller 1901 may also generate further directives for other modules, such as, for example, for the actuator control system 1904 and for the propulsion management system 1905. The directives sent to the actuator control system 1904 and the propulsion management system 1905 may cause them to take actions that change the orientation of the UAV 1802 and propel it towards the goal location. As a result of the actions taken by various modules in the UAV 1802 in response to the directives and goals of the mission planner 1900, the UAV 1802 will fly to the designated first waypoint. Once that goal is achieved, the mission planner 1900 may send new goals and directives to the other modules, such that the UAV 1802 flies to a second waypoint, and a third waypoint, and so on, until the higher-level goal of reaching the destination site 1805 is fulfilled.

Besides movement directives, the mission planner 1900 may issue other directives to the modules of the UAV 1802 that cause actions such as dropping of a payload, capturing of image data, transmitting of data, etc. The mission planner 1900 may also receive commands from the global services 1803, from human operators, or from third-party controllers (such as air traffic controllers), and may issue directives to the UAV 1802 modules based on these commands. For instance, in one example embodiment, the mission planner 1900, on board a UAV 1802, may receive a command from a human operator to fly back to a distribution center 1801 due to an approaching storm. In response to this command, the mission planner 1900 will produce new goals and directives that are sent to other modules in the UAV 1802, and as a result of these new goals and directives, the UAV 1802 will change course and return to the distribution center 1801.

The mission planner 1900 is provided with mission data prior to the launch of the UAV 1802 from the distribution center 1801. The mission data includes information that enables the mission planner 1900 to locate the destination site 1805, to determine an appropriate route to that location, and to perform any request-specific actions required to complete the service request. For example, in some embodiments, the mission planner 1900 is provided with a destination location, a route to the destination location, and a series of points along the route where images are to be captured with an on-board camera.

In some embodiments, the mission data includes a local skymap for an area of operation. The area of operation may be a geographic region that encompasses the distribution center 1801 and the destination site 1805. The local skymap includes information about a plurality of flight corridors within the area of operation. In some embodiments, the local skymap is generated from a global skymap, which contains information about flight corridors within a wider geographic area, by selecting the information in the global skymap that pertains to flight corridors within the area of operation.

A flight corridor may be an area of airspace that is designated by the UAS 1800 for UAV flight. The local conditions in a flight corridor may be monitored by the UAS 1800, and the flight corridors may be used by the UAVs 1802 to travel safely and efficiently between locations. The local skymap comprises information about each of a plurality of flight corridors. The information about each flight corridor may include, but is not limited to, data about the flight corridor's location, local wind conditions, local air traffic (i.e. other UAVs and aircraft within the flight corridor), precipitation, aerial hazards, geographic obstacles (e.g. Mountains), etc.

Using the information in the skymap, the mission planner 1900 develops a dynamic route from the distribution center 1801 to the destination site 1805, prior to launch or soon after launch. The dynamic route takes into account the goals of the mission as well as the requirement of the UAV 1802 to return to a distribution center 1801 after fulfilling the service request. In some embodiments, the mission planner 1900 receives a pre-generated route from the distribution center 1801 or the global services 1803, and modifies that route only as conditions in the skymap change over time.

The dynamic route may be a sequence of flight corridors that the UAV 1802 may traverse to fly from its present location to some goal location. As the UAV 1802 flies its mission, it may receive updates to the skymap from the UAS 1800, including updates concerning local conditions of the flight corridors in the area of operation. The updates may be received from the global services 1803, from the distribution centers 1801, or from other UAVs 1802. In some embodiments, updates may also be received from the service requestors 1804, or from third-parties, such as weather information providers, news services, air traffic controllers, satellites, civil aviation authorities, law enforcement, military aviation authorities, etc.

The mission planner 1900 may modify the dynamic route during the mission as the flight corridor updates are received. For example, in some embodiments, the mission planner 1900 may alter the dynamic route to avoid flight hazards such as inclement weather, aircraft trespassing into a flight corridor, etc. When the route is modified, the mission planner 1900 will re-determine the sequence of flight corridors that will be traversed to reach the goal location.

Figure 19B:
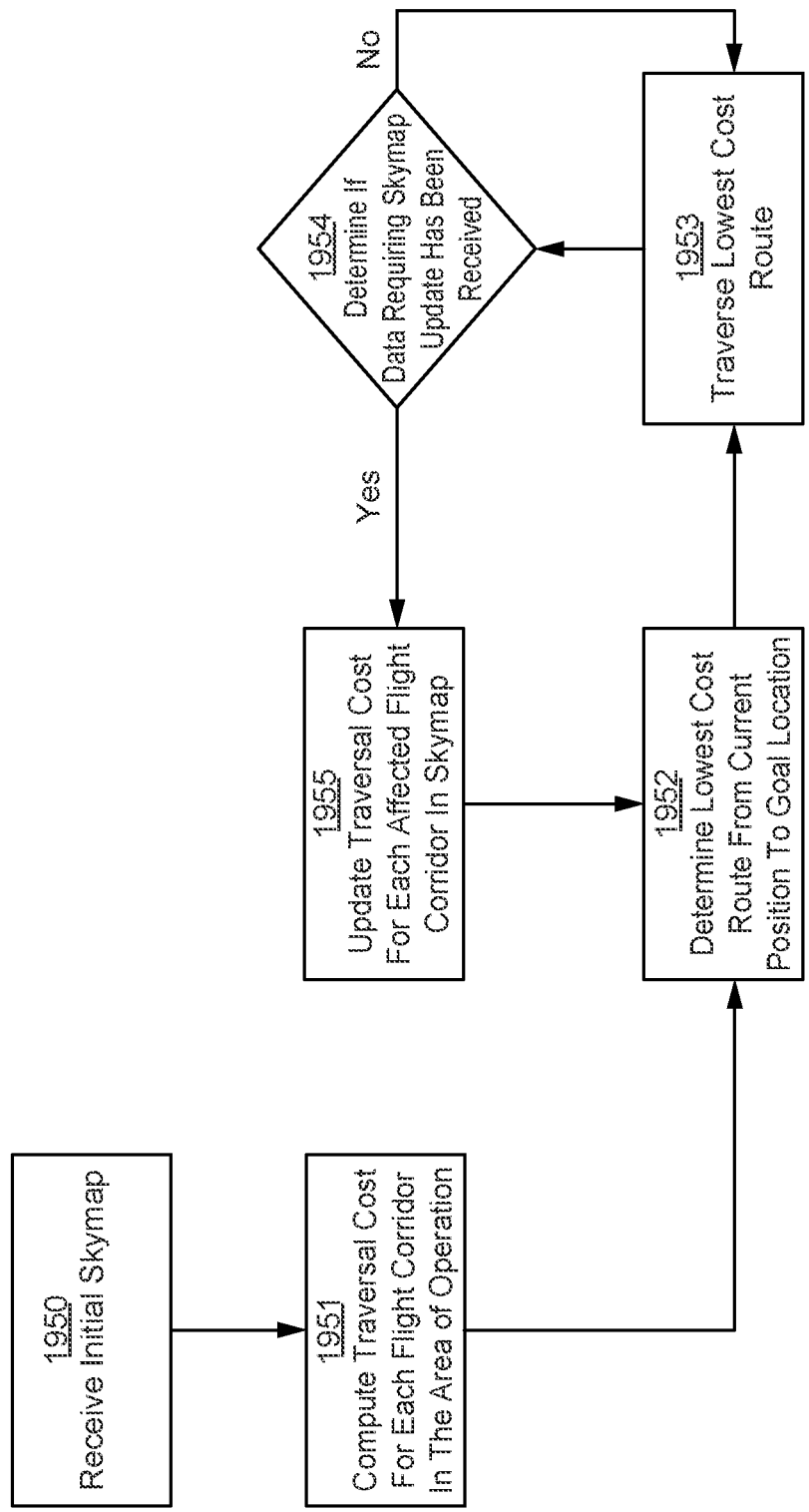
FIG. 19B is a diagram illustrating the process for rerouting a flight.

FIG. 19B illustrates one embodiment of the mission planner 1900's dynamic routing process for a goal location. In the illustrated process the UAV 1802 first receives 1950 an initial local skymap. The skymap may be received prior to launch or after launch. In one embodiment, a skymap is received from the global services 1803 directly. In another embodiment, a skymap is received from the distribution center 1801.

In one embodiment, the skymap that is provided to the UAV 1802 is a global skymap that contains data about the entire area that the UAS 1800 covers. In another embodiment, the skymap contains information about only the area of operation for the UAV 1802's current mission.

Once the skymap is received 1950 the mission planner 1900 computes 1951 a traversal cost for each flight corridor in the area of operation. The traversal cost for a flight corridor is a measure of the suitability of the corridor's path for a flight to the goal location. The goal location may be any point that the UAV 1802 must traverse to complete its mission. For example, the destination site 1805 may be the goal location on the outward leg of the UAV 1802's mission, while the distribution center 1801 may be the goal location on the return leg of the UAV 1802's mission. The traversal cost of a flight corridor may take into account many factors, including but not limited to, the wind speed and weather in the flight corridor, the air traffic within the flight corridor, the length and elevation of the flight corridor, and the number and direction of maneuvers required to navigate the flight corridor. The traversal cost for a flight corridor may take into account the predicted energy consumption necessary to fly the UAV 1802 along the flight corridor's path. Flight corridors that are predicted to require greater energy to traverse may be assigned a greater traversal cost than flight corridors that require less energy. For example, a flight corridor that has a tailwind may have a lower traversal cost than a flight corridor with a headwind. The traversal cost may also take into account regulatory limits to flight paths. For example, if a flight corridor intersects an area that has been temporarily designated as a no-fly zone by the local aviation authority, the traversal cost for that flight corridor may be set to infinity until the no-fly restriction is lifted.

In some embodiments, the traversal cost for flight corridors is pre-computed by the global services 1803 or the distribution center 1801, and is included in the skymap received 1950 by the UAV 1802.

After the traversal cost for each flight corridor in the skymap is computed 1951 the mission planner 1900 determines 1952 a lowest cost route from the UAV 1802's current position to the goal location, using the flight corridors. Any appropriate path-finding and/or graph traversal algorithms can be used to find the lowest cost route.

Once the lowest cost route is determined 1952, the UAV 1802 may traverse 1953 the lowest cost route. As the UAV 1802 flies to the goal location, it may periodically receive information from the global services 1803, the distribution centers 1801, other UAVs 1802, and third party information sources (such as weather services, aviation authorities, etc.). Any of the data received from such sources may constitute a local skymap update, in the sense that the traversal cost of one or more flight corridors in the area of operations may need to be changed. For example, if the weather in a particular region changes, the traversal cost of flight corridors in that region may increase or decrease depending on the wind in those flight corridors and the direction that the UAV 1802 must fly.

The mission planner 1900 will determine 1954 whether a given piece of data received by the UAV 1802 constitutes a local skymap update by applying rules and heuristics to the received information. For example, in some embodiments, if the mission planner 1900 receives information that pertains to regions outside the area of operations, it may determine that this information does not constitute a local skymap update.

Some information that the UAV 1802 receives may be filtered out from consideration because it is not related to factors that may affect the flight of an aircraft. For example, if the UAV 1802 receives information regarding inventory levels at a distribution center 1801, this information may be stored or forwarded, but it will not influence the local skymap, since inventory levels will not influence the traversal cost of flight corridors. (Note, however, that changing inventory levels may influence the mission planner 1900's selection of a goal destination. For example, after a service request has been fulfilled, a UAV 1802 may be routed to land at a distribution center 1801 where there are insufficient UAVs in the inventory for future missions, as opposed to the distribution center that it took off from.)

As long as the mission planner 1900 determines 1954 that no data requiring an update to the local skymap has been received, the UAV 1802 continues to fly on the lowest cost route that has already been determined 1952. However, if a local skymap update has been received, then the mission planner 1900 will update 1955 the traversal cost for each affected flight corridor in the local skymap.

The mission planner 1900 may then re-determine 1952 the lowest cost route to the goal location based on the updated traversal costs of the flight corridors in the local skymap.

As illustrated in FIG. 19A, the UAV 1802 also includes a flight controller 1901. The flight controller 1901 provides the mission planner 1900 with guidance, navigation, and control functions. For example, the mission planner 1900 is required to know the location, orientation, altitude, and speed of the UAV 1802 at various times during the mission, and the flight controller 1901 provides this information through a process called state estimation. Similarly, when the mission planner 1900 requires the UAV 1802 to move from one point to another, it sends commands to the flight controller 1901 to achieve that goal. The flight controller 1901 communicates over the bus with the sensor system 1902, the actuator control system 1904, and the propulsion management system 1905, to provide the guidance, navigation, and control functions.

The sensor system 1902 provides information from sensor instruments to the flight controller 1901. In some embodiments, the sensor system 1902 comprises several instruments, such as, for example, a Global Positioning System (GPS) unit, an Inertial Measurement Unit (IMU), dynamic pressure sensor, static pressure sensor, air temperature reader, etc., any or all of which may be attached to the circuit board 1102 (FIG. 11A), or any other component of the integrated coupling and control unit 401.

The actuator control system 1904 includes motorized actuators (or actuators that are moved by any other means, such as hydraulics) that control various moving parts on the UAV 1802, including the flight control surfaces on the UAV 1802 (e.g., the flight control surfaces 116, 118, FIGS. 1A-1B). The actuator control system 1904 can change the state of the motorized actuators based on commands from the flight controller 1901. The actuator control system 1904 can also report the current state of the motorized actuators back to the flight controller 1901.

The propulsion management system 1905 controls the force exerted by the motor mounted on the UAV 1802 (e.g., the motor module 108, FIG. 1A)—for example by adjusting the speed of propellers mounted on a propeller powered UAV—and monitors the amount of fuel and/or battery capacity remaining on the UAV. The flight controller 1901 can adjust the speed of travel of the UAV 1802 by communicating with the propulsion management system 1905.

The flight controller 1901 receives information from the sensor management system 1902 and the actuator control system 1904, and performs a state estimation that provides a best guess of the UAV 1802's position, orientation, and speed to the mission planner 1900. The state estimation is continuously updated and checked as the various systems of the UAV 1802 provide new information.

The mission planner 1900 determines the high-level goal location that the UAV 1802 must travel to and communicates the goal location to the flight controller 1901. The mission planner 1900 may communicate commands and goals to the flight controller 1901 using any appropriate technique(s). For example, in one embodiment, the mission planner 1900 communicates movement goals to the flight controller 1901 via a sequence of waypoints. In another alternative embodiment, the mission planner 1900 communicates movement goals to the flight controller 1901 via splines.

The flight controller 1901 receives the movement goals—as waypoints, splines, or any other suitable form—and determines, based on rules or physics-based models, the commands that must be communicated to the actuator control system 1904 and the propulsion management system 1905 to achieve the movement goals. For example, according to some embodiments, the physics-based models output the required rudder and elevator state, and the motor thrust for the UAV 1802, based on the current state estimation (i.e. the UAV 1802's position, orientation, and speed), and the local conditions including wind and temperature.

The communication system 1903 comprises transmitters and receivers that enable the UAV 1802 to send and receive information using different communications protocols. The communication system 1903 may include transmitters and receivers for standard cellular radio technologies such as CDMA, GSM, 3G/4G, LTE, etc., as well as custom line-of-sight and mesh protocols that allow the UAV 1802 to directly communicate with a distribution center 1801 or another UAV 1802.

Although the UAV 1802 is designed to operate autonomously, the mission planner 1900 is configured to receive instructions via the communications system 1903 that may override the mission planner 1900's flight plans. For example, the UAV 1802 may receive instructions from a distribution center 1801 or the global services 1803 that command the UAV 1802 to return to base immediately due to bad weather or a passenger aircraft entering the area. On receiving such a command the mission planner 1900 will change the movement goals of the UAV 1802 and issue new directives to the other modules so that the UAV 1802 adjusts its flight path as necessary.

The payload management system 1906 performs various functions related to the payload carried by the UAV 1802, depending on the nature of the service request and the payload. For example, when the payload is attached to the UAV 1802 prior to launch, the payload management system 1906, will communicate that the attachment is successful to the mission planner 1900 and/or the distribution center 1801. In the case where the service request is a package delivery, the payload management system 1906 also monitors the state of the payload—for example the temperature of the payload in the case where the payload is perishable—and manages the release of the payload at the destination site 1805. In this example, the mission planner 1900 determines the location, altitude, speed, and orientation of the UAV 1802 required to drop the payload safely at the destination site 1805, and communicates a command to release the payload at the appropriate time to the payload management system 1906. The payload management system 1906 receives the command and releases the payload.

The payload management system 1906 may perform other functions depending on the nature of the payload. For example, in the case where the service request is related to surveillance or mapping, the payload management system 1906 may interface with a camera system included in the payload and can capture images or video based on instructions received from the mission planner 1900. For instance, in this embodiment, the mission planner 1900 may issue a command to the payload management system 1906 to capture images when the UAV 1802 flies over some point of interest in its route.

The safety system 1907 manages various failsafe components mounted on the UAV 1802. For example, in one embodiment, the safety system 1907 monitors and controls a parachute system (e.g., the deployable parachute system 1400, FIG. 14A-14D) that may be deployed based on a command received from the mission planner 1900, or based on information received directly from the flight controller 1901 or sensor system 1902. For instance, if the UAV 1802 enters a non-recoverable dive, the safety system 1907 may deploy the parachute based on data received from the sensor system 1902. In another embodiment, the mission planner 1900 may instruct the safety system 1907 to deploy a parachute based on a message received from the global services 1803 or a distribution center 1801. Parachute deployment on command may be useful in situations where an air traffic control process detects the possibility of imminent collision between multiple aircraft in an area with heavy air traffic. Forcing a UAV 1802 to deploy its parachute and descend may prevent it from entering the flight path of other aircraft.

The structure and functionality of the UAV 1802 described above has been divided into modules based on one example implementation, but the functionality of various modules may be merged or further split such that there are more or less components than have been illustrated in FIG. 19A. It is also possible to devolve some of the functionality of the various modules directly into the actuators, sensors, and other hardware components of the UAV 1802. For instance, the flight controller 1901 may communicate directly with a plurality of actuator motors, each of which has the functionality of the described actuator control system 1904. Such a decentralization of hardware component control may be beneficial in some implementations from the point of view of fault-tolerance.

As noted above, the distribution center 1801 handles the local logistics for the UAS 1800. When the global services 1803 receive a service request from a service requestor 1804, the global services 1803 will select a distribution center 1801 to fulfill the service request according to criteria in the service request, including the location of the destination site 1805. The global services 1803 will then send at least a portion of the information in the service request to the selected distribution center 1801.

The distribution center 1801 is responsible for launching and recovering UAVs 1802, maintaining and monitoring inventories of payloads and UAVs 1802, and communicating local information to the global services 1803. Other functions such as UAV or component selection for missions, mission data preparation, UAV monitoring and communication during the mission, and other tasks can be performed by either the distribution centers 1801 or the global services 1803, depending on implementation and/or system status. A distribution center operator 1807 may be stationed at the distribution center 1801 to facilitate the distribution center operations.

Figure 20:
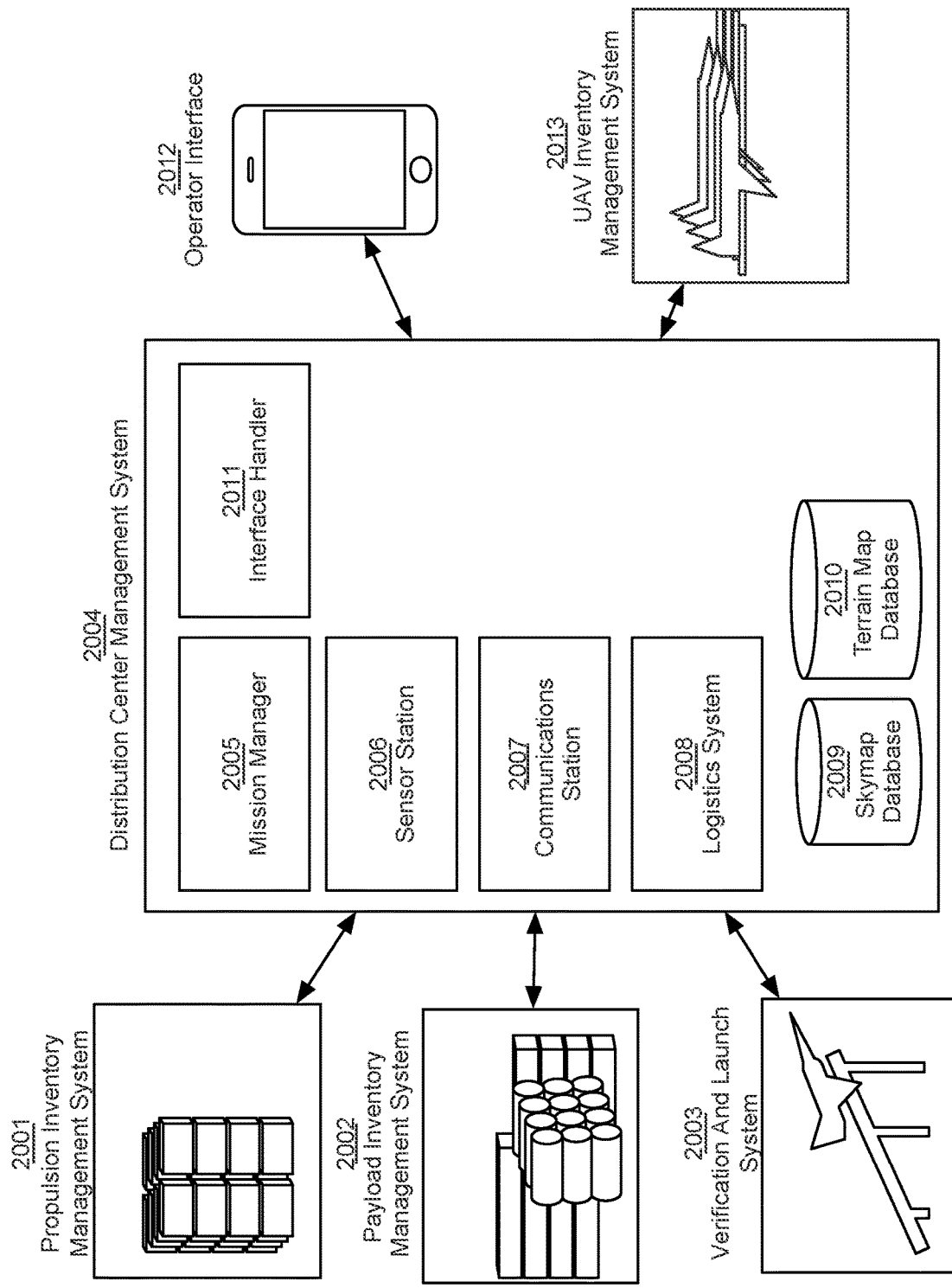
FIG. 20 is a diagram illustrating the components of a distribution center.

FIG. 20 is a block diagram of a distribution center 1801, according to one example embodiment. As mentioned previously, some of the functions performed by this embodiment of the distribution center 1801 could be performed by the global services 1803 instead. Similarly, some of the functions of the global services 1803 could be performed locally by the distribution center 1801. System designers with skill in the art may divide the functionality of the global services 1803 and the distribution centers 1801 in any appropriate way based on the requirements of a particular UAS implementation.

In this embodiment, the distribution center 1801 is comprised of a propulsion inventory management system 2001, a payload inventory management system 2002, a verification and launch system 2003, a distribution center management system 2004, an operator interface 2012, and a UAV inventory management system 2013.

The distribution center management system 2004 serves as the hub of the distribution center 1801. In this embodiment, the distribution center management system 2004 comprises a mission manager 2005, sensor station 2006, communications station 2007, logistics system 2008, skymap database 2009, terrain map database 2010, and interface handler 2011. In one example embodiment, the distribution center management system 2004 is implemented using one or more computer servers that have specialized sensor and communications peripherals installed.

Some of the functions of the distribution center 1801 may require the assistance of a human distribution center operator 1807. For example, UAV assembly, UAV repair, payload attachment and detachment, UAV recovery, battery replacement, and refueling are tasks that may require human involvement if they are not fully automated. The operator interface 2012 allows the distribution center operator 1807 to receive information and instructions from the distribution center management system 2004 and the global services 1803, as well as to send information and instructions back to the distribution center management system 2004 and the global services 1803. The distribution center management system 2004 communicates with the operator interface 2012 via the interface handler 2011. In some embodiments, the operator interface 2012 is an application running on a smartphone, a tablet computer, or a personal computer, and the interface handler 2011 communicates with the application via a wireless communications protocol, such as IEEE 302.11.

The mission manager 2005 is a module that is responsible for managing the local aspects of mission operations at the distribution center 1801. In some embodiments, the mission manager 2005 receives service requests (or data derived from the service requests) from the global services 1803, selects a UAV 1802 or UAV components that will be assembled into a UAV 1802, prepares the mission data that will be utilized by the UAV 1802 during the mission, selects an appropriate payload for the mission, tests and launches the UAV 1802, and monitors the status of the UAV 1802 and payload during the mission. The mission manager 2005 communicates with the distribution center operator 1807 via the operator interface 2012 during various stages of the mission to communicate both the status of the mission, as well as instructions indicating the actions to be taken to facilitate the preparation, loading, launch, and recovery of UAVs 1802.

The mission manager 2005 utilizes the other components of the distribution center management system 2004 to monitor the status of the local environment and various local components of the UAS 1800, including the UAVs 1802 and the local inventories.

The mission manager 2005 maintains contact with the global services 1803 and local UAVs 1802 through the communications station 2007. Information about service requests is received from the global services 1803, and information about local conditions, ongoing missions, inventories, etc., is transmitted back to the global services 1803. The communications station 2007 may have transmitters and receivers for several different standard telecommunications protocols, including, but not limited to GSM, CDMA, GSM, 3G/4G, LTE, etc. In addition to these standard protocols, the communications station 2007 may also support line-of-sight or mesh protocols to enable direct communications with UAVs 1802 and other distribution centers 1801. Finally, the communications station 2007 may also include a wired connection to the Internet for high-speed communication with the other components of the UAS 1800 and third-party information providers. The mission manager 2005 may send some of the information received via the communications station 2007 to the operator interface 2012, so that the distribution center operator 1807 can monitor the status of UAVs 1802 or other components of the UAS 1800 that are relevant to a local mission.

The sensor station 2006 is primarily used to gather local weather data for the distribution center 1801's location. The sensor station 2006 may include pressure sensors, thermometers, wind sensors, precipitation detectors, etc. The sensor station 2006 may also be used to detect and track UAVs 1802 using instruments such as radars, radio trackers, and optical object recognition systems. The mission manager 2005 may present information from the sensor station 2006 to the distribution center operator 1807 via the operator interface 2012, so that the distribution center operator 1807 can take actions necessary to protect the UAVs 1802 and distribution center 1801 from inclement weather. For example, if the sensor station 2006 detects an approaching storm, the mission manager 2005 may display a notification to the distribution center operator 1807 via the operator interface 2012, and the operator 1807 can follow procedures to recover UAVs 1802 that have already been launched, to abort missions that have not been launched, and the like.

The logistics system 2008 tracks the inventory levels of various components at the distribution center 1801, and reports these inventory levels to the global services 1803 and the mission manager 2005. This inventory information may be used when selecting a particular distribution center 1801 to fulfill a service request.

The logistics system 2008 interfaces with the propulsion inventory management system 2001, the payload inventory management system 2002, and the UAV inventory management system 2013 to determine the inventory levels of fuel/batteries, payloads, and UAVs/UAV components, respectively. The logistics system 2008 is capable of requesting deliveries of additional stock when inventory levels fall below a threshold level or when inventory levels are predicted to fall below a threshold level within a specified period of time.

The global services 1803 may monitor the inventory levels reported by the logistics system 2008 and may proactively dispatch additional inventory items to a distribution center 1801 based on current inventory levels or the predicted inventory levels in the future. The logistics system 2008 may also directly notify the distribution center operator 1807 of inventory shortages, or of errors with specific items in an inventory, via the operator interface 2012. Based on these notifications, the distribution center operator 1807 may restock or repair items as needed.

Each item at the distribution center 1801 may be affixed with a tracking tag that can be monitored by the logistics system 2008. Various technologies can be used to implement the tracking tags, including bar codes, RFID tags, NFC tags, etc. These tags may be affixed to every item at the distribution center 1801 that requires tracking, including UAVs 1802, UAV components, payloads, batteries, spare parts, etc. The tags associate an object identifier with each tracked physical object at the distribution center 1801. For example, each payload at the distribution center 1801 will have an object identifier associated with it that is indicated by the tag affixed to it. The object identifier may be read from the tag by way of a reader that is configured to scan the tag. For example, an RFID tag would be read using an RFID reader, an NFC tag using an NFC reader, etc.

The object identifiers can be used to determine the type of an object that has been scanned as well as its unique identity. For example, the tag affixed to a payload object will identify that the object is a payload of a specific type, as well as that it is a specific instance of that payload, different from other payloads of the same type in the inventory. In some embodiments, the object identifier can be used to determine a database entry associated with the object in an inventory database.

The logistics system 2008 reports the inventory levels for objects associated with each object identifier to the global services 1803.

Propulsion related components of the UAV's, such as batteries and/or fuel, are stored and tracked by the propulsion inventory management system 2001. The propulsion inventory management system 2001 also has means for recharging batteries, refilling fuel tanks, etc. The propulsion inventory management system 2001 reports the inventory levels and status of fuel and/or batteries to the logistics system 2008. For example, the propulsion inventory management system 2001 may track not only the number of batteries stocked at a particular distribution center 1801, but may also track the level of charge in each of those batteries and the expected time for each battery to reach full charge. Additional properties of batteries may also be tracked, such as battery capacity, charge retention over time, etc.

The mission manager 2005 is made aware, via the logistics system 2008, of the battery charge levels and/or fuel available for UAVs prior to a mission launch. The mission manager 2005 determines the energy resources that are required for each UAV 1802 based on the service requests and may instruct the distribution center operator 1807 to replace batteries on a UAV 1802 or to refuel a UAV 1802 to ensure that the aircraft has sufficient energy to complete a mission. For example, the mission manager 2005 may instruct the distribution center operator 1807, via the operator interface 2012, to load a battery having a particular charge state onto a specific UAV 1802 prior to that UAV 1802 being launched on a mission.

The payload inventory management system 2002 tracks inventory levels and status for various payloads that may be mounted to the UAVs 1802. The payload inventory management system 2002 may also provide recharging, refrigeration, and other maintenance related functions related to specific payloads. For instance, if the payload is a vaccine, then the payload inventory management system may provide a refrigerated storage container for vaccine doses and may monitor and report the temperature in the storage container and the number of doses stored in the container to the logistics system 2008. The mission manager 2005 may notify the distribution center operator 1807 of the status of various payloads stored at the distribution center 1801 via the operator interface 2012. For example, in some embodiments, the mission manager 2005 may send a notification to the operator interface 2012 to notify the distribution center operator 1807 that a particular vaccine stored in the payload inventory management system 2002 has expired. Based on this notification the distribution center operator 1807 may remove the expired vaccine from storage and replace it with new stock.

The UAV inventory management system 2013 tracks the assembled UAVs 1802 and UAV components stored at the distribution center 1801, and reports this information to the logistics system 2008. The mission manager 2005 or global services 1803 may query the logistics system 2008 to determine the UAV resources available for missions at a particular distribution center 1801, and may allocate these resources based on the requirements of service requests received by the UAS 1800. When a particular UAV configuration is required to fulfill a mission, the mission manager 2005 may send instructions to the distribution center operator 1807, via the operator interface 2012, to assemble a particular set of UAV components—stored in the UAV inventory management system 2013—to construct a UAV suitable to complete that mission. As UAVs or UAV components are added and removed from the inventory, the UAV inventory management system 2013 tracks not only the availability of these resources, but also the status of components, such as their condition and need for replacement. This information may be used by the mission manager 2005 and the global services 1803 to order deliveries of new UAVs 1802 or components for the distribution center 1801.

The mission data that will be uploaded to the UAV 1802 is prepared based on the requirements of the service request received from the global services 1803. Although we discuss the preparation of the mission data by the mission manager 2005, alternative embodiments are possible, where either the global services 1803 or the mission planner 1900 onboard the UAV 1802, prepare the mission data. The mission data includes not only the location of the destination site 1805 and the payload required to satisfy the service request, but also information required to generate a flight route to the destination location. The information required for route generation is stored locally in the skymap database 2009 and the terrain map database 2010.

The skymap database 2009 contains data about a plurality of flight corridors in the geographic region served by the distribution center 1801. The skymap database 2009 may be at least partially synchronized with a global skymap database 2100 that is part of the global services 1803. The flight corridor data includes information about the real-time conditions within the flight corridors, such as weather, air traffic, etc. The local skymap database 2009 updates the flight corridor data based on the latest information received from the global services 1803, other distribution centers 1801, and third parties (such as weather services and air traffic controllers). UAVs 1802 that have recently flown in a flight corridor may also send data to the distribution center 1801 about the last monitored conditions present in the flight corridor, and this information may be used by the skymap database 2009 to update the relevant flight corridor data. When the local skymap database 2009 at the distribution center 1801 has more recent information about a flight corridor than the global skymap database 2100, the global skymap database 2100 is updated via the communications station 2007. The reverse is also true, and the latest updates from the global skymap database 2100 are received via the communications station 2007 and incorporated into the local skymap database 2009.

The terrain map database 2010 contains terrain data, which is information about the terrain and ground obstacles in the geographic region served by the distribution center 1801. This terrain data can be stored in a number of ways, including but not limited to, as raw images, as a heightmap, and as a three-dimensional (3D) mesh. The global services 1803 also include a global terrain map database 2101, which is at least partially synchronized with the local terrain map database 2010. As in the case with the skymap databases, the terrain map database 2010 is updated based on data captured from UAVs 1802 during their mission flights. For example, if a UAV 1802 flies over a location and captures information regarding a new obstacle that was not present at that location in the terrain map database 2010, the terrain map database 2010 will be updated with the new information via data received from the UAV 1802, either during the mission, or after the UAV 1802 has been returned to the distribution center 1801.

Although the information about the flight corridors from the skymap database 2009 may be sufficient to route the UAV 1802 to the destination site 1805, information about the ground that the UAV 1802 is flying over can also be useful during various phases of the mission. For instance, during UAV launch and recovery, the terrain and obstacles near the launch and recovery sites are relevant. In addition, if the service request requires a package delivery, then the terrain and obstacles at the destination site 1805 are relevant, as the UAV 1802's mission planner 1900 must determine a location from which to drop the payload such that the payload lands in an accessible place and does not damage local structures, objects, or persons.

The information from the terrain map database 2010 is also useful for fulfilling service requests that require surveillance or mapping. In some instances, the terrain data from the terrain map database 2010 can be used to fulfill a surveillance or mapping request without launching a UAV. For example, if a UAV 1802 has recently captured imagery at a destination site 1805 at a particular location, and a subsequent service request asks for image capture at the same location, within some threshold time limit, then the most recent information from the destination site 1805 that has been stored in the terrain map database 2010 can be sent to the service requestor 1804.

To prepare the mission data locally, the mission manager 2005 first determines the location of the destination site 1805 from the service request information received from the global services 1803. Based on this destination location, and the launch location, which is typically the location of the distribution center 1801, the mission manager 2005 determines the relevant area of operations for the mission, and extracts the data associated with this geographic region from the skymap database 2009 and the terrain map database 2010. The extracted information is sent to the UAV 1802 as part of the mission data. In some embodiments, the mission manager 2005 also provides the UAV 1802 with a lowest cost route to the destination site 1805 as part of the mission data. Depending on the implementation, the route can be dynamically updated by the global services 1803, the mission planner 1900 in the UAV 1802, and/or the mission manager 2005. When the connectivity to the UAV 1802 cannot be guaranteed during the mission flight, the mission planner 1900 onboard the UAV 1802 may be allowed to dynamically update the route. The process for dynamic route generation is explained in more detail in the description for FIG. 19B. In embodiments discussed in connection with FIG. 19B, the UAV 1802 receives the skymap data and determines the lowest cost route to the destination site 1805 using the onboard mission planner 1900, instead of receiving the route from the mission manager 2005.

In some embodiments, the UAV 1802 stores complete mirrors of the skymap database 2009 and the terrain map database 2010, instead of only subsets of the information in these databases. This can be done when the size of the databases is small enough that the storage resources on the UAV 1802 are sufficient to store the entire dataset. When this is not the case, a subset of the information may be stored in the UAV 1802, as described earlier. Similarly, in the case where the local skymap database 2009 and local terrain map database 2010 have sufficient storage capacity, the entire global skymap 2100 and global terrain map 2101 may be stored locally at the distribution center 1801. Subsets of the global data may be extracted and stored locally only when the global data sets are too large for complete local mirroring to be economical.

The verification and launch system 2003 is responsible for testing, verification, and launching of UAVs 1802. The UAVs 1802 are loaded into the verification and launch system 2003, and their components are tested to ensure that they will perform during the mission. Any faulty components are identified at this stage and brought to the attention of the distribution center operator 1807 via the operator interface 2012. The verification and launch system 2003 also verifies, via the affixed tags, that each component in the assembled UAV 1802 is a component allocated by the mission manager 2005 for the current mission. For example, the verification and launch system 2003 detects the battery and motors attached to the UAV 1802, and ensures that they have adequate charge and performance for the mission, prior to launch. Any discrepancies are brought to the attention of the distribution center operator 1807 for correction. Similarly, the verification and launch system 2003 verifies that the payload loaded onto the UAV 1802 is the right payload for the current mission.

Once the verification and launch system 2003 verifies the UAV 1802, the UAV 1802 is launched, and the mission manager 2005 continues to monitor the aircraft during the mission flight. The mission manager 2005 receives status updates from the UAV 1802, and these status updates enable the mission manager 2005 to track the progress of the mission at least intermittently. The mission manager 2005 may present information related to the UAV 1802's status to the distribution center operator 1807 via the operator interface 2012. In the event that there is some local event that requires a mission termination, such as, for example, an approaching storm, either the mission manager 2005 or the distribution center operator 1807 (or both), via the operator interface 2012, can send a command to the UAV 1802, through the communications station 2007, to instruct the UAV 1802 to return to the distribution center 1801.

The structure and functionality of the distribution center 1801 described above has been divided into modules based on one example implementation, but the functionality of various modules may be merged or further split such that there are more or fewer components than have been illustrated in FIG. 20. For instance, it is possible to implement many parts of the distribution center management system 2004, including the mission manager 2005, communications station 2007, logistics system 2008, and interface handler 2011 on a single piece of computer hardware, such as a computer server or embedded SOC. Similarly, the different inventory management systems could be merged under a single inventory manager, while the verification and launch system 2003 could be split into a separate verification system and launch system.

The UAS also includes global services 1803, which are a collection of software services running on one or more computer servers, accessible through the Internet or another communications protocol. In one example embodiment, the global services 1803 are software modules running on virtual machines in a third-party data center, such as Amazon Web Services or Google Cloud.

One purpose of the global services 1803 is to provide a global infrastructure to coordinate, support, and manage multiple distribution centers 1801, service requestors 1804, and UAVs 1802. However, in some embodiments, it is conceivable that the functionality of the global services 1803 is provided by a local computer server, and that the server serves a local set of UAVs 1802, distribution centers 1801, and service requestors 1804—possibly only a single one of each.

One or more global system operators 1806 connect to the global services 1803 and provide human intervention for systems that cannot be fully automated (or are otherwise selected to not be fully automated). The global system operators 1806 typically connect to the global services 1803 through control devices. A control device may be a computer workstation, a personal computer, a tablet device, a smartphone, or any other computing device that can communicate through a network with the global services 1803. For instance, in one example embodiment, a global system operator 1806 uses a laptop computer, with an Internet connection, to connect to the global services 1803 executing on a computer server, which is also connected to the Internet.

Figure 21:
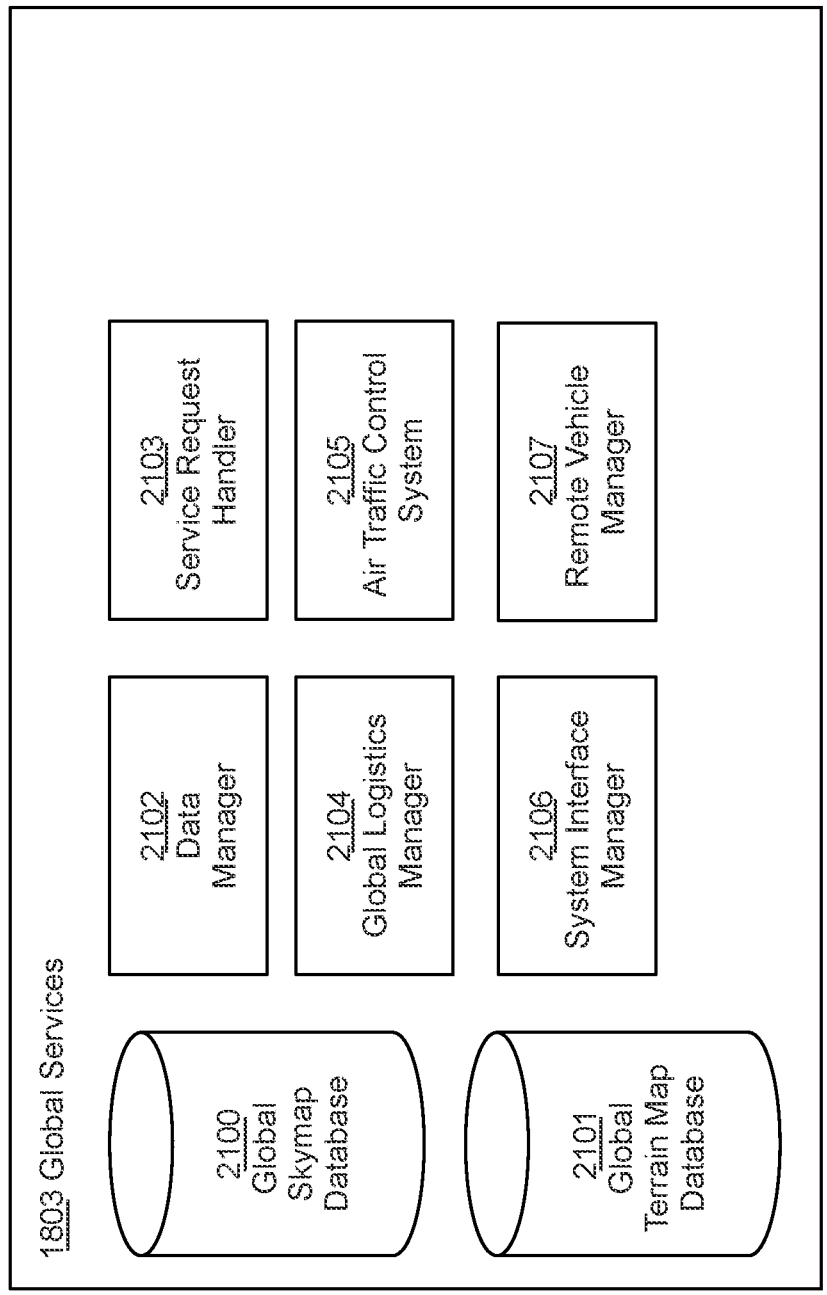
FIG. 21 is a diagram illustrating the components of the global services, according to one example embodiment.

In the example embodiment illustrated in FIG. 21, the global services 1803 are configured to serve a plurality of distribution centers 1801, UAVs 1802, and service requestors 1804. In this embodiment, the global services 1803 comprise a global skymap database 2100, a global terrain map database 2101, a data manager 2102, a service request handler 2103, a global logistics manager 2104, an air traffic control system 2105, and a system interface manager 2106.

As discussed earlier, the global skymap database 2100 and the global terrain map database 2101 are global repositories for skymap and terrain map data in the UAS 1800. As was the case with the local versions of these databases, the information in these databases can be represented in various ways depending on the needs of the UAS 1800. Although these databases are represented as single units in the illustrated embodiment, in practice the databases may be implemented using several mirrored data stores to provide improved read speed, redundancy, and error recovery.

The data manager 2102 manages data-writes into, and data-reads out of the global databases. For example, as updates to the local skymap databases 2009 and local terrain map databases 2010 are communicated to the global services 1803, the data manager 2102 ensures that the information is stored in the appropriate database and that the latest information is always available and is not overwritten by out-of-date information. The data manager 2102 also manages information received from outside of the UAS 1800 and integrates this information into the global databases. For instance, information received from third-party weather information providers, aviation authorities, and external air traffic controllers may be integrated into the global skymap database 2100. Similarly, third-party topographical data, map imagery, and surveillance data may be integrated into the global terrain map database.

The data manager 2102 also manages the updates sent to the local databases at each distribution center 1801. In one embodiment, as the global skymap database 2100 and global terrain map database 2101 are updated, the data manager 2102 will monitor the regions where those updates are relevant, and will send at least a portion of those updates to distribution centers 1801 that are in the relevant regions. In another embodiment, the mission manager 2005 at a distribution center 1801 in a particular region will periodically request information about that region from the global services 1803, and the data manager 2102 will determine the set of information that is relevant to that region from the global databases, and will send that information to the distribution center 1801, where the information may be integrated into the local databases. Similarly, a UAV 1802 in flight may request information about its current location from the global services 1803, and the data manager 2102 may similarly determine the relevant information that should be sent back to the UAV 1802 based on the UAV 1802's location.

The service request handler 2103 manages service requests sent by service requestors 1804 that are received by the global services 1803. When a service request is received by the global services 1803, the service request handler 2103 will communicate with the global logistics manager 2104 to determine a distribution center 1801 that is suitable for handling the service request locally. As mentioned previously, the selection of the distribution center 1801 may take into account not only the location of a destination site 1805 specified in the service request, but also the logistic requirements of the request, such as payload, UAV capability, etc. For instance, a service request may include information that specifies a payload type required to complete the request, and the distribution center 1801 may be selected based on the availability of that payload type at various distribution centers 1801.

The payload type may be specified directly by means of a payload identifier associated with a type of payload, or it may be specified by implication. For example, a camera payload may be specified by implication if the service request is a request for image data at the destination site 1805.

In some embodiments, the service request handler 2103 takes input from a global system operator 1806 to determine the distribution center 1801 that will be used to fulfill a service request.

Once the distribution center 1801 and UAV 1802 have been identified and reserved to fulfill a service request, the service request handler 2103 may notify the service requestor 1804 that the service request is in process. The service request handler 2103 may also receive information from the distribution center 1801 and/or the UAV 1802 that allows a predicted time of mission completion to be estimated and sent to the service requestor 1804.

The service request handler 2103 is capable of communicating with the service requestor 1804 via the system interface manager 2106. A human service requestor 1804 will typically send a service request to the global services

1803 by means of some remote client device such as a mobile phone, a tablet, or a personal computer. The system interface manager 2106 is capable of sending information to the client device operated by the service requestor 1804 that is configured to be displayed on the client device. For example, in one embodiment, the system interface manager 2106 functions as a web server, and the client device connects to the web server and displays a web page that is downloaded from the system interface manager 2106. In this example, the system requestor 1804 can receive and send information to the global services 1803 via the displayed web page. In another embodiment, the system interface manager 2106 exposes an application interface over the Internet (such as a representational state transfer, or "REST" interface), and an application running on the client device is configured to display information received from the global services 1803 to the service requestor 1804, and to send information inputted by the service requestor 1804 back to the global services 1803.

The service request handler 2103 may also play an active part in determining the route a UAV 1802 takes on a mission to complete a service request. For example, the service request handler 2103 may use the system interface manager 2106 to query a service requestor 1804 for the precise location of the destination site 1805, and the information provided by the service requestor 1804 may include route refinement information that may be used to refine the flight route used by the UAV 1802 in fulfilling the service request.

The service request handler 2103 utilizes the global logistics manager 2104 to obtain information required for distribution center 1801 and UAV 1802 selection. The global logistics manager 2104 tracks the inventory information in each local logistics system 2008 at each distribution center 1801. The global logistics manager 2104 may proactively route additional stock to local distribution centers 1801 when supplies of any inventory item are depleted, are below some threshold quantity, or are predicted to be depleted within some threshold time. The global logistics manager 2104 may also notify a global system operator 1806 in the event of an inventory shortage at a distribution center 1801. The global system operator 1806 may take actions outside the UAS 1800 to route new inventory items to the distribution center 1801, such as, for example, ordering and shipping items from a third-party warehouse.

In one embodiment, the global logistics manager 2104 relocates UAVs 1802 from a first distribution center 1801 that has an excess of UAVs to a second distribution center 1801 that has a shortage of UAVs. In this embodiment, the global logistics manager 2104 may monitor the daily, monthly, or yearly patterns of service requests to determine the estimated UAV requirements at each distribution center 1801 over a period of time. Based on these estimated UAV requirements, the global logistics manager 2104 may preemptively relocate UAVs from one distribution center 1801 to another. The relocation of UAVs 1802 may be done using third-party shippers, or the relocation may be done by sending requests to the distribution centers 1801 to launch UAVs 1802 with destination sites 1805 set to other distribution centers 1801. As an optimization, these relocation flights may be scheduled during times when the service request volume is low, for example, late at night or during holidays.

The air traffic control system 2105 is responsible for tracking the UAVs 1802 and aircraft that are known to be in flight in the area served by the UAS 1800. The air traffic control system 2105 receives information from the distribution centers 1801, the UAVs 1802 in flight, and from third party air traffic information providers. The information received by the air traffic control system 2105 includes the known positions of aircraft in the area of the UAS 1800, as well as flight routes that are registered with the system. Distribution centers 1801 and/or UAVs 1802 may register flight routes for missions, with the air traffic control system 2105. The air traffic control system 2105 may also allow UAVs and aircraft operated by third parties to register their flight routes.

The air traffic control system 2105 provides real-time information updates regarding the positions of aircraft and UAVs to UAVs 1802 that are flying missions. Using this information, the mission planners 1900 onboard the UAVs 1802 may modify their flight routes to avoid colliding with other aircraft. The air traffic control system 2105 may offer similar information updates to UAVs and other aircraft that are operating outside the UAS 1800 in order to maintain a safer airspace for all aircraft operations.

The air traffic control system 2105 also provides information to the service request handler 2103 and the global logistics manager 2104. Information from the air traffic control system 2105 may be used to influence the selection of distribution centers 1801 for service requests and the relocation of UAVs 1802. For example, a service request may be routed away from distribution centers 1801 where there is an excess of air traffic in the vicinity, and UAV relocation may be timed to avoid periods when air traffic is at its highest.

The structure and functionality of the global services 1803, described above, has been divided into modules based on one example implementation, but the functionality of various modules may be merged or further split such that there are more or less components than have been illustrated in FIG. 21. For example, it is possible to merge the skymap and terrain map databases into a single data store. Some of the services illustrated can be moved outside the UAS 1800, for example, the air traffic control system 2105 and the global logistics manager 2104 may be operated outside the UAS 1800 as independent services, accessible through an Application Programming Interface (API). These and other changes to the structure do not change the overall architecture of the system, and systems with such changes will be recognized by those with skill in the art as equivalent to the system disclosed.

Figure 22A:
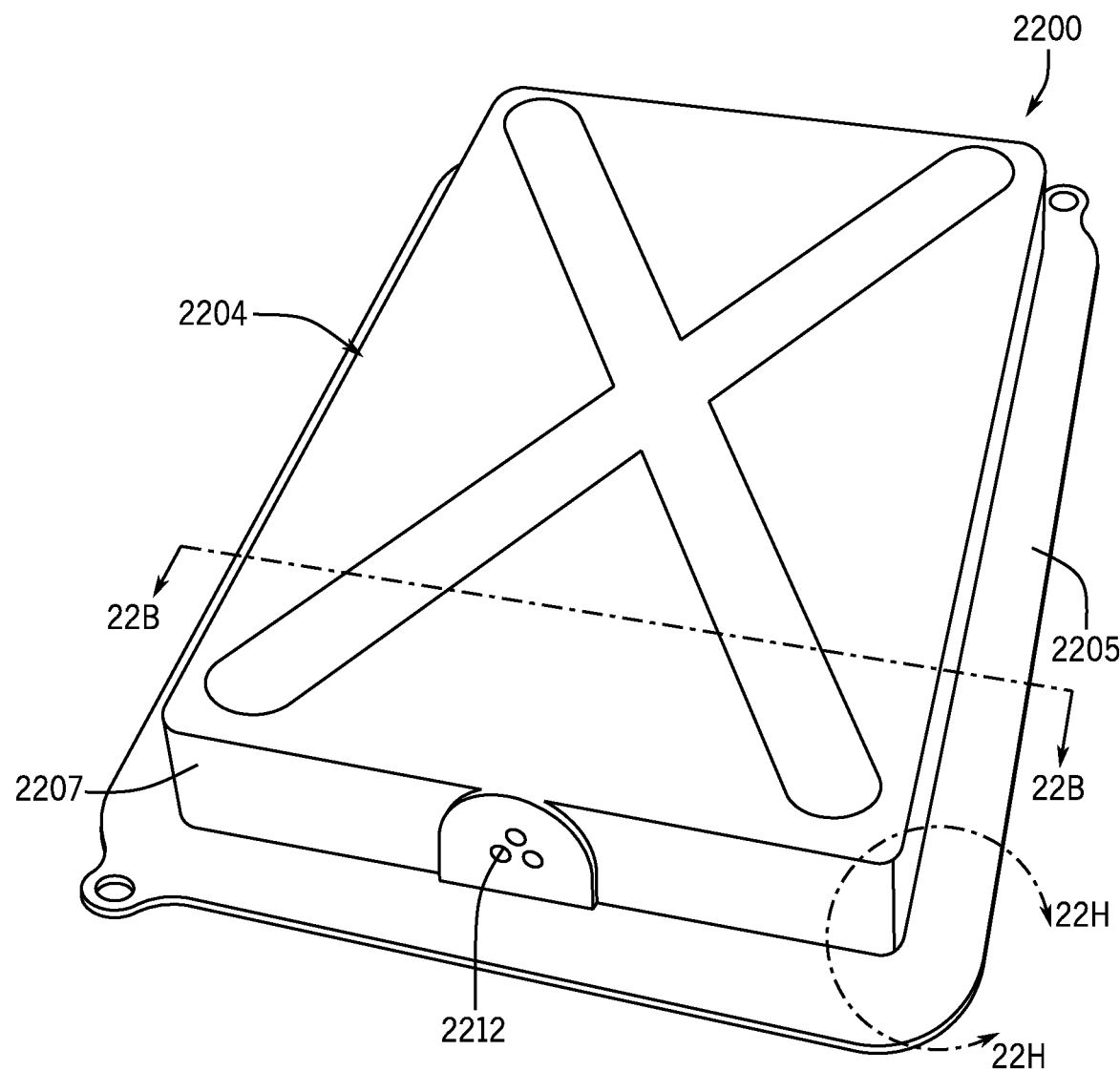
FIG. 22A depicts an example shielded circuit board assembly.
Figure 22B:
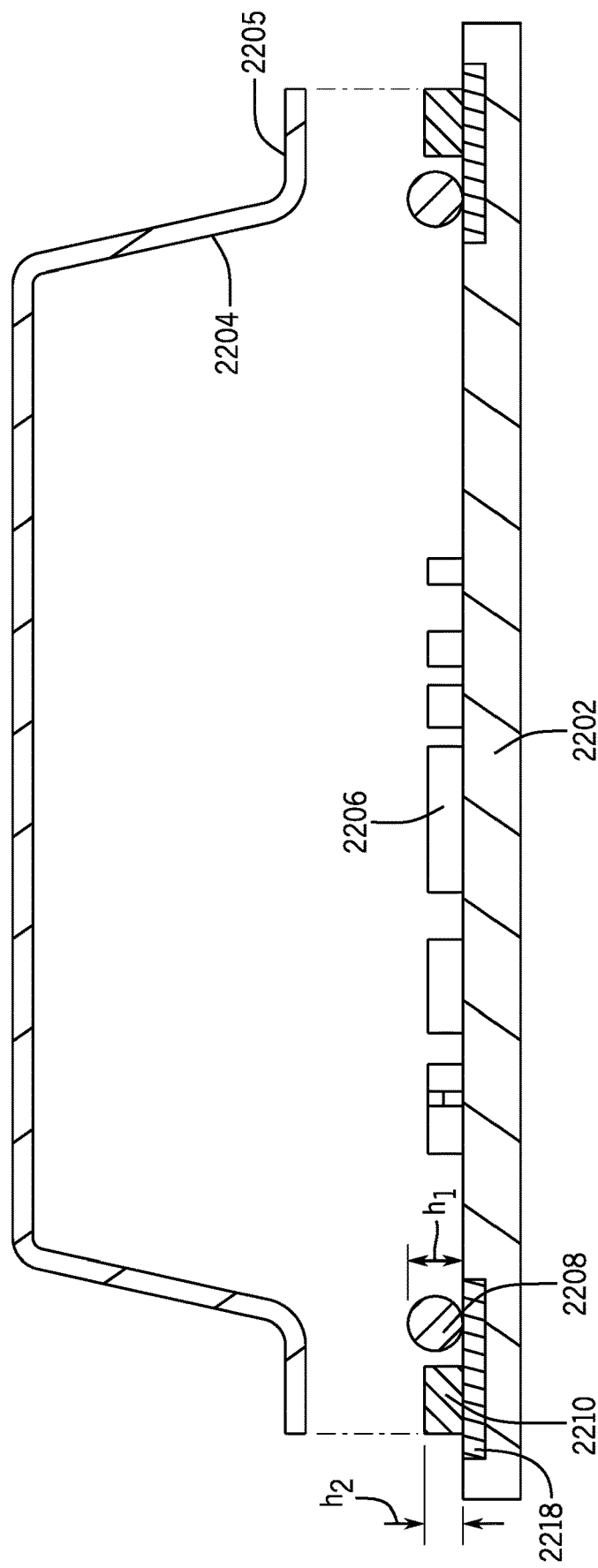
FIG. 22B is a schematic cross-sectional exploded view of the shielded circuit board of FIG. 22A showing an electromagnetic interference gasket in an uncompressed state.
Figure 22C:
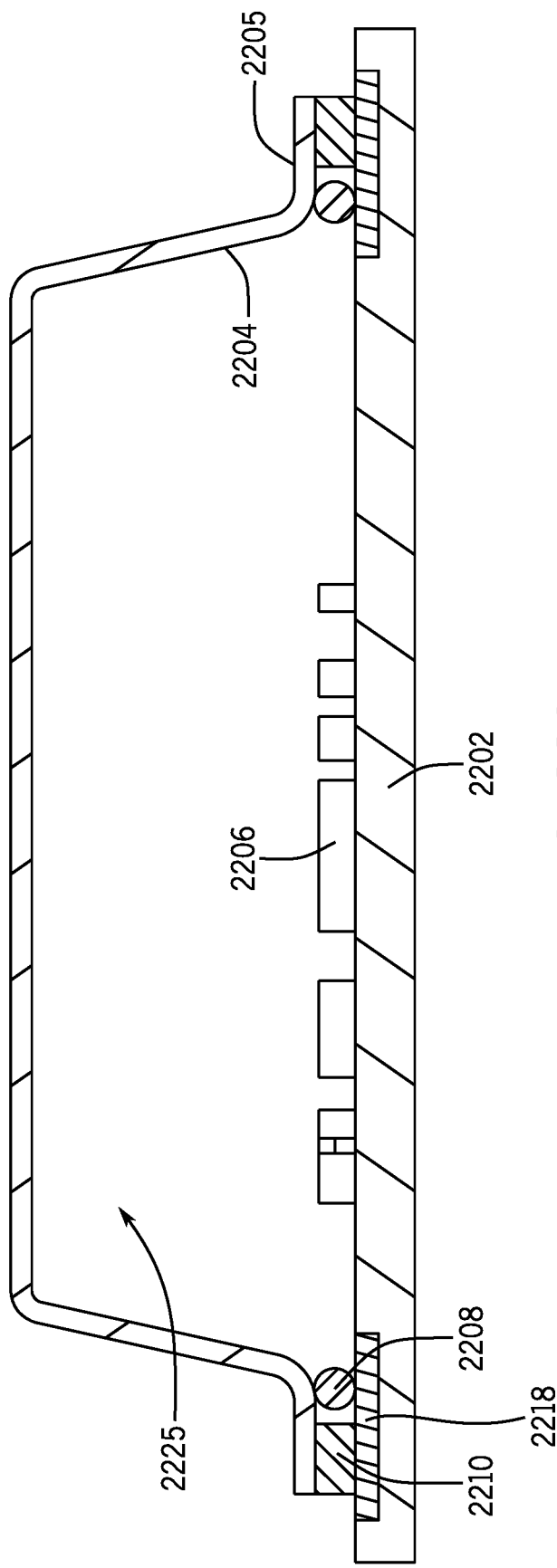
FIG. 22C is a schematic cross-sectional view of the shielded circuit board assembly of FIG. 22A in an assembled configuration.
Figure 22G:
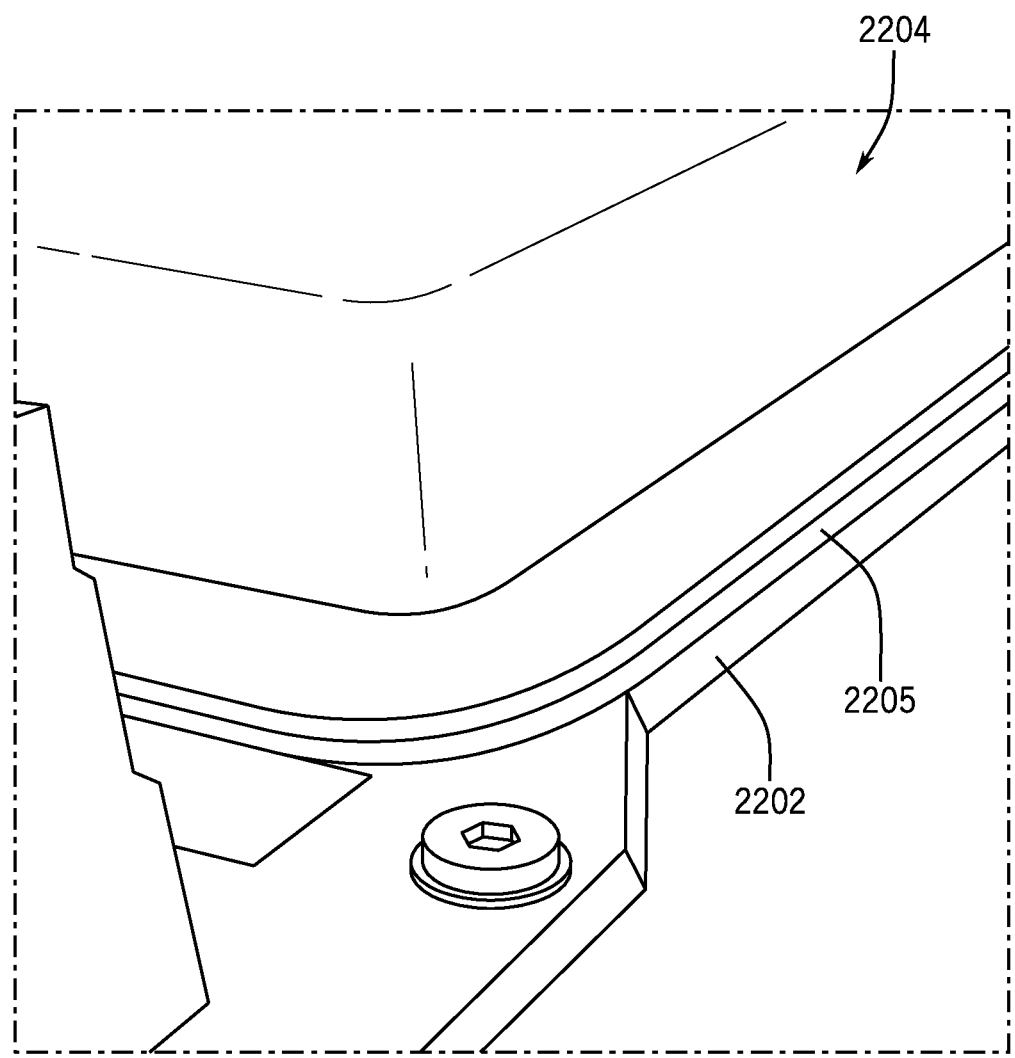
FIG. 22G is a detail view of a portion of the shielded circuit board assembly of FIG. 22A.
Figure 22H:
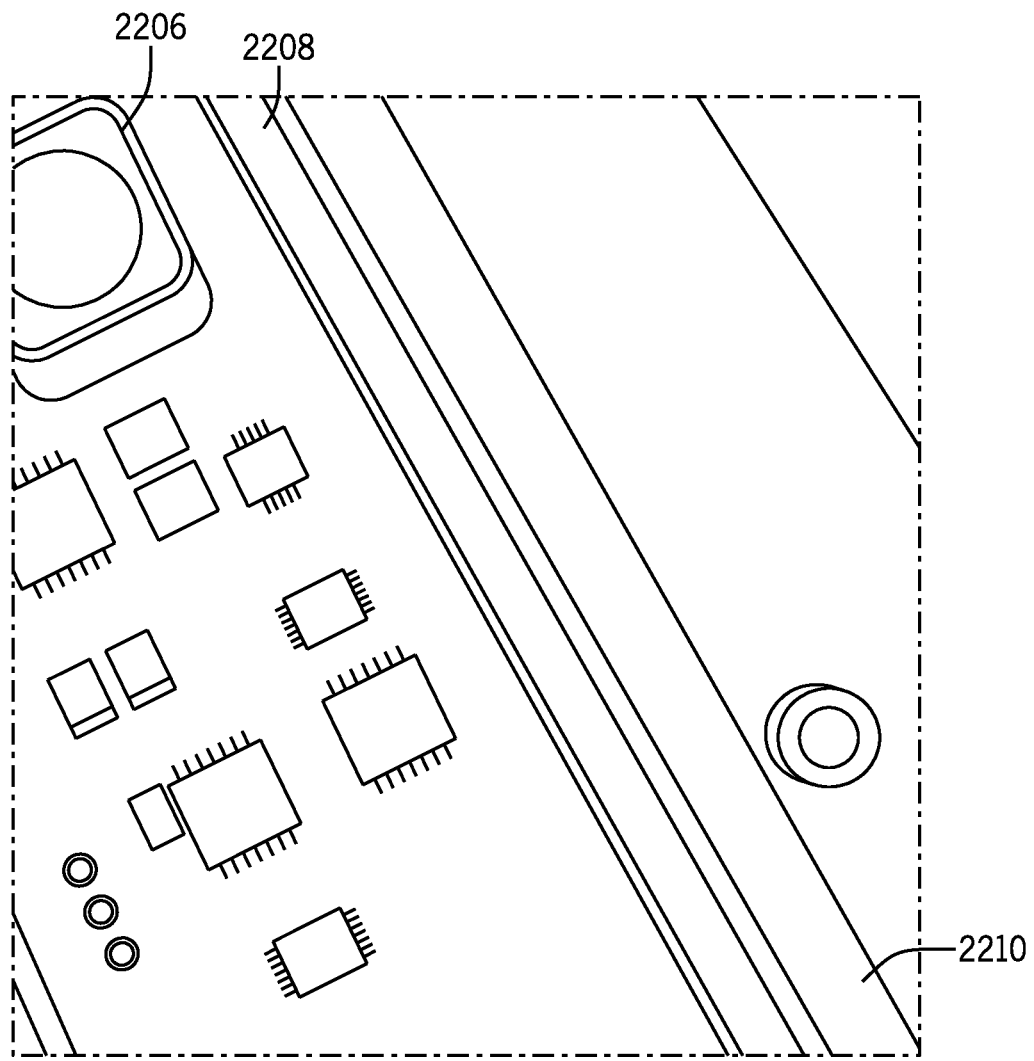
FIG. 22H is a detail view of a circuit board of the shielded circuit board assembly of FIG. 22A.

FIG. 22A illustrates an example shielded circuit board assembly 2200, which may be used in UAVs as described herein. For example, the shielded circuit board assembly 2200 may be mounted to an anchor structure (e.g., the anchor structure 400, FIG. 5). In some cases, a circuit board assembly 2200 as described with respect to FIGS. 22A-22H may be used instead of or in addition to the circuit board 1102 (FIG. 11A). The circuit board assembly 2200 may also be integrated with a UAV in a different manner, such as by being directly connected to a fuselage component, rather than being attached to an anchor structure. FIG. 22B is a schematic cross-sectional exploded view of the shielded circuit board assembly 2200 (along line 22B-22B in FIG. 22A). FIG. 22C is a schematic cross-sectional view of the shielded circuit board assembly 2200 in an assembled configuration. FIG. 22D is a schematic cross-sectional view of an enclosure 2204 of the shielded circuit board assembly 2200. FIG. 22E is a schematic cross-sectional view of an environmental gasket 2210 of the shielded circuit board assembly 2200. FIG. 22F is a schematic cross-sectional view of an electromagnetic interference (EMI) gasket 2208 of the shielded circuit board assembly 2200. FIG. 22G is a detail view of area 22H (FIG. 22A) of the shielded circuit board assembly 2200, showing a seam between a printed circuit board assembly (PCBA) 2202 and the enclosure 2204. FIG. 22H is a detail view of the PCBA 2202, showing an example configuration of an electromagnetic interference (EMI) component 2206, the EMI gasket 2208, and the environmental gasket 2210.

The shielded circuit board assembly 2200 offers a lightweight solution to protect the PCBA 2202 from both solid and liquid ingress and from EMI. Ingress protection is provided by creating a physical barrier to the environment, and EMI protection is provided by creating a conductive encapsulation around sensitive components (e.g., mounted to the PCBA 2202), which shares an electrical potential to those components' electrical ground.

The enclosure 2204 may include multiple layers. The enclosure 2204 may include an electromagnetic signal permissive layer 2220 and an electromagnetic blocking layer 2230, as shown in FIG. 22D. The electromagnetic signal permissive layer 2220 may be a structural component of the enclosure 2204 that includes or otherwise defines a housing or housing structure 2207, as shown in FIG. 22A. While many implementations are possible, the housing structure 2207 may generally include five sides (a base, such as a top or bottom, and four walls or sides extending from the base) the five sides defining an open space or void or volume extending into the housing structure 2207. The housing structure 2207 of the electromagnetic signal permissive layer 2220 and at least a portion of the circuit board 2202 may cooperate to define a volume 2225. The electromagnetic signal blocking layer 2230 may be structurally supported or otherwise attached to the electromagnetic permissive layer 2220 and generally operate to define a conductive barrier about the volume 2225. In this regard, the enclosure 2204 may enclose the EMI component 2206 on the circuit board 2202 with the electromagnetic permissive layer 2220, while providing a conductive barrier about the EMI component 2206 with the electromagnetic blocking layer 2230.

The electromagnetic permissive layer 2220 may be formed from thin plastic stock, which is then thermoformed into the desired shape. For example and as shown in FIG. 22D, the electromagnetic permissive layer 2230 may be a thermoformed plastic substrate 2222 (i.e. a substrate formed of a thermoplastic). The base of the enclosure 2204 features a flange 2205, which is used to attach it to the PCBA 2202. After the thermoformed plastic substrate 2222 is formed, a conductive metallic coating is then applied to define the electromagnetic blocking layer 2230. An electroless nickel process is used, and a coating containing a specific proportion of Phosphorous is applied to provide corrosion resistance to the plating. In the example of FIG. 22D, the electromagnetic blocking layer 2230 is shown as including a metallic layer 2232, such as a metallic plating. The plating is applied in a sufficient thickness such that its EMI-blocking performance is sufficient for the intended application. The plating can have discontinuities 2236 or otherwise be discontinuous, so long as any discontinuity is shorter than the wavelength of the frequencies being protected against. The enclosure 2204 may be hermetic, such that no air is exchanged between the inside of the enclosure 2204 and the environment. It may also feature a vent 2212 to exchange air and vapor with the environment, but disallow liquid water and solid debris from entering. This may be desirable to allow the equalization of air pressure, if the assembly 2300 is operated at an altitude different from that at which it was assembled.

The PCBA 2202, whose components may either produce EMI or be negatively affected by EMI, is designed with an exposed metal trace 2218 encompassing and/or surrounding the area of the PCBA 2202 where environmental and EMI protection is needed (e.g., extending about a perimeter of the PCBA 2202 or about a perimeter of a portion of the PCBA). The shape of this metal trace 2218 is configured to match or substantially match the footprint of the enclosure's flange.

The environmental gasket 2210 between the PCBA 2202 and enclosure 2204 may be formed from or include a double-sided adhesive 2252 with a foam core 2250, as shown in FIG. 22E. This environmental gasket 2210 may be a continuous piece of material, such that there are no gaps through which water or debris may enter the enclosure.

The EMI gasket 2208 between the PCBA 2202 and enclosure 2204 is made from segments of fabric-over-foam gasket. This may include a compressible foam core 2240, a conductive metallic fabric exterior 2242, and a conductive pressure-sensitive adhesive along its base 2244, as shown in FIG. 22F. The height $h_1$ of the EMI gasket 2208 is greater than a height $h_2$ of the environmental gasket 2210, as illustrated in the exploded view of FIG. 22B. When the enclosure 2204 is pressed or seated on the EMI gasket 2208, the EMI gasket 2208 is compressed (FIG. 22C), and thereby forms a conductive bridge between the PCBA 2202 and enclosure 2204, when the environmental gasket 2210 adheres to each. The EMI gasket 2208 may be discontinuous, so long as any discontinuity is shorter than the wavelength of the frequencies being protected against.

The advantages to the circuit board assembly 2200 as described herein are numerous. Firstly, the mass of the enclosure 2204 is minimized or reduced as compared to other shielding options (e.g., a sold metal enclosure). The thickness ti of the metallic shield/plating on the plastic of the enclosure 2204 can be very thin, on the order of about 5 microns to about 50 microns, to provide adequate EMI shielding, but if metal alone were used in this thickness, it would not be mechanically robust and could easily be damaged. By using a thin plastic substrate 2220, adequate physical protection can be provided for the PCBA 2202, and the metallic plating 2230 used for EMI shielding can be as thin and light as is required.

The use of the environmental gasket 2210 (with its adhesive properties) and fabric-over-foam gaskets also offers several advantages. Mass can be reduced or minimized thanks to the low density of both materials. Further, the evenly distributed adhesion of the environmental gasket 2210 may eliminate the need for screws or other fasteners, which, in conventional applications may be used at regular intervals to maintain compression on an elastomeric gasket. Finally, the enclosure 2204 can be rapidly assembled onto the PCBA 2202. Assembly may aided by use of a press, which applies pressure along the flange 2205 of the enclosure 2204, above the environmental gasket 2210. This bond is intended to last the lifetime of the assembly; however, if high-value components within the enclosure, like radios or other modules, are desired, the enclosure can be removed without specialized tools.

While the shielded circuit board assembly 2200 is described as being integrated into the UAV 100, this is merely one example type of vehicle that may include a shielded circuit board assembly as described herein, and it may be used in other types of vehicles as well, including any other suitable UAV, aircraft, road vehicle (e.g., car, truck), or the like. For example, turning to FIGS. 23A-23C, an example shielded circuit board assembly 2300 is shown, which may be associated with an aircraft 2390, such as a UAV. The shielded circuit board assembly 2300 may be substantially analogous to the shielded circuit board assembly 2200 and include a circuit board 2302, an EMI component 2304, one or more enclosures 2320, an enclosure volume 2322, an EMI gasket 2324, and a vent 2328; redundant explanation of which is omitted for clarity.

Figure 23A:
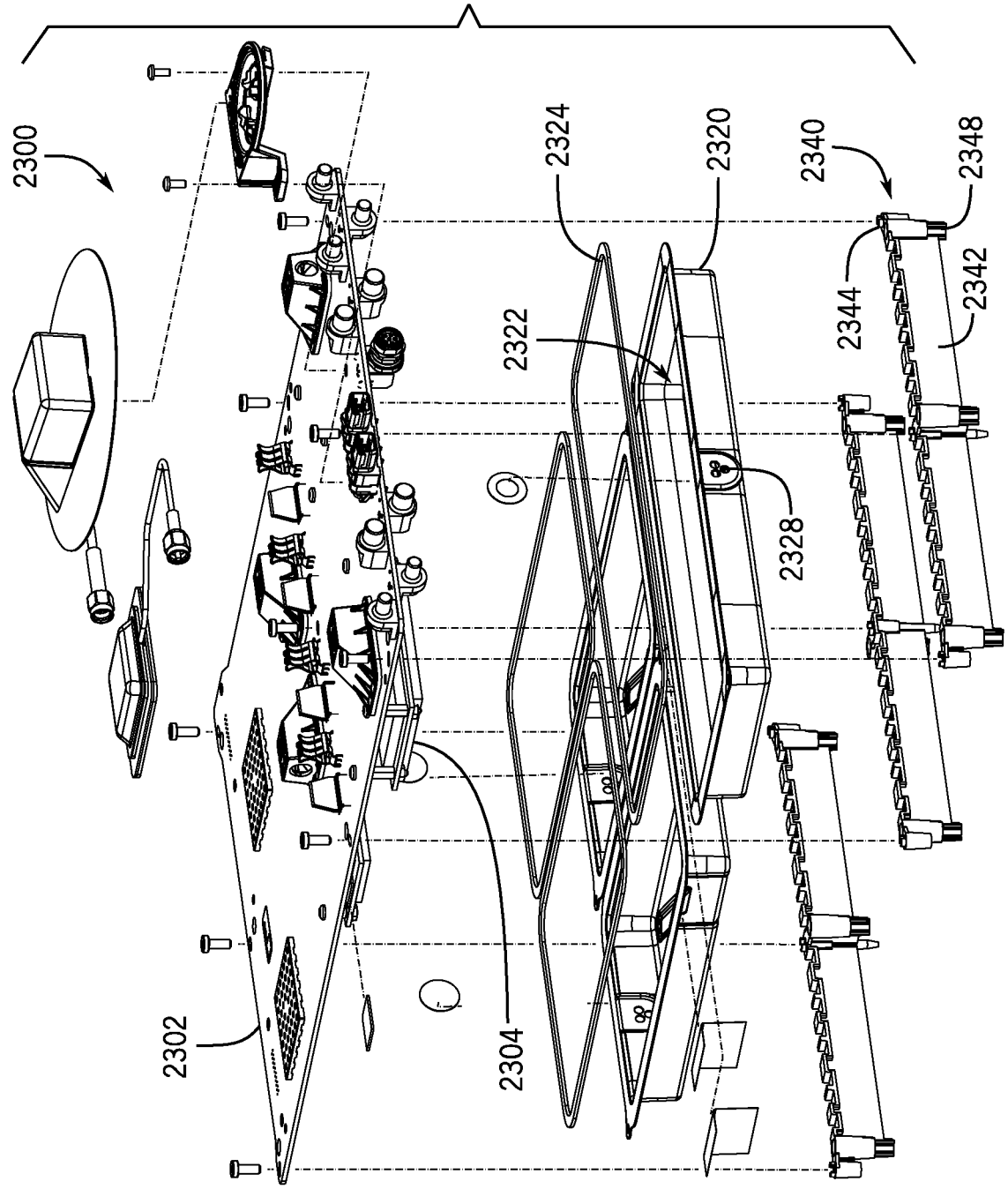
FIG. 23A depicts an exploded view of another example of a circuit board assembly.

Notwithstanding the foregoing similarities, the circuit board assembly 2300 is shown as having standoff features 2340. The standoff features 2340 may be configured to removably attach the circuit board 2302 to a mount structure, fuselage, or other structure of the aircraft 2390. Further, the standoff features 2340 may be configured to define an offset between the circuit board 2302 and the mount structure to accommodate the enclosure 2320. To facilitate the foregoing, as shown in FIG. 23A, the standoff features 2340 include a ridge 2342, a board connection feature 2344, and a mount connection feature 2348. The ridge 2342 may extend the width or length of the circuit board 2302. The ridge 2342 may have a height that is greater than a height of the enclosure 2320 from the circuit board 2302. The greater height of the standoff feature 2340 may be used to define the offset of between the circuit board 2302 and the mount structure to accommodate the enclosure 2320 therebetween. The board connection feature 2344 may be a pin, latch, threaded feature or other structure that allows for the attachment of the circuit board 2302 to the standoff features 2340. The mount connection feature 2348 may be a protrusion, clip, or the like that allows the standoff features 2340 to be removably received by one or more structures of the aircraft 2390. This may facilitate modular construction of the aircraft 2390, with the circuit board assembly 2300 being pressed into place during manufacturing and swappable with a replacement assembly as needed during use.

Figure 23B:
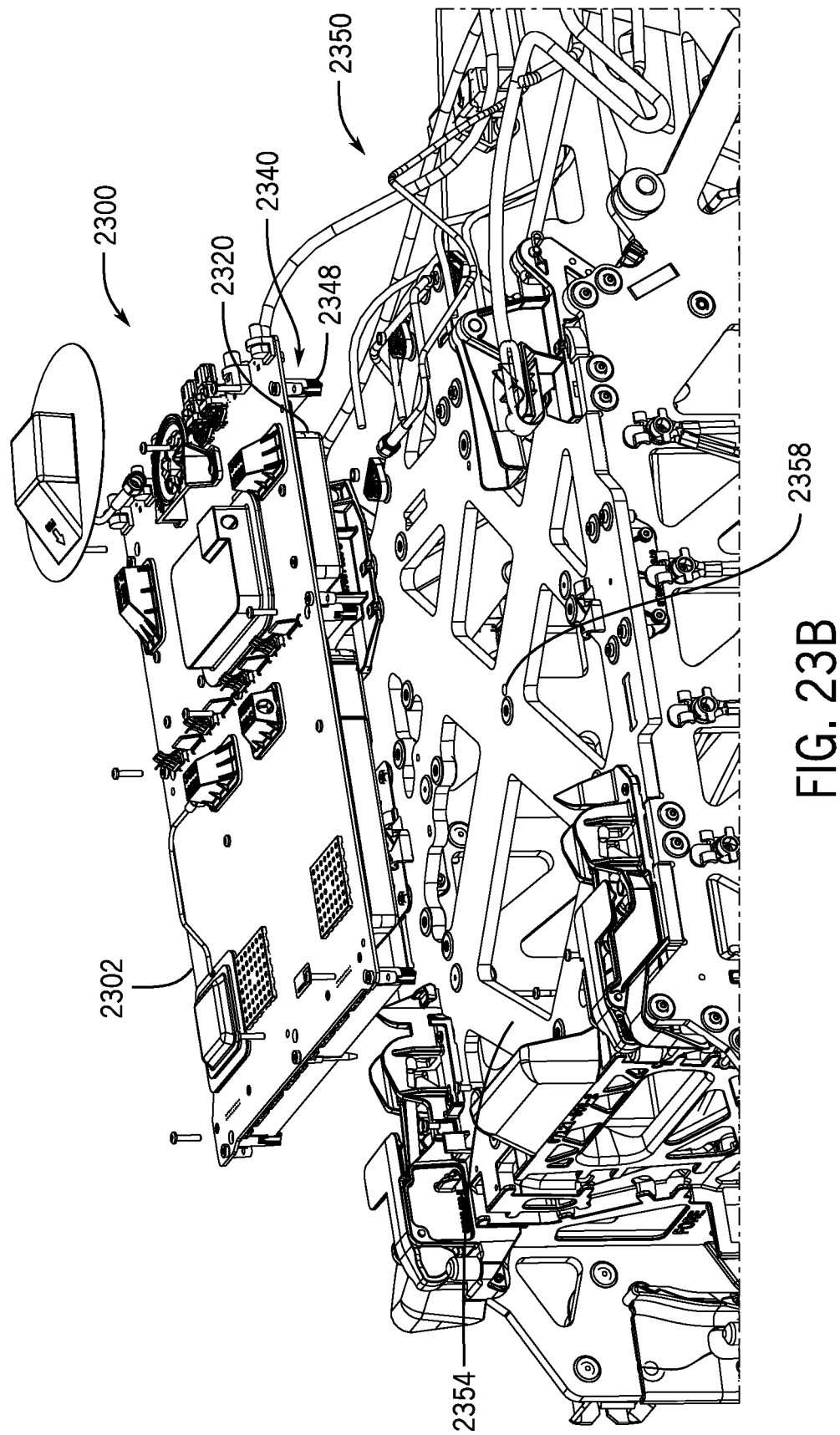
FIG. 23B depicts an exploded view of the circuit board assembly of FIG. 23A and a mounting structure.

With reference to FIG. 23B, the circuit board assembly 2300 is shown associated with a mount structure 2350 of the aircraft 2390. The mount structure 2350 may include a landing 2354 and receiving features 2358. The landing 2354 may be configured to accommodate a footprint of the circuit board 2302. The receiving features 2358 may be configured to engage the standoff features 2340 in order to secure the circuit board assembly 2300 into a desired position. For example, the receiving features 2358 may be configured to receive protrusions, clips, or the like of the mount connection feature 2348 in order to releasably secure the circuit board assembly 2300 to the mount structure 2350.

Figure 23C:
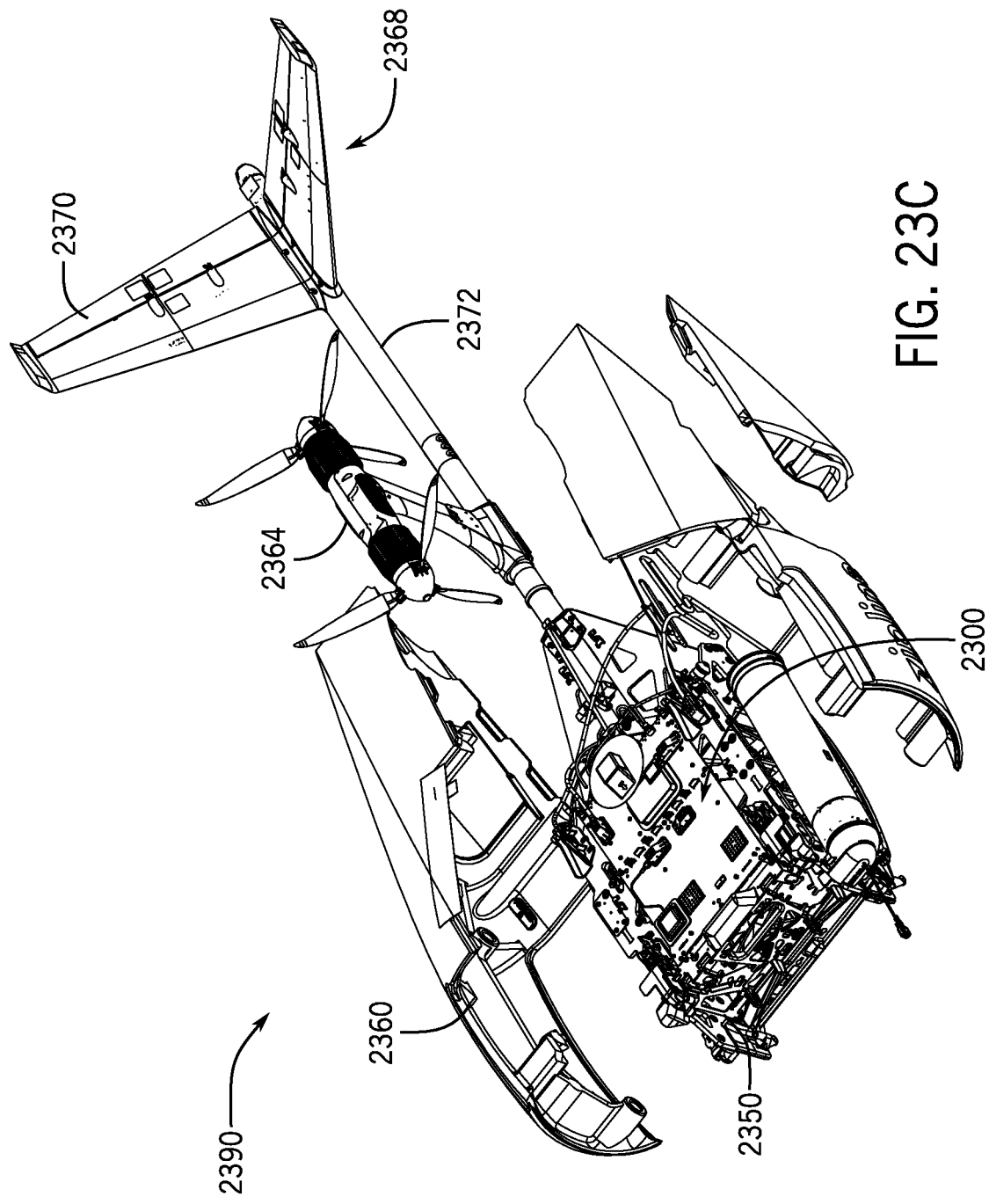
FIG. 23C depicts an exploded view of the circuit board assembly and mounting structure of FIG. 23B and a fuselage.

With reference to FIG. 23C, the circuit board assembly 2300 is shown with the aircraft 2390. The aircraft 2390 may be substantially analogous to any of the aircrafts described herein, such as the UAV 100 of FIGS. 1A-5. In this regard, the aircraft 2390 is show as including a fuselage 2360, a motor module 2364, a tail section 2368, flight control surfaces 2370, and tail support 2372; redundant explanation of which is omitted for clarity.

Figure 24:
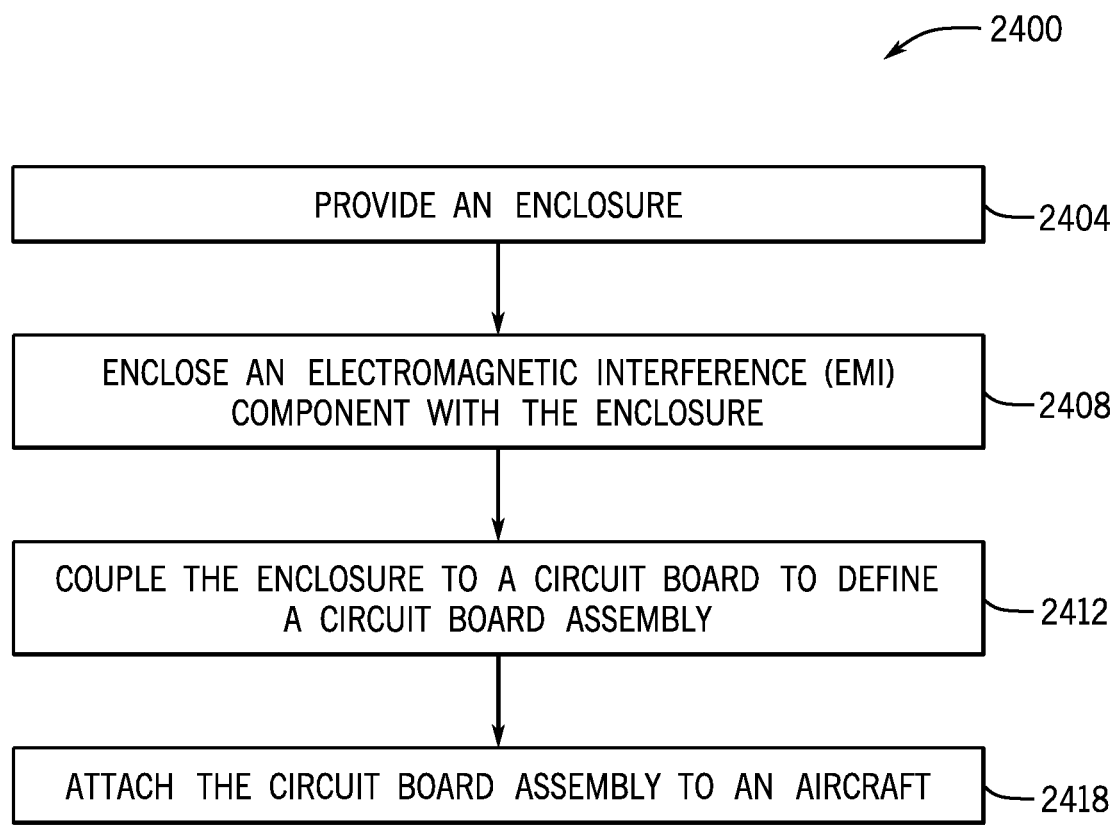
FIG. 24 depicts a flow chart for a method of assembling an aircraft, such as a UAV.

To facilitate the reader's understanding of the various functionalities of the embodiments discussed herein, reference is now made to the flow diagram in FIG. 24, which illustrates process 2400. While specific steps (and orders of steps) of the methods presented herein have been illustrated and will be discussed, other methods (including more, fewer, or different steps than those illustrated) consistent with the teachings presented herein are also envisioned and encompassed with the present disclosure.

At operation 2404, an enclosure is provided. For example and with reference to FIG. 22D, the enclosure 2204 may be provided. The enclosure 2204 may be provided with the electromagnetic interference permissive layer 2220 and the electromagnetic interference blocking layer 2230. The electromagnetic interference permissive layer 2220 may be defined by the thermoformed plastic substrate 2222. The electromagnetic interference blocking layer 2230 may be defined by the metallic layer or plating 2232.

At operation 2408, an electromagnetic interference (EMI) component is enclosed with the enclosure. For example and with reference to FIGS. 22B and 22C, the enclosure 2204 may enclose the EMI component 2206 on the circuit board 2202. For example, the enclosure 2204 may enclose the EMI component 2206 within the volume 2225.

At operation 2412, the enclosure is coupled to the circuit board about the EMI component to define a circuit board assembly. For example and with reference to FIGS. 22B and 22C, the enclosure 2204 may be pressed into the EMI gasket 2208. The enclosure 2204 may adhere to the EMI gasket 2208 using the adhesive 2244. The enclosure 2204 may be further pressed to compress the EMI gasket 2208 until the enclosure 2204 contacts the environmental gasket 2210. The enclosure 2204 may contact the environmental gasket 2210 at the adhesive 2252. The enclosure 2204 may therefore be bonded to the circuit board 2202 with the EMI gasket 2208 in a compressed state.

At operation 2418, the circuit board assembly is attached with an aircraft. For example and with reference to FIGS. 23A-23C, the circuit board assembly 2300 may be associated with the aircraft 2390. Standoff features 2340 may be provided to removably attach the circuit board assembly 2300 to mount structure 2350. For example, standoff features 2340 may be pressed into one or more receiving features 2358 on the landing 2354 to secure the circuit board assembly 2300 into a desired position within the fuselage 2360. The standoff features 2340 may be configured to define an offset between the assembly 2300 and the landing 2354 in order to accommodate the enclosure 2320 therebetween.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings. Also, when used herein to refer to positions of components, the terms above and below, or their synonyms, do not necessarily refer to an absolute position relative to an external reference, but instead refer to the relative position of components with reference to the figures.

What is claimed is:

1. A circuit board assembly for association with an aircraft, the circuit board assembly comprising:
   a circuit board;
   an electromagnetic interference component connected to the circuit board;
   an enclosure comprising an electromagnetic signal permissive layer and an electromagnetic signal blocking layer; and
   a flange extending around a periphery of the enclosure, the flange being configured to seat the enclosure on the circuit board via an electromagnetic interference gasket,
   wherein the electromagnetic signal permissive layer comprises a rigid housing that defines a volume, the housing enclosing the electromagnetic interference component on the circuit board, wherein the electromagnetic signal blocking layer defines a conductive barrier about the electromagnetic interference component, and wherein the electromagnetic interference gasket comprises a compressible foam core and a conductive pressure-sensitive adhesive along a conductive metallic exterior, the conductive pressure-sensitive adhesive configured to secure the flange to the circuit board via the electromagnetic interference gasket.

2. The circuit board assembly of claim 1, wherein the electromagnetic signal permissive layer comprises a thermoformed plastic substrate.

3. The circuit board assembly of claim 1, wherein the electromagnetic signal blocking layer comprises a metallic layer that provides the conductive barrier.

4. The circuit board assembly of claim 3, wherein the metallic layer has a thickness of less than about 50 microns.

5. The circuit board assembly of claim 3, wherein the metallic layer comprises a metallic coating or metallic plating applied on a surface of the electromagnetic signal permissive layer.

6. The circuit board assembly of claim 5, wherein the metallic layer comprises discontinuities, the discontinuities being shorter than a wavelength of a targeted electromagnetic signal blocked by the enclosure.

7. The circuit board assembly of claim 1, wherein the electromagnetic signal blocking layer is structurally supported by the electromagnetic signal permissive layer.

8. The circuit board assembly of claim 1, wherein
the electromagnetic interference gasket is configured to form a conductive bridge between the enclosure and the circuit board.

9. The circuit board assembly of claim 1, wherein
the circuit board assembly comprises an environmental gasket having an exterior adhesive and proximal to the electromagnetic interference gasket at the periphery of the enclosure,
the environmental gasket has an environmental gasket height,
the electromagnetic interference gasket has an electromagnetic interference gasket height that is greater than the environmental gasket height, and
the flange is adhered to the environmental gasket, thereby compressing the electromagnetic interference gasket and forming a conductive bridge.

10. The circuit board assembly of claim 9, wherein
the circuit board comprises a metal trace that is configured to match a footprint of the flange, and
the metal trace is electrically coupled to the electromagnetic signal blocking layer via the electromagnetic interference gasket to establish a common electrical potential between the electromagnetic interference component and the enclosure.

11. The circuit board assembly of claim 1, further comprises a vent defined in the enclosure, the vent configured to:
permit air exchange between the volume and an external environment, and
hinder liquid and debris from entering the volume from the external environment.

12. An aircraft, comprising:
the circuit board assembly of claim 1;
a fuselage; and
one or more standoff features configured to removably attach the circuit board assembly to the fuselage or a mount structure housed within the fuselage.

13. The aircraft of claim 12, wherein
the aircraft further comprises the mount structure; and
the one or more standoff features define a ridge configured to define an offset between the circuit board and the mount structure to accommodate the enclosure therebetween, and wherein the aircraft is an unmanned aerial vehicle.

14. A method comprising:
providing an enclosure defining an open space, the enclosure comprising an electromagnetic signal permissive layer, an electromagnetic signal blocking layer, and a flange that extends about a periphery of the enclosure, the electromagnetic signal permissive layer comprising a rigid housing that defines a volume;
enclosing an electromagnetic interference component on a circuit board with the enclosure, the housing enclosing the electromagnetic interference component on the circuit board, the electromagnetic signal blocking layer defining a conductive barrier about the electromagnetic interference component;
coupling the enclosure to the circuit board to define a circuit board assembly, the flange configured to seat the enclosure on the circuit board via an electromagnetic interference gasket, wherein the electromagnetic interference gasket comprises a compressible foam core and a conductive pressure-sensitive adhesive along a conductive metallic exterior, the conductive pressure-sensitive adhesive configured to secure the flange to the circuit board via the electromagnetic interference gasket; and
attaching the circuit board assembly with a fuselage of an aircraft, the circuit board assembly defining an environmental barrier and the conductive barrier between the electromagnetic interference component and the fuselage.

15. The method of claim 14, further comprising establishing a conductive bridge between the enclosure and the circuit board using the electromagnetic interference gasket.

16. The method of claim 15, wherein
the coupling further comprises compressing the electromagnetic interference gasket and adhering the electromagnetic interference gasket to the enclosure and the circuit board.

17. The method of claim 16, wherein
the coupling further comprises adhering an environmental gasket to the flange and the circuit board alongside the electromagnetic interference gasket at the periphery of the enclosure, and
maintaining the compression of the electromagnetic interference gasket based in part on the environmental gasket having an environmental gasket height that is less than a height of the electromagnetic interference gasket.

18. The method of claim 14, wherein the attaching further comprises removably attaching the circuit board assembly to a mount structure of the aircraft using one or more standoff features.

* * * * *